(12) United States Patent
Motozuka et al.

(10) Patent No.: US 9,838,036 B2
(45) Date of Patent: Dec. 5, 2017

(54) DECODER, MINIMUM VALUE SELECTION CIRCUIT, AND MINIMUM VALUE SELECTION METHOD

(71) Applicant: Panasonic Corporation, Osaka (JP)

(72) Inventors: Hiroyuki Motozuka, Kanagawa (JP); Hiroyuki Yoshikawa, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 123 days.

(21) Appl. No.: 15/011,709

(22) Filed: Feb. 1, 2016

(65) Prior Publication Data

US 2016/0241360 A1 Aug. 18, 2016

(30) Foreign Application Priority Data

Feb. 13, 2015 (JP) .................................. 2015-026690

(51) Int. Cl.
 *H04L 1/00* (2006.01)
 *H03M 13/11* (2006.01)
 *H03M 13/00* (2006.01)

(52) U.S. Cl.
 CPC ... *H03M 13/1122* (2013.01); *H03M 13/6502* (2013.01); *H03M 13/6561* (2013.01); *H04L 1/0009* (2013.01); *H04L 1/0052* (2013.01); *H04L 1/0057* (2013.01)

(58) Field of Classification Search
 None
 See application file for complete search history.

(56) References Cited

U.S. PATENT DOCUMENTS

| | | | | |
|---|---|---|---|---|
| 7,603,607 B2 * | 10/2009 | Maehata | ............ | H03M 13/1122 714/752 |
| 8,234,320 B1 | 7/2012 | Yeo | | |
| 8,930,790 B1 * | 1/2015 | Tsatsaragkos | ...... | G06F 11/0751 714/752 |
| 9,391,647 B2 * | 7/2016 | Hung | ................. | H03M 13/1105 |

(Continued)

FOREIGN PATENT DOCUMENTS

JP 2005-269535 9/2005

OTHER PUBLICATIONS

Youn Sung Park et al., "Low-Power High-Throughput LDPC Decoder Using Non-Refresh Embedded DRAM" IEEE Journal of Solid-State Circuits, vol. 49, No. 3, 2014, pp. 783-794.

*Primary Examiner* — Justin R Knapp
(74) *Attorney, Agent, or Firm* — Greenblum & Bernstein, P.L.C.

(57) ABSTRACT

A storage which, in operation, stores a first minimum value and a second minimum value each time a plurality of data are input. Round-robin comparison circuitry which, in operation, makes a magnitude comparison among the plurality of data. First selection comparison circuitry and second selection comparison circuitry which, in operation, make a magnitude comparison between the first minimum value and each of the plurality of data and a magnitude comparison between the second minimum value and each of the plurality of data, respectively. Judgment circuitry which, in operation, judges a new first minimum value and a new second minimum value on the basis of a comparison result from the round-robin comparison circuitry and comparison results from the first and second selection comparison circuitry.

6 Claims, 45 Drawing Sheets

(56) References Cited

U.S. PATENT DOCUMENTS

| | | | |
|---|---|---|---|
| 9,590,657 B2* | 3/2017 | Sedighi | H03M 13/112 |
| 2005/0210366 A1 | 9/2005 | Maehata | |
| 2013/0275827 A1* | 10/2013 | Wang | G06F 11/1076 |
| | | | 714/752 |
| 2016/0233883 A1* | 8/2016 | Sedighi | H03M 13/112 |

* cited by examiner

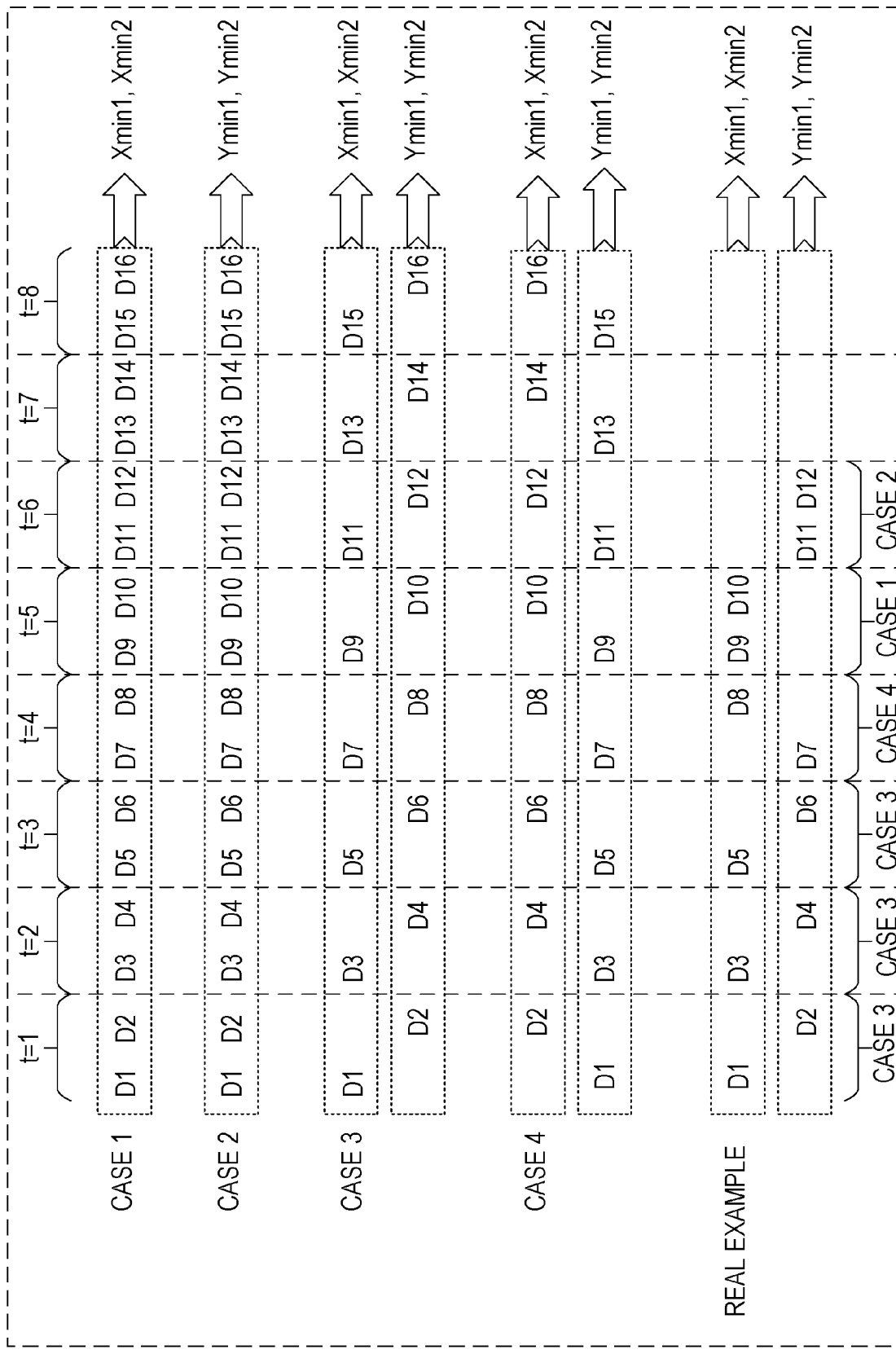

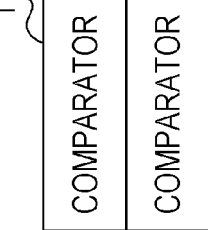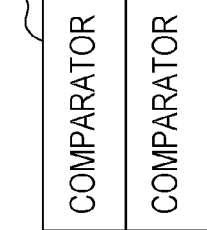
FIG. 4A
FIG. 4B

FIG. 6A

| CONDITION NO. | INPUT | | | | | OUTPUT | | | |
|---|---|---|---|---|---|---|---|---|---|
| | Cz1 | Cz2 | Cw1 | Cw2 | C12 | Xmin1 | Xmin2 | Ymin1 | Ymin2 |
| 1 | 1 | 1 | 1 | 1 | 1 | Xmin1 | Xmin2 | | |
| 2 | 1 | 1 | 1 | 1 | 0 | Xmin1 | Xmin2 | | |
| 3 | 1 | 1 | 1 | 0 | 0 | Xmin1 | D2 | | |
| 4 | 1 | 1 | 0 | 0 | 0 | D2 | Xmin1 | | |
| 5 | 1 | 0 | 1 | 1 | 1 | Xmin1 | D1 | | |
| 6 | 1 | 0 | 1 | 0 | 1 | Xmin1 | D1 | | |
| 7 | 1 | 0 | 1 | 0 | 0 | Xmin1 | D2 | | |
| 8 | 1 | 0 | 0 | 0 | 0 | D2 | Xmin1 | | |
| 9 | 0 | 0 | 1 | 1 | 1 | D1 | Xmin1 | | |
| 10 | 0 | 0 | 1 | 0 | 1 | D1 | Xmin1 | | |
| 11 | 0 | 0 | 0 | 0 | 1 | D1 | D2 | | |
| 12 | 0 | 0 | 0 | 0 | 0 | D2 | D1 | | |

FIG. 6B

| CONDITION NO. | INPUT | | | | | OUTPUT | | | |
|---|---|---|---|---|---|---|---|---|---|
| | Cz1 | Cz2 | Cw1 | Cw2 | C12 | Xmin1 | Xmin2 | Ymin1 | Ymin2 |
| 1 | 1 | 1 | 1 | 1 | 1 | | | Ymin1 | Ymin2 |
| 2 | 1 | 1 | 1 | 1 | 0 | | | Ymin1 | Ymin2 |
| 3 | 1 | 1 | 1 | 0 | 0 | | | Ymin1 | D2 |
| 4 | 1 | 1 | 0 | 0 | 0 | | | D2 | Ymin1 |
| 5 | 1 | 0 | 1 | 1 | 1 | | | Ymin1 | D1 |
| 6 | 1 | 0 | 1 | 0 | 1 | | | Ymin1 | D1 |
| 7 | 1 | 0 | 1 | 0 | 0 | | | Ymin1 | D2 |
| 8 | 1 | 0 | 0 | 0 | 0 | | | D2 | Ymin1 |
| 9 | 0 | 0 | 1 | 1 | 1 | | | D1 | Ymin1 |
| 10 | 0 | 0 | 1 | 0 | 1 | | | D1 | Ymin1 |
| 11 | 0 | 0 | 0 | 0 | 1 | | | D1 | D2 |
| 12 | 0 | 0 | 0 | 0 | 0 | | | D2 | D1 |

FIG. 6C

| CONDITION NO. | INPUT | | | | | OUTPUT | | | |
|---|---|---|---|---|---|---|---|---|---|
| | Cz1 | Cz2 | Cw1 | Cw2 | C12 | Xmin1 | Xmin2 | Ymin1 | Ymin2 |
| Z1 | 1 | 1 | * | * | * | Xmin1 | Xmin2 | | |
| Z2 | 1 | 0 | * | * | * | Xmin1 | D1 | | |
| Z3 | 0 | 0 | * | * | * | D1 | Xmin1 | | |
| W1 | * | * | 1 | 1 | * | | | Ymin1 | Ymin2 |
| W2 | * | * | 1 | 0 | * | | | Ymin1 | D2 |
| W3 | * | * | 0 | 0 | * | | | D2 | Ymin1 |

THE SYMBOL * DENOTES DON'T CARE.

FIG. 6D

| CONDITION NO. | INPUT | | | | | OUTPUT | | | |
|---|---|---|---|---|---|---|---|---|---|
| | Cz1 | Cz2 | Cw1 | Cw2 | C12 | Xmin1 | Xmin2 | Ymin1 | Ymin2 |
| Z1 | 1 | 1 | * | * | * | | | Ymin1 | Ymin2 |
| Z2 | 1 | 0 | * | * | * | | | Ymin1 | D1 |
| Z3 | 0 | 0 | * | * | * | | | D1 | Ymin1 |
| W1 | * | * | 1 | 1 | * | Xmin1 | Xmin2 | | |
| W2 | * | * | 1 | 0 | * | Xmin1 | D2 | | |
| W3 | * | * | 0 | 0 | * | D2 | Xmin1 | | |

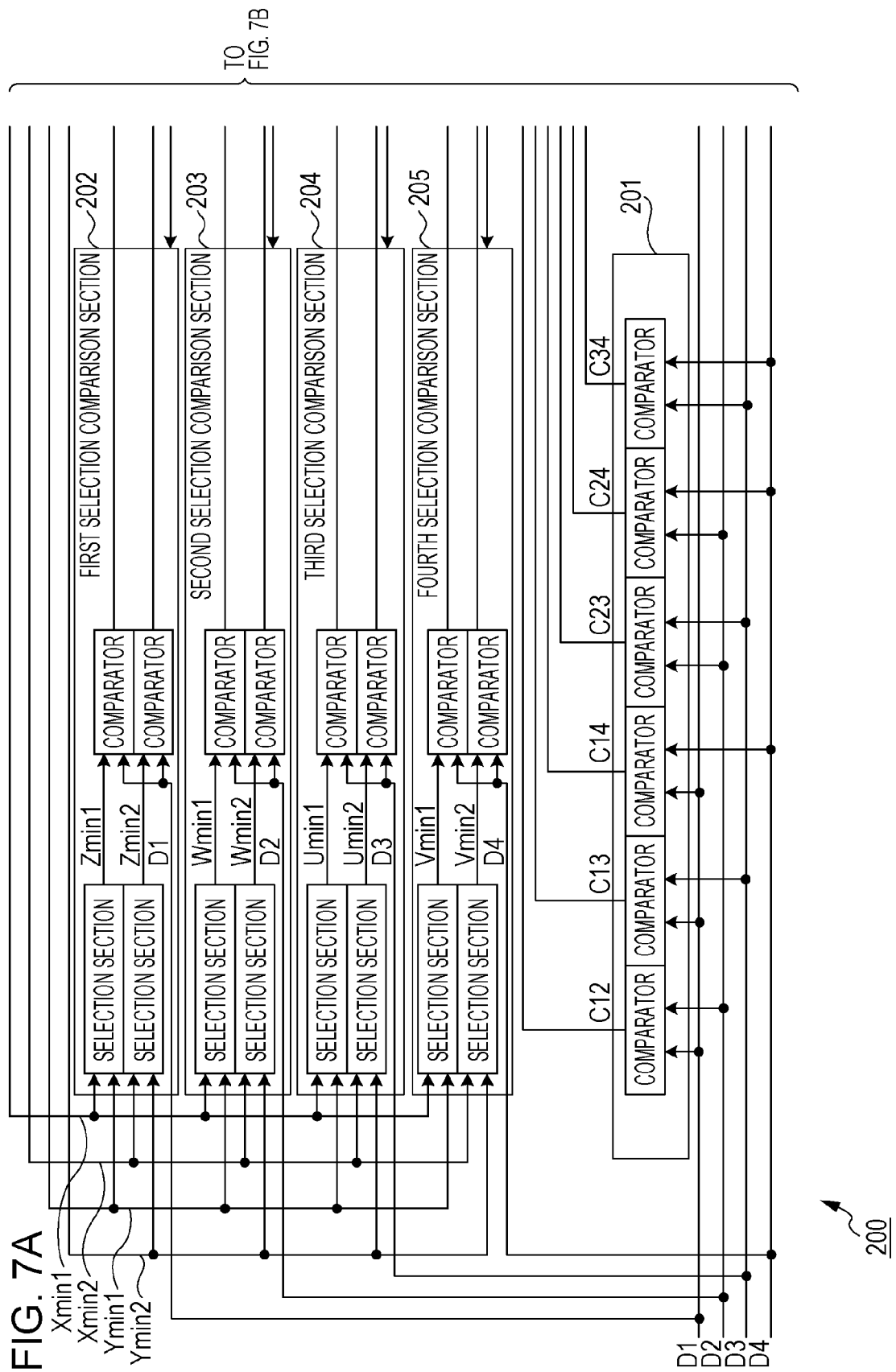

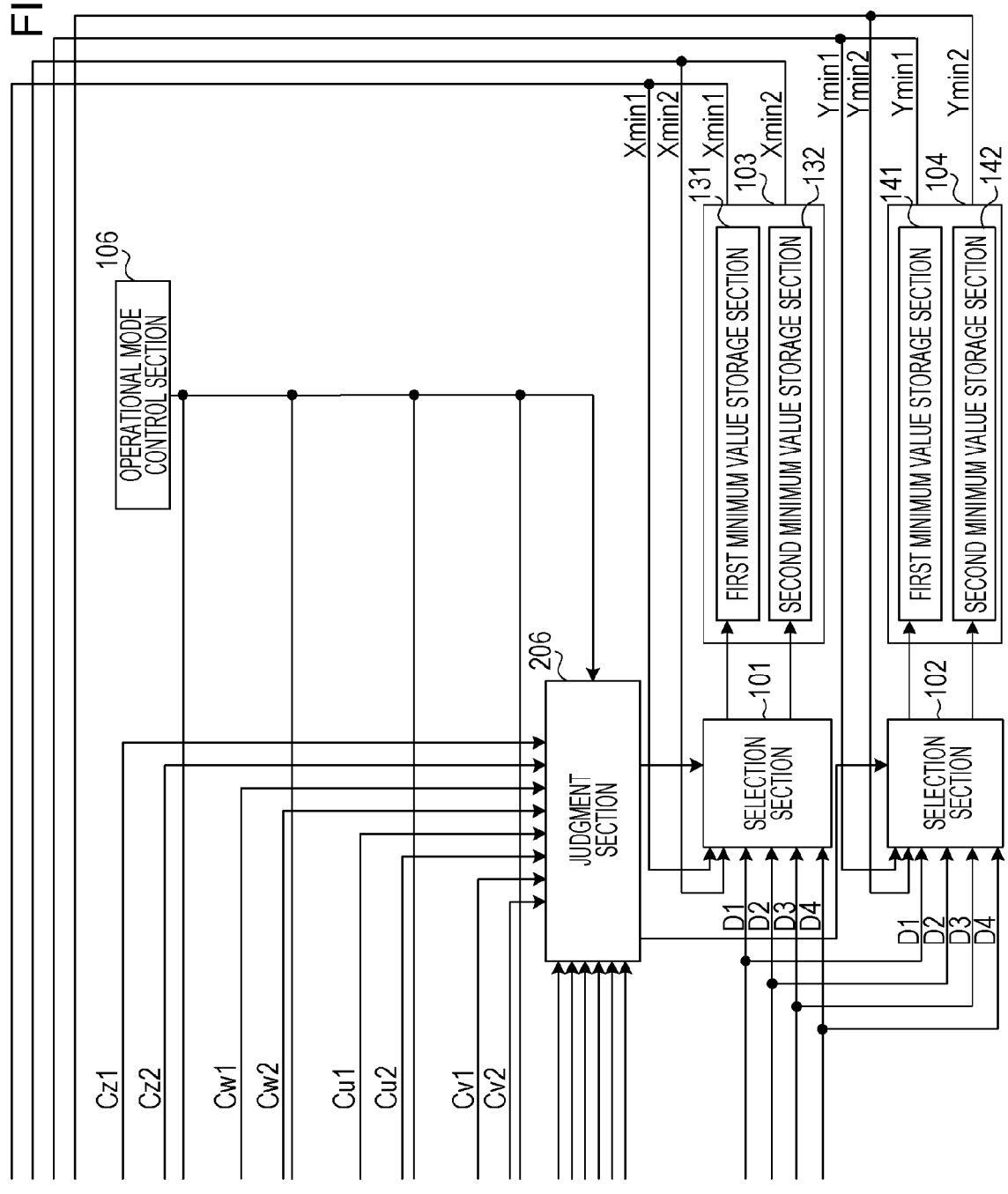

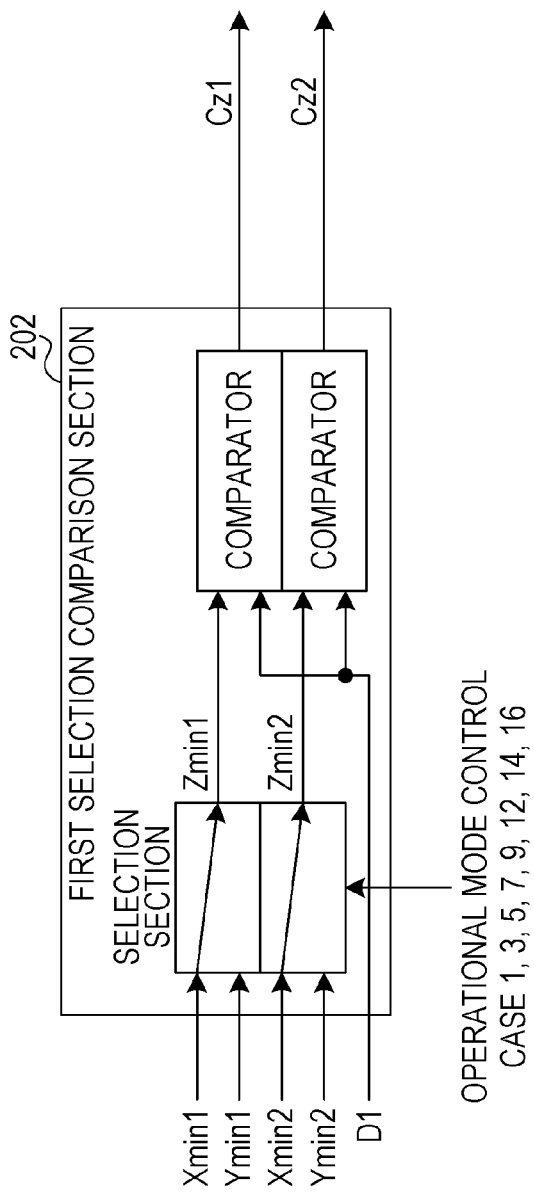
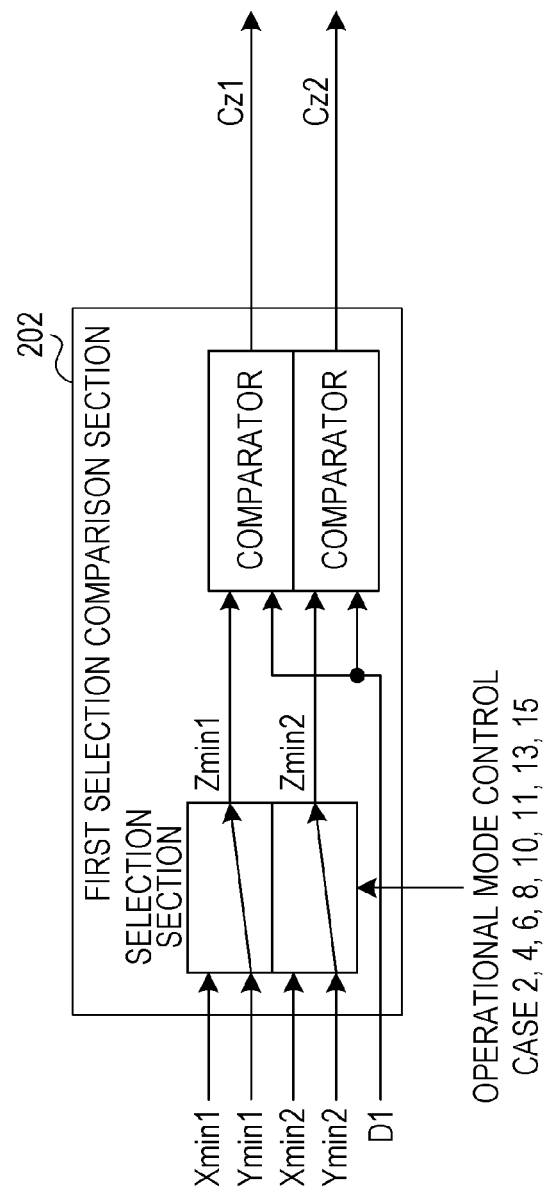
FIG. 9A
FIG. 9B

FIG. 13A

| CONDITION NO. | INPUT | | | | | | | | | | | | | | OUTPUT | |
|---|---|---|---|---|---|---|---|---|---|---|---|---|---|---|---|---|
| | Cw1 | Cz1 | Cu1 | Cv1 | Cw2 | Cz2 | Cu2 | Cv2 | C12 | C13 | C14 | C23 | C24 | C34 | | |
| A1-1 | 1 | 1 | 1 | 1 | 1 | 1 | 1 | 1 | | | | | | | Xmin1 | Xmin2 |
| A1-2 | 1 | 1 | 1 | 1 | OTHER THAN 1,1,1,1 | | | | 1 | 1 | 1 | * | * | * | Xmin1 | Xmin2 |
| A1-3 | 1 | 1 | 1 | 1 | | | | | 0 | * | * | 1 | 1 | * | Xmin1 | D1 |
| A1-4 | 1 | 1 | 1 | 1 | | | | | * | 0 | * | 0 | * | 1 | Xmin1 | D2 |
| A1-5 | 1 | 1 | 1 | 1 | | | | | * | * | 0 | * | 0 | 0 | Xmin1 | D3 |
| A1-6 | 0 | 1 | 1 | 1 | | | | | | | | | | | Xmin1 | D4 |
| A1-7 | 1 | 0 | 1 | 1 | | | | | | | | | | | D1 | Xmin1 |
| A1-8 | 1 | 1 | 0 | 1 | | | | | | | | | | | D2 | Xmin1 |
| A1-9 | 1 | 1 | 1 | 0 | | | | | | | | | | | D3 | Xmin1 |
| A1-10 | OTHER THAN THOSE ABOVE (WITH TWO OR MORE 0'S) | | | | | | | | 1 | 1 | 1 | 1 | 1 | * | D4 | Xmin1 |
| A1-11 | | | | | | | | | 1 | 1 | 1 | 0 | * | 1 | D1 | D2 |
| A1-12 | | | | | | | | | 1 | 1 | 1 | * | 0 | 0 | D1 | D3 |
| A1-13 | | | | | | | | | 0 | 0 | * | 1 | 1 | * | D1 | D4 |
| A1-14 | | | | | | | | | 0 | * | 0 | 1 | 1 | 1 | D2 | D1 |
| A1-15 | | | | | | | | | 0 | * | * | * | 1 | 0 | D2 | D3 |
| A1-16 | | | | | | | | | * | 0 | 0 | * | 0 | 1 | D2 | D4 |
| A1-17 | | | | | | | | | 1 | 0 | 0 | 0 | 1 | 1 | D3 | D1 |
| A1-18 | | | | | | | | | 0 | 0 | * | 1 | * | 1 | D3 | D2 |
| A1-19 | | | | | | | | | 1 | 1 | 0 | 1 | 0 | 0 | D3 | D4 |
| A1-20 | | | | | | | | | 0 | * | 0 | 0 | 0 | 0 | D4 | D1 |
| A1-21 | | | | | | | | | * | 0 | 0 | 0 | 0 | 0 | D4 | D2 |

FIG. 13B

| CONDITION NO. | INPUT | | | | | | | | | | OUTPUT | | | | | | | |
|---|---|---|---|---|---|---|---|---|---|---|---|---|---|---|---|---|---|---|
| | Cw1 | Cz1 | Cu1 | Cv1 | Cw2 | Cz2 | Cu2 | Cv2 | C12 | C13 | C14 | C23 | C24 | C34 | | |
| A2-1 | 1 | 1 | 1 | 1 | 1 | 1 | 1 | 1 | | | | | | | Ymin1 | Ymin2 |
| A2-2 | 1 | 1 | 1 | 1 | OTHER THAN 1, 1, 1, 1 | | | | 1 | 1 | 1 | * | * | * | Ymin1 | Ymin2 |
| A2-3 | 1 | 1 | 1 | 1 | | | | | 0 | * | * | 1 | 1 | * | Ymin1 | D1 |
| A2-4 | 1 | 1 | 1 | 1 | | | | | * | 0 | * | 0 | * | 1 | Ymin1 | D2 |
| A2-5 | 1 | 1 | 1 | 1 | | | | | * | * | 0 | * | 0 | 0 | Ymin1 | D3 |
| A2-6 | 0 | 1 | 1 | 1 | | | | | | | | | | | Ymin1 | D4 |
| A2-7 | 1 | 0 | 1 | 1 | | | | | | | | | | | D1 | Ymin1 |
| A2-8 | 1 | 1 | 0 | 1 | | | | | | | | | | | D2 | Ymin1 |
| A2-9 | 1 | 1 | 1 | 0 | | | | | | | | | | | D3 | Ymin1 |
| A2-10 | OTHER THAN THOSE ABOVE (WITH TWO OR MORE 0'S) | | | | | | | | 1 | 1 | 1 | 1 | 1 | * | D4 | Ymin1 |
| A2-11 | | | | | | | | | 1 | 1 | 1 | 0 | * | 1 | D1 | D2 |
| A2-12 | | | | | | | | | 1 | 1 | 1 | * | 1 | 0 | D1 | D3 |
| A2-13 | | | | | | | | | 0 | 1 | * | 1 | 1 | * | D1 | D4 |
| A2-14 | | | | | | | | | 0 | 0 | * | 1 | 1 | 1 | D2 | D1 |
| A2-15 | | | | | | | | | 0 | * | 0 | 1 | 1 | 0 | D2 | D3 |
| A2-16 | | | | | | | | | 1 | 0 | 1 | 0 | * | 1 | D2 | D4 |
| A2-17 | | | | | | | | | 0 | 0 | * | 0 | 1 | 1 | D3 | D1 |
| A2-18 | | | | | | | | | * | 1 | 0 | 0 | 0 | 1 | D3 | D2 |
| A2-19 | | | | | | | | | 1 | * | 0 | 1 | 0 | 0 | D3 | D4 |
| A2-20 | | | | | | | | | 0 | 0 | 0 | 0 | 0 | 0 | D4 | D1 |
| A2-21 | | | | | | | | | * | 0 | 0 | 0 | 0 | 0 | D4 | D2 |

FIG. 14A

| CONDITION NO. | INPUT | | | | | | | | | | | | | | | OUTPUT | | | |
|---|---|---|---|---|---|---|---|---|---|---|---|---|---|---|---|---|---|---|---|
| | Cw1 | Cz1 | Cu1 | Cv1 | Cw2 | Cz2 | Cu2 | Cv2 | C12 | C13 | C14 | C23 | C24 | C34 | Xmin1 | Xmin2 | Ymin1 | Ymin2 |
| A3-1 | 1 | 1 | 1 | | | | | | | | | | | | Xmin1 | Xmin2 | | |
| A3-2 | 1 | 1 | 1 | | | | | | | 1 | | | | | Xmin1 | D1 | | |
| A3-3 | 1 | 1 | 1 | | | | | | | 0 | | | | | Xmin1 | D3 | | |
| A3-4 | 0 | 0 | 1 | | 1 | | | | | | | | | | D1 | Xmin1 | | |
| A3-5 | 1 | 1 | 0 | | | 1 | | | | | | | | | D3 | Xmin1 | | |
| A3-6 | 0 | 0 | 0 | | | | 1 | | | 1 | | | | | D1 | D3 | | |
| A3-7 | 0 | 0 | 0 | | | | | 1 | | 0 | | | | | D3 | D1 | | |
| B3-1 | | 1 | | 1 | | | | | | | | | | | | | Ymin1 | Ymin2 |
| B3-2 | | 1 | | 1 | | | | | | | | | 1 | | | | Ymin1 | D2 |
| B3-3 | | 1 | | 1 | | | | | | | | | 0 | | | | Ymin1 | D4 |
| B3-4 | | 0 | | 1 | | | | | | | | | | | | | D2 | Ymin1 |
| B3-5 | | 1 | | 0 | | | | | | | | | | | | | D4 | Ymin1 |
| B3-6 | | 0 | | 0 | | | | | | | | | 1 | | | | D2 | D4 |
| B3-7 | | 0 | | 0 | | | | | | | | | 0 | | | | D4 | D2 |

FIG. 14B

| CONDITION NO. | INPUT | | | | | | | | | | C12 | C13 | C14 | C23 | C24 | C34 | OUTPUT | | | |
|---|---|---|---|---|---|---|---|---|---|---|---|---|---|---|---|---|---|---|---|---|
| | Cw1 | Cz1 | Cu1 | Cv1 | Cw2 | Cz2 | Cu2 | Cv2 | | | | | | | | | Xmin1 | Xmin2 | Ymin1 | Ymin2 |
| A4-1 | 1 | | 1 | | | | 1 | | | | | | | | | | | | Ymin1 | Ymin2 |
| A4-2 | 1 | | 1 | | 1 | | | | | | | | | | | | | | Ymin1 | Ymin2 |
| A4-3 | 1 | | 1 | | | | | | | | 1 | | | | | | | | Ymin1 | D2 |
| A4-4 | 0 | | 1 | | | | | | | | 0 | | | | | | | | Ymin1 | D4 |
| A4-5 | 1 | | 0 | | | | | | | | 1 | | | | | | | | D2 | Ymin1 |
| A4-6 | 0 | | 0 | | | | | | | | 0 | | | | | | | | D4 | Ymin1 |
| A4-7 | 0 | | 0 | | | | | | | | | | | | | | | | D2 | D4 |
| B4-1 | | 1 | | 1 | | 1 | | | | | | | | | | | Xmin1 | Xmin2 | | |
| B4-2 | | 1 | | 1 | | | | | | | | 1 | | | 1 | | Xmin1 | D1 | | |
| B4-3 | | 1 | | 1 | | | | | | | | 0 | | | 0 | | Xmin1 | D3 | | |
| B4-4 | | 0 | | 1 | | | | | | | | | | | | | D1 | Xmin1 | | |
| B4-5 | | 1 | | 0 | | | | | | | | 1 | | | | | D3 | Xmin1 | | |
| B4-6 | | 0 | | 0 | | | | | | | | | | | 1 | | D1 | D3 | | |
| B4-7 | | 0 | | 0 | | | | | | | | 0 | | | 0 | | D3 | D1 | | |

FIG. 15A

| CONDITION NO. | INPUT ||||||||||||||| OUTPUT ||||
|---|---|---|---|---|---|---|---|---|---|---|---|---|---|---|---|---|---|---|
| | Cw1 | Cz1 | Cu1 | Cv1 | Cw2 | Cz2 | Cu2 | Cv2 | C12 | C13 | C14 | C23 | C24 | C34 | Xmin1 | Xmin2 | Ymin1 | Ymin2 |
| A5-1 | 1 | 1 | | | 1 | 1 | | | | ▨ | ▨ | ▨ | ▨ | | Xmin1 | Xmin2 | | |
| A5-2 | 1 | 1 | | | | | | | 1 | ▨ | ▨ | ▨ | ▨ | | Xmin1 | D1 | | |
| A5-3 | 1 | 1 | | | | | | | 0 | ▨ | ▨ | ▨ | ▨ | | Xmin1 | D2 | | |
| A5-4 | 0 | 1 | | | | | | | | ▨ | ▨ | ▨ | ▨ | | D1 | Xmin1 | | |
| A5-5 | 1 | 0 | | | | | | | | ▨ | ▨ | ▨ | ▨ | | D2 | Xmin1 | | |
| A5-6 | 0 | 0 | | | | | | | 1 | ▨ | ▨ | ▨ | ▨ | | D1 | D2 | | |
| A5-7 | 0 | 0 | | | | | | | 0 | ▨ | ▨ | ▨ | ▨ | | D2 | D1 | | |
| B5-1 | | | 1 | 1 | | | 1 | 1 | | ▨ | ▨ | ▨ | ▨ | | | | Ymin1 | Ymin2 |
| B5-2 | | | 1 | 1 | | | | | | ▨ | ▨ | ▨ | ▨ | 1 | | | Ymin1 | D3 |
| B5-3 | | | 1 | 1 | | | | | | ▨ | ▨ | ▨ | ▨ | 0 | | | Ymin1 | D4 |
| B5-4 | | | 0 | 1 | | | | | | ▨ | ▨ | ▨ | ▨ | | | | D3 | Ymin1 |
| B5-5 | | | 1 | 0 | | | | | | ▨ | ▨ | ▨ | ▨ | | | | D4 | Ymin1 |
| B5-6 | | | 0 | 0 | | | | | | ▨ | ▨ | ▨ | ▨ | 1 | | | D3 | D4 |
| B5-7 | | | 0 | 0 | | | | | | ▨ | ▨ | ▨ | ▨ | 0 | | | D4 | D3 |

FIG. 15B

| CONDITION NO. | INPUT | | | | | | | | | | | | | | OUTPUT | | | |
|---|---|---|---|---|---|---|---|---|---|---|---|---|---|---|---|---|---|---|
| | Cw1 | Cz1 | Cu1 | Cv1 | Cw2 | Cz2 | Cu2 | Cv2 | C12 | C13 | C14 | C23 | C24 | C34 | Xmin1 | Xmin2 | Ymin1 | Ymin2 |
| A6-1 | 1 | 1 | | | 1 | 1 | | | | ///| ///| ///| ///| | | | Ymin1 | Ymin2 |
| A6-2 | 1 | 1 | | | | | | | 1 | ///| ///| ///| ///| | | | Ymin1 | D3 |
| A6-3 | 1 | 1 | | | | | | | 0 | ///| ///| ///| ///| | | | Ymin1 | D4 |
| A6-4 | 0 | 1 | | | | | | | | ///| ///| ///| ///| | | | D3 | Ymin1 |
| A6-5 | 1 | 0 | | | | | | | | ///| ///| ///| ///| | | | D4 | Ymin1 |
| A6-6 | 0 | 0 | | | | | | | 1 | ///| ///| ///| ///| | | | D3 | D4 |
| A6-7 | 0 | 0 | | | | | | | 0 | ///| ///| ///| ///| | | | D4 | D3 |
| B6-1 | | | 1 | 1 | | | 1 | 1 | | ///| ///| ///| ///| | Xmin1 | Xmin2 | | |
| B6-2 | | | 1 | 1 | | | | | | ///| ///| ///| ///| 1 | Xmin1 | D1 | | |
| B6-3 | | | 1 | 1 | | | | | | ///| ///| ///| ///| 0 | Xmin1 | D2 | | |
| B6-4 | | | 0 | 1 | | | | | | ///| ///| ///| ///| | D1 | Xmin1 | | |
| B6-5 | | | 1 | 0 | | | | | | ///| ///| ///| ///| | D2 | Xmin1 | | |
| B6-6 | | | 0 | 0 | | | | | | ///| ///| ///| ///| 1 | D1 | D2 | | |
| B6-7 | | | 0 | 0 | | | | | | ///| ///| ///| ///| 0 | D2 | D1 | | |

FIG. 16A

| CONDITION NO. | INPUT | | | | | | | | | | C12 | C13 | C14 | C23 | C24 | C34 | OUTPUT | | | |
|---|---|---|---|---|---|---|---|---|---|---|---|---|---|---|---|---|---|---|---|---|
| | Cw1 | Cz1 | Cu1 | Cv1 | Cw2 | Cz2 | Cu2 | Cv2 | | | | | | | | | Xmin1 | Xmin2 | Ymin1 | Ymin2 |
| E9-1 | 1 | | | | 1 | | | | | | | | | | | | | Xmin2 | | |
| E9-2 | 1 | | | | 0 | | | | | | | | | | | | Xmin1 | D1 | | |
| E9-3 | 0 | | | | | | | | | | | | | | | | D1 | Xmin1 | | |
| F9-1 | | 1 | 1 | 1 | | 1 | 1 | 1 | | | | | | | | | | | Ymin1 | Ymin2 |
| F9-2 | | 1 | 1 | 1 | | OTHER THAN 1, 1, 1 | | | | | | | | 1 | 1 | * | | | Ymin1 | D2 |
| F9-3 | | 1 | 1 | 1 | | | | | | | | | | 0 | * | 1 | | | Ymin1 | D3 |
| F9-4 | | 1 | 1 | 1 | | | | | | | | | | * | 0 | 0 | | | Ymin1 | D4 |
| F9-5 | | 0 | 1 | 1 | | | | | | | | | | | | | | | D2 | Ymin1 |
| F9-6 | | 1 | 0 | 1 | | | | | | | | | | | | | | | D3 | Ymin1 |
| F9-7 | | 1 | 1 | 0 | | | | | | | | | | | | | | | D4 | Ymin1 |
| F9-8 | | OTHER THAN THOSE ABOVE (WITH TWO (OR MORE 0'S) | | | | | | | | | | | | 1 | 1 | 1 | | | D2 | D2 |
| F9-9 | | | | | | | | | | | | | | 1 | 1 | 0 | | | D2 | D3 |
| F9-10 | | | | | | | | | | | | | | 0 | 1 | 1 | | | D3 | D4 |
| F9-11 | | | | | | | | | | | | | | 0 | 0 | 1 | | | D3 | D2 |
| F9-12 | | | | | | | | | | | | | | 1 | 0 | 0 | | | D4 | D4 |
| F9-13 | | | | | | | | | | | | | | 0 | 0 | 0 | | | D4 | D3 |

FIG. 16B

| CONDITION NO. | INPUT | | | | | | | | | | | | | | | | OUTPUT | | | |
|---|---|---|---|---|---|---|---|---|---|---|---|---|---|---|---|---|---|---|---|---|
| | Cw1 | Cz1 | Cu1 | Cv1 | Cw2 | Cz2 | Cu2 | Cv2 | C12 | C13 | C14 | C23 | C24 | C34 | | Xmin1 | Xmin2 | Ymin1 | Ymin2 |
| E10-1 | 1 | | | | 1 | | | | | | | | | | | | | Ymin1 | Ymin2 |
| E10-2 | 1 | | | | 0 | | | | | | | | | | | | | Ymin1 | D1 |
| E10-3 | 0 | | | | | | | | | | | | | | | | | D1 | Ymin1 |
| F10-1 | | 1 | | 1 | | 1 | 1 | 1 | | | | | | | | Xmin1 | Xmin2 | | |
| F10-2 | | 1 | 1 | 1 | | | 1 | 1 | | | | 1 | 1 | * | | Xmin1 | D2 | | |
| F10-3 | | 1 | 1 | 1 | | OTHER THAN 1, 1, 1 | | | | | | 0 | * | 1 | | Xmin1 | D3 | | |
| F10-4 | | 1 | 1 | 1 | | | | | | | | * | 0 | 0 | | Xmin1 | D4 | | |
| F10-5 | | 0 | 1 | 1 | | | | | | | | | | | | D2 | Xmin1 | | |
| F10-6 | | 1 | 0 | 1 | | | | | | | | | | | | D3 | Xmin1 | | |
| F10-7 | | 1 | 1 | 0 | | | | | | | | | | | | D4 | Xmin1 | | |
| F10-8 | | OTHER THAN THOSE ABOVE (WITH TWO OR MORE 0'S) | | | | | | | | | | 1 | 1 | 1 | | D2 | D3 | | |
| F10-9 | | | | | | | | | | | | 1 | 1 | 0 | | D2 | D4 | | |
| F10-10 | | | | | | | | | | | | 0 | 1 | 1 | | D3 | D2 | | |
| F10-11 | | | | | | | | | | | | 0 | 0 | 0 | | D3 | D4 | | |
| F10-12 | | | | | | | | | | | | 1 | 0 | 0 | | D4 | D2 | | |
| F10-13 | | | | | | | | | | | | 0 | 0 | 0 | | D4 | D3 | | |

FIG. 17A

| CONDITION NO. | INPUT | | | | | | | | | | | | | | OUTPUT | | | |
|---|---|---|---|---|---|---|---|---|---|---|---|---|---|---|---|---|---|---|
| | Cw1 | Cz1 | Cu1 | Cv1 | Cw2 | Cz2 | Cu2 | Cv2 | C12 | C13 | C14 | C23 | C24 | C34 | Xmin1 | Xmin2 | Ymin1 | Ymin2 |
| E11-1 | 1 | 1 | | | | 1 | | | | | | | | | Xmin1 | Xmin2 | | |
| E11-2 | 1 | 1 | | | | 0 | | | | | | | | | Xmin1 | D2 | | |
| E11-3 | 1 | 0 | | | | | | | | | | | | | D2 | Xmin1 | | |
| F11-1 | 1 | | 1 | 1 | 1 | | 1 | | | | | | | | | | Ymin1 | Ymin2 |
| F11-2 | 1 | | 1 | 1 | | | 1 | | | 1 | 1 | | | * | | | Ymin1 | D1 |
| F11-3 | 1 | | 1 | 1 | | | | | | 0 | * | | | 1 | | | Ymin1 | D3 |
| F11-4 | 1 | | 1 | 1 | | | | | | * | 0 | | | 0 | | | Ymin1 | D4 |
| F11-5 | 0 | | 1 | 1 | | | | | | | | | | | | | D1 | Ymin1 |
| F11-6 | 1 | | 0 | 1 | | | | | | | | | | | | | D3 | Ymin1 |
| F11-7 | 1 | | 1 | 0 | | | | | | | | | | | | | D4 | Ymin1 |
| F11-8 | OTHER THAN THOSE ABOVE (WITH TWO OR MORE 0'S IN Cw1, Cu1, AND Cv1) | | | | OTHER THAN 1,*,1,1 | | | | | 1 | 1 | | | 1 | | | D1 | D3 |
| F11-9 | | | | | | | | | | 1 | 1 | | | 0 | | | D1 | D4 |
| F11-10 | | | | | | | | | | 0 | 1 | | | 1 | | | D3 | D1 |
| F11-11 | | | | | | | | | | 0 | 0 | | | 1 | | | D3 | D4 |
| F11-12 | | | | | | | | | | 1 | 0 | | | 0 | | | D4 | D1 |
| F11-13 | | | | | | | | | | 0 | 0 | | | 0 | | | D4 | D3 |

FIG. 17B

| CONDITION NO. | INPUT | | | | | | | | | C12 | C13 | C14 | C23 | C24 | C34 | OUTPUT | | | |
|---|---|---|---|---|---|---|---|---|---|---|---|---|---|---|---|---|---|---|---|
| | Cw1 | Cz1 | Cu1 | Cv1 | Cw2 | Cz2 | Cu2 | Cv2 | | | | | | | | Xmin1 | Xmin2 | Ymin1 | Ymin2 |
| E12-1 | | 1 | | | | 1 | | | | | | | | | | | | Ymin1 | Ymin2 |
| E12-2 | | 1 | | | | 0 | | | | | | | | | | | | Ymin1 | D2 |
| E12-3 | | 0 | | | | | | | | | | | | | | | | D2 | Ymin1 |
| F12-1 | 1 | | 1 | 1 | 1 | | 1 | 1 | | | | | | | | Xmin1 | Xmin2 | | |
| F12-2 | 1 | | 1 | 1 | OTHER THAN 1,*,1,1 | | | | | 1 | 1 | | | * | Xmin1 | D1 | | |
| F12-3 | 1 | | 1 | 1 | | | | | | 0 | * | | | 1 | Xmin1 | D3 | | |
| F12-4 | 1 | | 1 | 1 | | | | | | * | 0 | | | 0 | Xmin1 | D4 | | |
| F12-5 | 0 | | 1 | 1 | | | | | | | | | | | D1 | Xmin1 | | |
| F12-6 | 1 | | 0 | 1 | | | | | | | | | | | D3 | Xmin1 | | |
| F12-7 | 1 | | 1 | 0 | | | | | | | | | | | D4 | Xmin1 | | |
| F12-8 | OTHER THAN THOSE ABOVE (WITH TWO OR MORE 0'S IN Cw1, Cu1, AND Cv1) | | | | | | | | | 1 | 1 | | | 1 | D1 | D3 | | |
| F12-9 | | | | | | | | | | 1 | 1 | | | 0 | D1 | D4 | | |
| F12-10 | | | | | | | | | | 0 | 1 | | | 1 | D3 | D1 | | |
| F12-11 | | | | | | | | | | 0 | 0 | | | 1 | D3 | D4 | | |
| F12-12 | | | | | | | | | | 1 | 0 | | | 0 | D4 | D1 | | |
| F12-13 | | | | | | | | | | 0 | 0 | | | 0 | D4 | D3 | | |

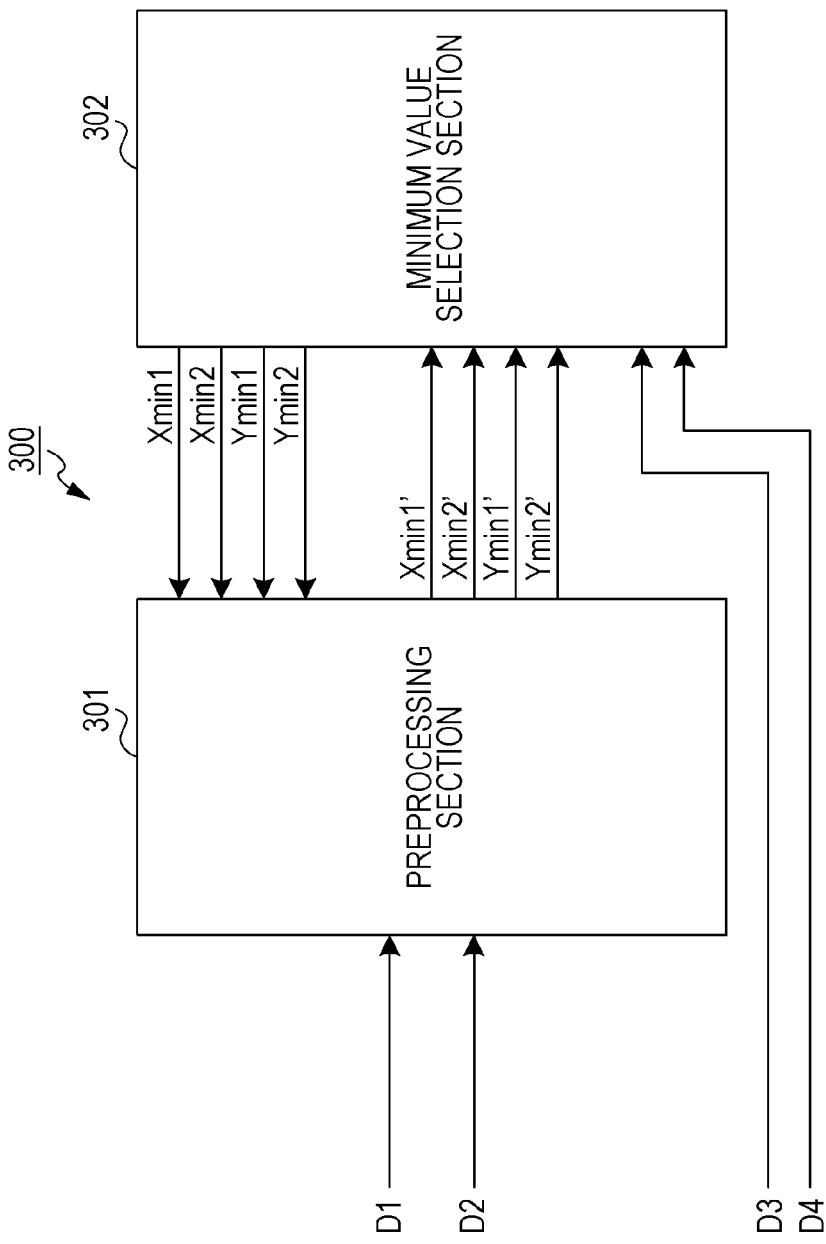

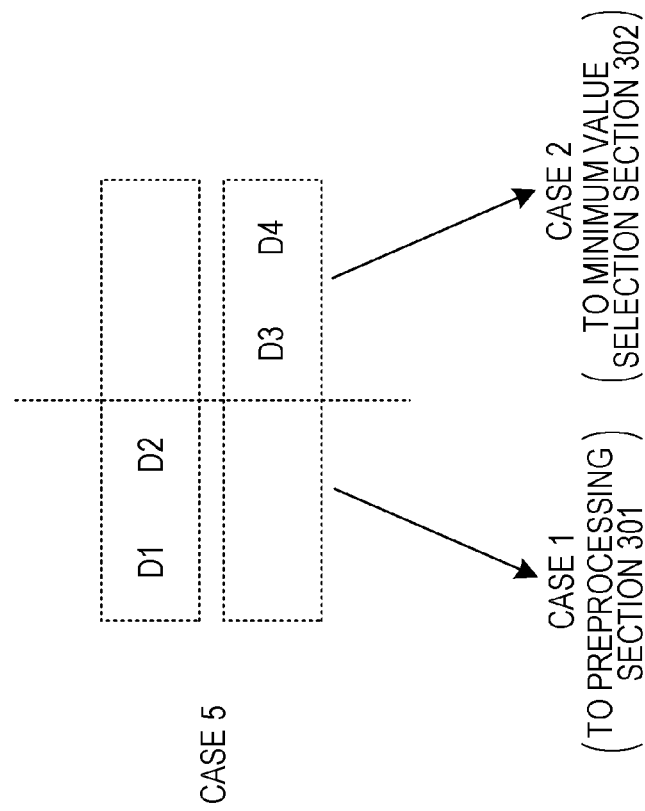

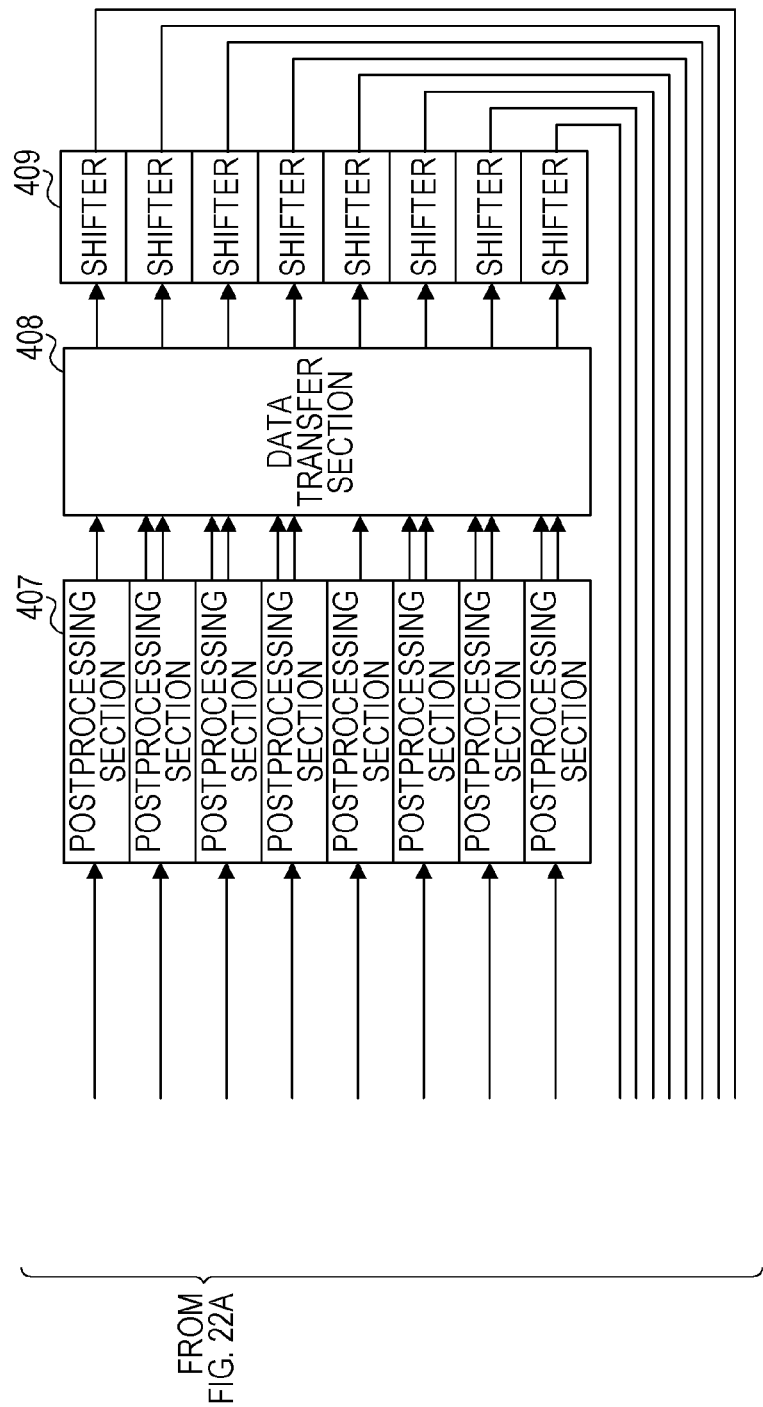

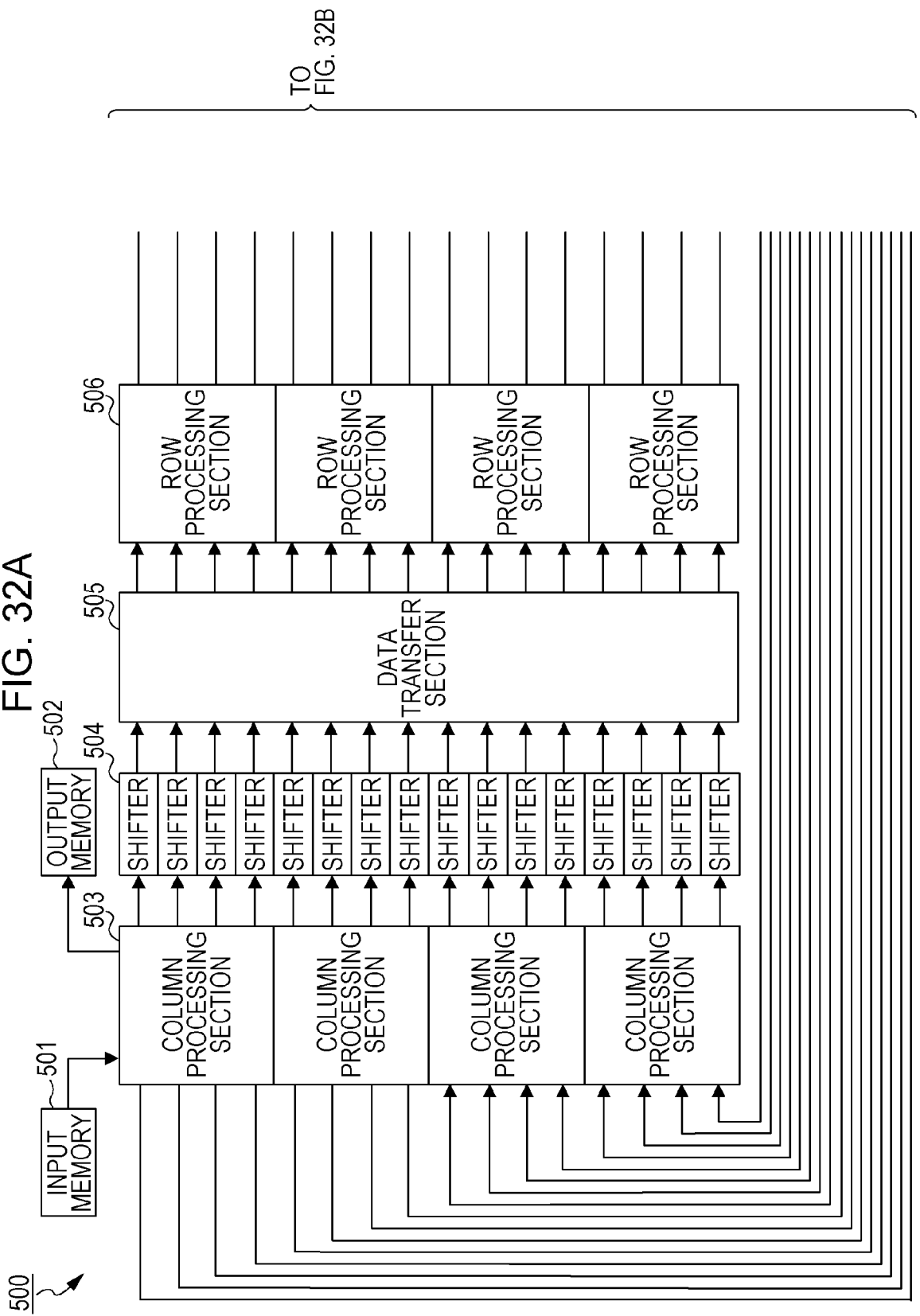

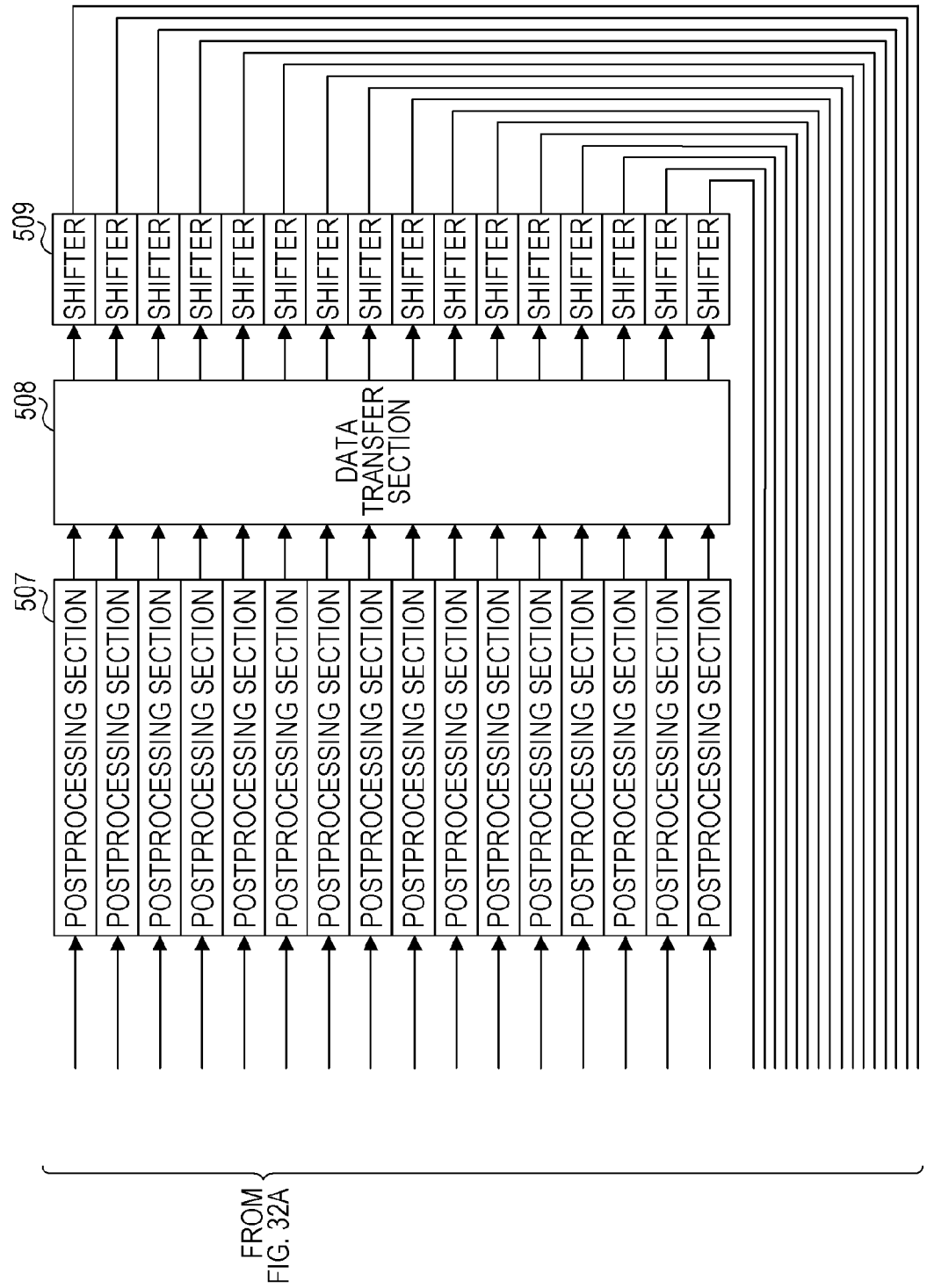

DECODER, MINIMUM VALUE SELECTION CIRCUIT, AND MINIMUM VALUE SELECTION METHOD

BACKGROUND

1. Technical Field

The present disclosure relates to a decoder, a minimum value selection circuit, and a minimum value selection method.

2. Description of the Related Art

A low density parity check (LDPC) code is known as an error correction coding method capable of achieving a bit error rate close to the Shannon limit and implementing provision of a decoder in a large scale integration (LSI).

Use of LDPC codes in standards for a high-speed communication system with throughput greater than 1 Gbps, such as IEEE 802.11ac or IEEE 802.11ad (for wireless communication) and IEEE 802.3an (for wired communication), is under consideration.

A receiver in a communication system using LDPC codes performs decoding processing by min-sum decoding.

Min-sum decoding contains computation called row processing (check node processing). More specifically, row processing performs the computation of selecting two pieces of data ranking lower in value (absolute value) magnitude from a data set with two or more elements. Note that the number of pieces of data to be selected is not limited to two and that any number will do as long as the number is smaller than a data set size (the number of pieces of data to be selected is often set to two or three).

In the description below, one with a smallest absolute value among a plurality of pieces of data will be referred to as a "first minimum value", and one with a second smallest absolute value will be referred to as a "second minimum value".

U.S. Pat. No. 8,234,320 discloses, as a minimum value selection circuit which selects a first minimum value and a second minimum value, a comparator arranged in a tree structure, which receives a plurality of pieces of data at a time and calculates a first minimum value and a second minimum value.

SUMMARY

A receiver which performs high-speed communication at speeds greater than 1 Gbps is expected to reduce a processing delay in and power consumed by the receiver. The minimum value selection circuit disclosed in U.S. Pat. No. 8,234,320, however, needs a large number of cascaded comparators, which increases a processing delay in the minimum value selection circuit and increases the circuit scale and power consumption.

One non-limiting and exemplary embodiment provides a decoder, a minimum value selection circuit, and a minimum value selection method capable of reducing a processing delay, circuit scale, and power consumption.

In one general aspect, the techniques disclosed here feature a decoder which decodes a coded data series using a parity check matrix for an LDPC code, the decoder including column processing circuitry which, in operation, performs column processing on an input data series including a plurality of pieces of data using units of columns among columns of the parity check matrix and a row processing circuitry which, in operation, performs row processing on a column message data series obtained by the column processing using units of rows among rows of the parity check matrix, in which the row processing circuitry includes a minimum value selection circuitry which, in operation, selects, using units of rows among the rows, a first minimum value with a smallest absolute value and a second minimum value with a second smallest absolute value from the column message data series obtained by the column processing and outputs the first minimum value and the second minimum value selected to the column processing circuitry, the minimum value selection circuitry includes a storage which, in operation, stores the first selected minimum value and the second selected minimum value each time a first number of pieces of data, the first number being not less than two, among the column message data series are sequentially input, a first comparison circuitry which, in operation, makes a magnitude comparison among the first number of pieces of data, a second number of second comparison circuitry which, in operation, make a magnitude comparison of the first stored minimum value with each of the first number of pieces of data and make a magnitude comparison of the second stored minimum value with each of the first number of pieces of data, the second number being twice the first number, and judgment circuitry which, in operation, judges a new first minimum value and a new second minimum value to be stored in the storage among the first number of pieces of data and the first minimum value and the second minimum value stored in the storage on a basis of a combination of a comparison result from the first comparison circuitry and comparison results from the second number of second comparison circuitry and outputs a result of the judgment to the storage, and the column processing circuitry performs the column processing again on a row message data series obtained by the row processing on a basis of the parity check matrix and outputs a decoded data series.

According to the one aspect of the present disclosure, a processing delay, circuit scale, and power consumption can be reduced.

It should be noted that general or specific embodiments may be implemented as a system, a method, an integrated circuit, a computer program, a storage section medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3 shows one example of operational modes according to the first embodiment;

FIG. 4A shows the operation of a first selection comparison section in case 1 or case 3 according to the first embodiment;

FIG. 4B shows the operation of the first selection comparison section in case 2 or case 4 according to the first embodiment;

FIG. 6A is a truth table showing the operation of a judgment section in case 1 according to the first embodiment;

FIG. 6B is a truth table showing the operation of the judgment section in case 2 according to the first embodiment;

FIG. 6C is a truth table showing the operation of the judgment section in case 3 according to the first embodiment;

FIG. 6D is a truth table showing the operation of the judgment section in case 4 according to the first embodiment;

FIG. 7A shows a part of constituent blocks of a minimum value selection circuit according to a second embodiment;

FIG. 7B shows a part of constituent blocks of a minimum value selection circuit according to a second embodiment;

FIG. 9A shows the operation of a first selection comparison section in case 1, case 3, case 5, case 7, case 9, case 12, case 14, or case 16 according to the second embodiment;

FIG. 9B shows the operation of the first selection comparison section in case 2, case 4, case 6, case 8, case 10, case 11, case 13, or case 15 according to the second embodiment;

FIG. 13A is a truth table showing the operation of a judgment section in case 1 according to the second embodiment;

FIG. 13B is a truth table showing the operation of the judgment section in case 2 according to the second embodiment;

FIG. 14A is a truth table showing the operation of the judgment section in case 3 according to the second embodiment;

FIG. 14B is a truth table showing the operation of the judgment section in case 4 according to the second embodiment;

FIG. 15A is a truth table showing the operation of the judgment section in case 5 according to the second embodiment;

FIG. 15B is a truth table showing the operation of the judgment section in case 6 according to the second embodiment;

FIG. 16A is a truth table showing the operation of the judgment section in case 9 according to the second embodiment;

FIG. 16B is a truth table showing the operation of the judgment section in case 10 according to the second embodiment;

FIG. 17A is a truth table showing the operation of the judgment section in case 11 according to the second embodiment;

FIG. 17B is a truth table showing the operation of the judgment section in case 12 according to the second embodiment;

FIG. 18 shows constituent blocks of a minimum value selection circuit according to a third embodiment;

FIG. 21 shows one example of pieces of input data in an operational mode called case 5 according to the third embodiment;

FIG. 22B shows a part of constituent blocks of an LDPC decoder according to a fourth embodiment;

FIG. 32A shows a part of constituent blocks of an LDPC decoder according to a fifth embodiment;

FIG. 32B shows a part of constituent blocks of an LDPC decoder according to a fifth embodiment;

DETAILED DESCRIPTION

[Underlying Knowledge Forming Basis of One Aspect of the Present Disclosure]

Figure 1:
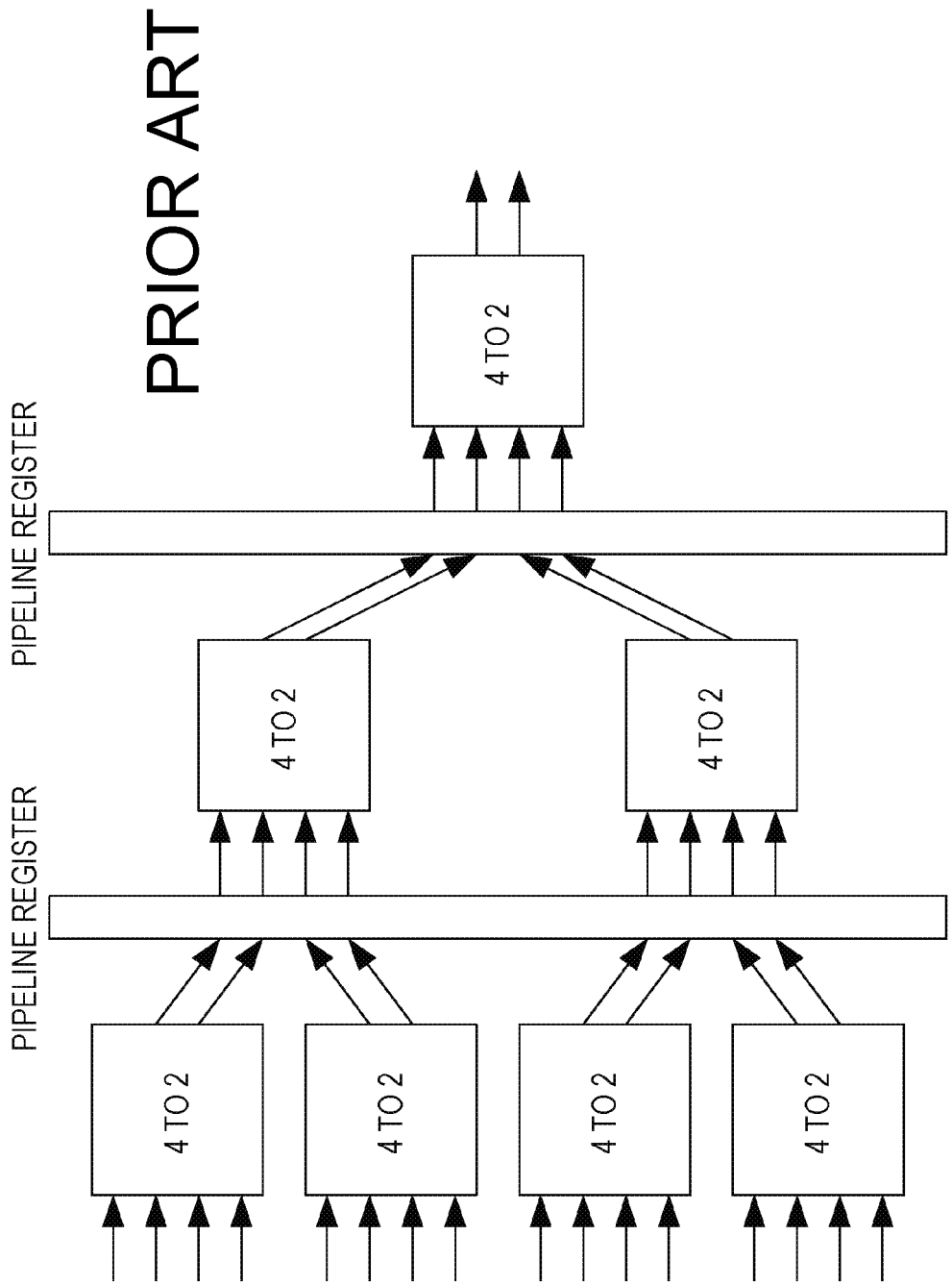
FIG. 1 shows constituent blocks of a minimum value selection circuit having comparators arranged in a tree structure.

FIG. 1 is a block diagram showing the configuration of a minimum value selection circuit having comparators arranged in a tree structure according to U.S. Pat. No. 8,234,320. By way of example, the minimum value selection circuit shown in FIG. 1 is a circuit which has 16 pieces of input data and calculates a first minimum value and a second minimum value from the 16 pieces of input data.

A "4-to-2" circuit shown in FIG. 1 calculates a first minimum value and a second minimum value for four pieces of input data. That is, the minimum value selection circuit shown in FIG. 1 includes three tiers of "4-to-2" circuits in a tree structure and calculates a first minimum value and a second minimum value from 16 pieces of input data.

In the minimum value selection circuit shown in FIG. 1, one pipeline register is inserted for each of the tiers of "4-to-2" circuits in the tree structure to cause the minimum value selection circuit to operate on a fast operation clock. That is, the minimum value selection circuit shown in FIG. 1 has a configuration with one tier of comparators for each pipeline in one tire.

Note that a "4-to-2" circuit includes a selector, a control circuit, and the like in addition to a comparator. Since the components have delays shorter than a delay in the comparator, a pipeline configuration is determined on the basis of the number of tiers of comparators.

The minimum value selection circuit shown in FIG. 1 has three tiers of pipelines, and a pipeline delay of two clock cycles is added. That is, calculation of a first minimum value and a second minimum value from 16 pieces of input data with use of the circuit shown in FIG. 1 needs three clock cycles.

If four sets of pieces (16 pieces) of input data are sequentially input in the minimum value selection circuit shown in FIG. 1, a pipeline operation needs six clock cycles. That is, if N sets of pieces of input data are sequentially input, a pipeline operation needs (N+2) clock cycles.

As described above, in the case of the configuration shown in FIG. 1, there is a need to cope with an increase in processing delay due to a delay resulting from a pipeline operation (a pipeline delay). Addition of pipeline registers as shown in FIG. 1 causes an increase in circuit scale and an increase in power consumption.

One aspect of the present disclosure reduces a processing delay, circuit scale, and power consumption in a minimum value selection circuit.

Embodiments according to one aspect of the present disclosure will be described in detail below with reference to the drawings.

(First Embodiment)

Figure 2:
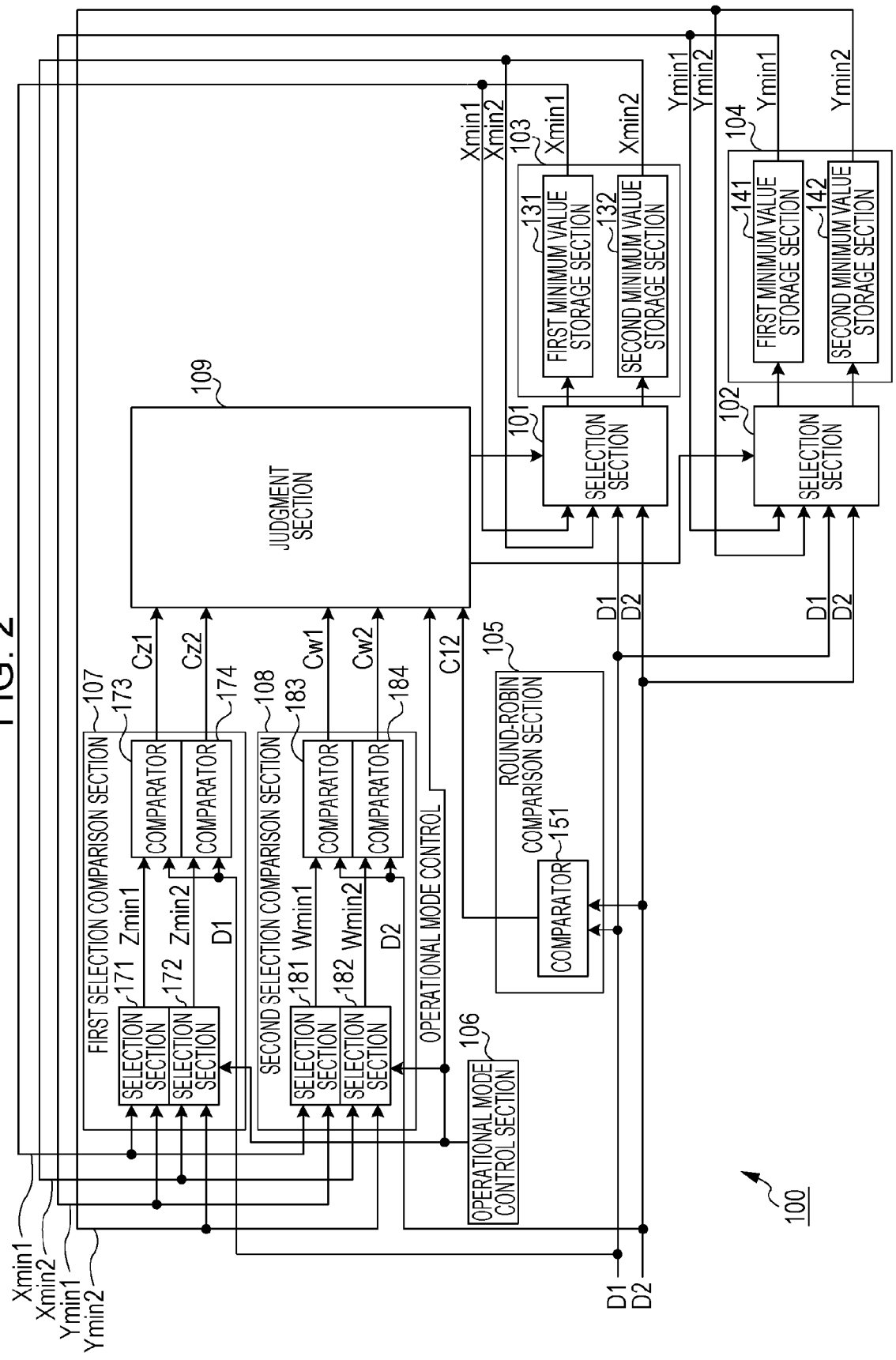
FIG. 2 shows constituent blocks of a minimum value selection circuit according to a first embodiment.

FIG. 2 is a block diagram showing the configuration of a minimum value selection circuit according to the present embodiment.

A minimum value selection circuit 100 shown in FIG. 2 selects a first minimum value with a smallest absolute value and a second minimum value with a second smallest absolute value from among a plurality of pieces of data. A plurality of pieces of data are sequentially input to the minimum value selection circuit 100 by two pieces (denoted by reference characters D1 and D2 in FIG. 2) of data at a time.

In the description below, a description of a case where the size of one set of pieces of input data is 16 will be given. Note that the size of one set of pieces of input data is not limited to 16 and that any other size may be adopted.

For example, the minimum value selection circuit 100 has four operational modes (case 1 to case 4) shown in FIG. 3.

In case 1, the minimum value selection circuit 100 selects a first minimum value (Xmin1) and a second minimum value (Xmin2) from among 16 pieces of data. Two pieces of data are input to the minimum value selection circuit 100 in each step (each clock cycle; t=1 to 8). That is, in case 1, processing for one data set is completed in eight steps.

In case 3, 16 pieces of data included in one data set are divided into two groups. In FIG. 3, odd-numbered pieces of data are placed in a first group, and even-numbered pieces of data are placed in a second group. The minimum value selection circuit 100 selects a first minimum value (Xmin1) and a second minimum value (Xmin2) of the first group and a first minimum value (Ymin1) and a second minimum value (Ymin2) of the second group. One piece of data belonging to each group is input to the minimum value selection circuit 100 in each step (t=1 to 8).

In case 2 or case 4, the 16 pieces of data are divided into the groups such that each piece of data is placed in a group opposite to a group to which the piece of data belongs in case 1 or case 3. Placement in an opposite group here means that, in the case of two groups, all pieces of data are placed in the first group in case 1 and are placed in the second group in case 2. In case 3, odd-numbered pieces of data are placed in the first group while even-numbered pieces of data are placed in the second group. In case 4, even-numbered pieces of data are placed in the first group while odd-numbered pieces of data are placed in the second group.

Grouping for one data set may be irregular. For example, in each step of a "real example" shown in FIG. 3, a combination of pieces of data in any one of case 1 to case 4 described above is input to the minimum value selection circuit 100.

For example, the minimum value selection circuit 100 is used for row processing (check node processing) of decoding processing by min-sum decoding using LDPC codes (details will be given in third and fourth embodiments). In this case, how to combine the above-described pieces of input data depends on the configuration of a parity check matrix used for LDPC decoding.

The minimum value selection circuit 100 shown in FIG. 2 includes selection sections 101 and 102, storage sections 103 and 104, a round-robin comparison section 105, an operational mode control section 106, a first selection comparison section 107, a second selection comparison section 108, and a judgment section 109.

By way of example, FIG. 2 shows a case where the two pieces D1 and D2 of data are input to the minimum value selection circuit 100 in a step at t=1 shown in FIG. 3.

In FIG. 2, by way of example, a plurality of pieces of data including the pieces D1 and D2 of data (pieces of data constituting one data set) each belong to either one of the two groups (the first group and the second group).

The selection section 101 selects two values from among the pieces D1 and D2 of input data and a first minimum value (a first tentative minimum value) Xmin1 and a second minimum value (a second tentative minimum value) Xmin2 input from the storage section 103 on the basis of a judgment result input from the judgment section 109. The two values to be selected are a new first minimum value (a new first tentative minimum value) Xmin1 which is a smallest value (absolute value) in the first group at a time when D1 and D2 are input and a new second minimum value (a new second tentative minimum value) Xmin2 which is a second smallest value (absolute value). The selection section 101 outputs the two selected values to the storage section 103.

The selection section 102 selects two values from among the pieces D1 and D2 of input data and a first minimum value (a first tentative minimum value) Ymin1 and a second minimum value (a second tentative minimum value) Ymin2 input from the storage section 104 on the basis of a judgment result input from the judgment section 109. The two values to be selected are a new first minimum value (a new first tentative minimum value) Ymin1 which is a smallest value (absolute value) in the second group at the time when D1 and D2 are input and a new second minimum value (a new second tentative minimum value) Ymin2 which is a second smallest value (absolute value). The selection section 102 outputs the two selected values to the storage section 104.

The storage section 103 stores the first minimum value Xmin1 and the second minimum value Xmin2 of the first group input from the selection section 101. More specifically, the first minimum value Xmin1 is stored in a first minimum value storage section 131 while the second minimum value Xmin2 is stored in a second minimum value storage section 132. The storage section 103 also outputs Xmin1 and Xmin2 stored to the selection section 101, the first selection comparison section 107, and the second selection comparison section 108.

The storage section 104 stores the first minimum value Ymin1 and the second minimum value Ymin2 of the second group input from the selection section 102. More specifically, the first minimum value Ymin1 is stored in a first minimum value storage section 141 while the second minimum value Ymin2 is stored in a second minimum value storage section 142. The storage section 104 also outputs Ymin1 and Ymin2 stored to the selection section 102, the first selection comparison section 107, and the second selection comparison section 108.

That is, respective first minimum values and respective second minimum values for a plurality of groups are stored in the storage sections 103 and 104.

The minimum value selection circuit 100 outputs values (Xmin1, Xmin2, Ymin1, and Ymin2) stored in the storage section 103 and the storage section 104 as final first minimum values and final second minimum values of one data set (for example, 16 pieces of data) when processing for the data set is completed. In other words, the storage sections 103 and 104 each update and store a first minimum value and a second minimum value for pieces of data input to the minimum value selection circuit 100 each time a predetermined number of ones (two here) of a plurality of pieces of data are sequentially input.

The round-robin comparison section 105 functions as a first comparator which makes a magnitude comparison among a predetermined number not less than two (a first number) of ones among a plurality of pieces of data each time the pieces of data are sequentially input. The round-robin comparison section 105 makes in parallel (simultaneously makes) magnitude comparisons for all combinations of the predetermined number of pieces of data (D1 and D2 in FIG. 2) input in parallel (in each step). For example, the round-robin comparison section 105 outputs a comparison result C12=1 to the judgment section 109 if D1<D2 and outputs the comparison result C12=0 to the judgment section 109 if D1≥D2. Since the number of pieces of data input in parallel to the minimum value selection circuit 100 is two in FIG. 2, the round-robin comparison section 105 has one comparator 151. For example, if the number of pieces of data input in parallel to the minimum value selection circuit 100 is four, the round-robin comparison section 105 has six comparators.

The operational mode control section 106 indicates to the first selection comparison section 107, the second selection comparison section 108, and the judgment section 109 which one of the operational modes (case 1 to case 4) shown in FIG. 3 an operational mode in the current step is.

The minimum value selection circuit 100 includes selection comparison sections (the first selection comparison section 107 and the second selection comparison section 108 in FIG. 2), the number of which is equal to the number (two in FIG. 2) of pieces of data input to the minimum value selection circuit 100. The selection comparison sections correspond to pieces of data input in parallel. That is, the first selection comparison section 107 and the second selection comparison section 108 function as a plurality of second comparators equal in number to the predetermined number (not less than two) of pieces of data sequentially input among a plurality of pieces of data.

The first selection comparison section 107 and the second selection comparison section 108 each select a first minimum value and a second minimum value of a group, to which a piece of data corresponding to the selection comparison section itself belongs, from the storage section 103 or the storage section 104 and compare the selected first minimum value and the selected second minimum value with the piece of data corresponding to the selection comparison section.

That is, the first selection comparison section 107 is a selection comparison section which compares each of a first minimum value and a second minimum value stored in the storage section 103 or the storage section 104 with the piece D1 of data. The second selection comparison section 108 is a selection comparison section which compares each of a first minimum value and a second minimum value stored in the storage section 103 or the storage section 104 with the piece D2 of data.

The first selection comparison section 107 includes selection sections 171 and 172 and comparators 173 and 174. That is, the first selection comparison section 107 has the first number of comparators.

In the first selection comparison section 107, the selection section 171 selects either one of a first minimum value Xmin1 of the first group input from the storage section 103 and a first minimum value Ymin1 of the second group input from the storage section 104 in accordance with the operational mode told by the operational mode control section 106. Similarly, the selection section 172 selects either one of a second minimum value Xmin2 of the first group input from the storage section 103 and a second minimum value Ymin2 of the second group input from the storage section 104 in accordance with the operational mode told by the operational mode control section 106.

The comparator 173 compares a piece of data (hereinafter denoted by reference character Zmin1) selected by the selection section 171 with the piece D1 of data and outputs a comparison result Cz1 to the judgment section 109. Similarly, the comparator 174 compares a piece of data (hereinafter denoted by reference character Zmin2) selected by the selection section 172 with the piece D1 of data and outputs a comparison result Cz2 to the judgment section 109.

For example, the first selection comparison section 107 outputs the comparison result Cz1 (or Cz2)=1 if Zmin1 (or Zmin2)<D1 and outputs the comparison result Cz1 (or Cz2)=0 if Zmin1 (or Zmin2)≥D1.

FIGS. 4A and 4B show examples of the operation of the first selection comparison section 107.

FIG. 4A shows the operation of the first selection comparison section 107 when the first selection comparison section 107 is told by the operational mode control section 106 that the operational mode is case 1 or case 3, and FIG. 4B shows the operation of the first selection comparison section 107 when the first selection comparison section 107 is told by the operational mode control section 106 that the operational mode is case 2 or case 4.

If the operational mode is case 1 or case 3, as shown in FIG. 4A, the selection section 171 selects Xmin1 as Zmin1, and the selection section 172 selects Xmin2 as Zmin2. The comparator 173 compares Xmin1 with the piece D1 of data, and the comparator 174 compares Xmin2 with the piece D1 of data.

If the operational mode is case 2 or case 4, as shown in FIG. 4B, the selection section 171 selects Ymin1 as Zmin1, and the selection section 172 selects Ymin2 as Zmin2. The comparator 173 compares Ymin1 with the piece D1 of data, and the comparator 174 compares Ymin2 with the piece D1 of data.

Referring back to FIG. 2, the second selection comparison section 108 includes selection sections 181 and 182 and comparators 183 and 184. That is, the second selection comparison section 108 has the first number of comparators. For this reason, the selection comparison sections 107 and 108 have a second number (twice the first number) of comparators 173, 174, 183, and 184.

In the second selection comparison section 108, the selection section 181 selects either one of the first minimum value Xmin1 of the first group input from the storage section 103 and the first minimum value Ymin1 of the second group input from the storage section 104 in accordance with the operational mode told by the operational mode control section 106. Similarly, the selection section 182 selects either one of the second minimum value Xmin2 of the first group input from the storage section 103 and the second minimum value Ymin2 of the second group input from the storage section 104 in accordance with the operational mode told by the operational mode control section 106.

The comparator 183 compares a pieces of data (hereinafter denoted by reference character Wmin1) selected by the selection section 181 with the piece D2 of data and outputs a comparison result Cw1 to the judgment section 109. Similarly, the comparator 184 compares a pieces of data (hereinafter denoted by reference character Wmin2) selected by the selection section 182 with the piece D2 of data and outputs a comparison result Cw2 to the judgment section 109.

For example, the second selection comparison section 108 outputs the comparison result Cw1 (or Cw2)=1 if Wmin1 (or Wmin2)<D2 and outputs the comparison result Cw1 (or Cw2)=0 if Wmin1 (or Wmin2)≥D2.

Figure 5A:
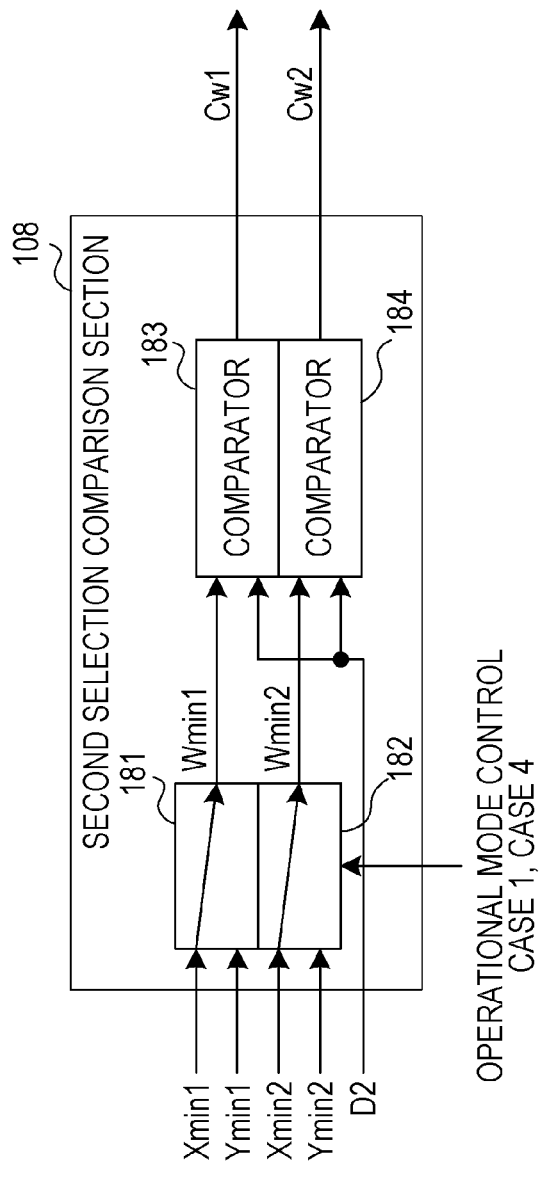
FIG. 5A shows the operation of a second selection comparison section in case 1 or case 4 according to the first embodiment.
Figure 5B:
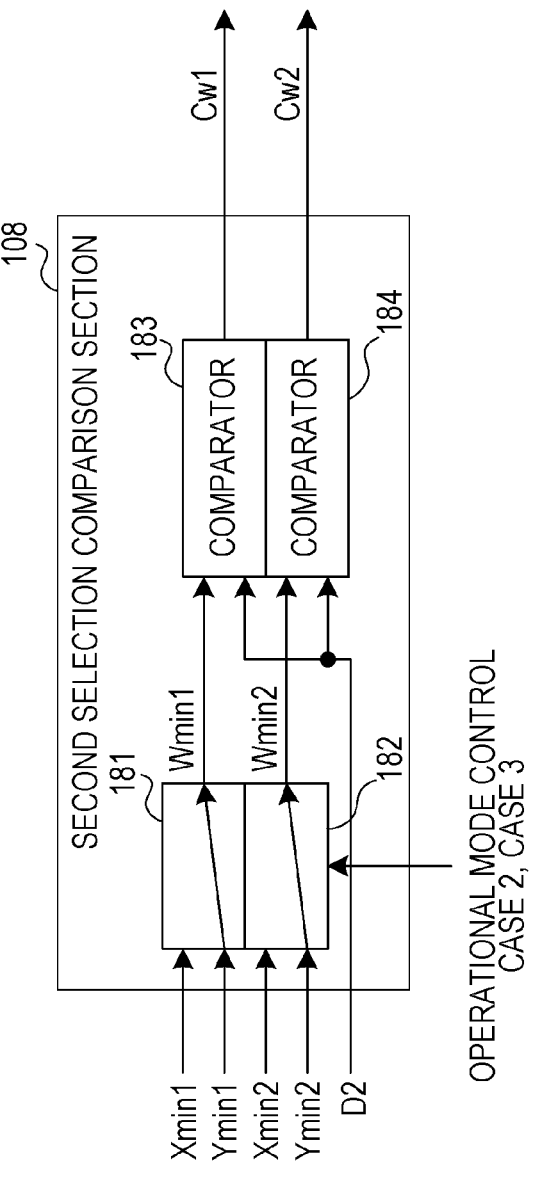
FIG. 5B shows the operation of the second selection comparison section in case 2 or case 3 according to the first embodiment.

FIGS. 5A and 5B show examples of the operation of the second selection comparison section 108.

FIG. 5A shows the operation of the second selection comparison section 108 when the second selection comparison section 108 is told by the operational mode control section 106 that the operational mode is case 1 or case 4, and FIG. 5B shows the operation of the second selection comparison section 108 when the second selection comparison section 108 is told by the operational mode control section 106 that the operational mode is case 2 or case 3.

If the operational mode is case 1 or case 4, as shown in FIG. 5A, the selection section 181 selects Xmin1 as Wmin1, and the selection section 182 selects Xmin2 as Wmin2. The comparator 183 compares Xmin1 with the piece D2 of data, and the comparator 184 compares Xmin2 with the piece D2 of data.

If the operational mode is case 2 or case 3, as shown in FIG. 5B, the selection section 181 selects Ymin1 as Wmin1, and the selection section 182 selects Ymin2 as Wmin2. The comparator 183 compares Ymin1 with the piece D2 of data, and the comparator 184 compares Ymin2 with the piece D2 of data.

Referring back to FIG. 2, the judgment section 109 judges values, with which a first minimum value (Xmin1 or Ymin1) and a second minimum value (Xmin2 or Ymin2) stored in the storage section 103 or the storage section 104 are to be updated, on the basis of the operational mode input from the operational mode control section 106, the comparison result C12 input from the round-robin comparison section 105, the comparison results Cz1 and Cz2 input from the first selection comparison section 107, and the comparison results Cw1 and Cw2 input from the second selection comparison section 108.

That is, the judgment section 109 judges a new first minimum value and a new second minimum value to be stored in the storage section 103 or the storage section 104 among the pieces D1 and D2 of data and the first minimum value and the second minimum value stored in the storage section 103 or the storage section 104.

FIGS. 6A to 6D show truth tables (comparison result patterns) representing the operation of the judgment section 109. FIGS. 6A to 6D show truth tables in case 1 to case 4, respectively.

Note that an impossible condition (an impossible combination of comparison results) in the minimum value selection circuit 100 is not included in the truth tables shown in FIGS. 6A to 6D. A case where a pattern of comparison results (Cz1, Cz2, Cw1, Cw2, and C12) is (0,1,1,1,1) that is one example of the impossible condition corresponds to a case where Xmin1≥D1 and Xmin2<D1 hold. That is, the relation Xmin1≥D1>Xmin2 holds, which contradicts the relation between a first minimum value (Xmin1) and a second minimum value (Xmin2). Thus, the combination (0,1,1,1,1) is an impossible condition in the minimum value selection circuit 100.

In FIGS. 6C and 6D, the symbol * denotes a value which does not affect an output result (don't care).

In case 1 (FIG. 6A), Xmin1 and Xmin2 stored in the storage section 103 are objects to be updated, and Ymin1 and Ymin2 stored in the storage section 104 are not updated.

For example, if a pattern of comparison results (Cz1, Cz2, Cw1, Cw2, and C12) is (0,0,0,0,0) (condition No. 12 shown in FIG. 6A), the judgment section 109 sets the piece D2 of input data as new Xmin1 and the piece D1 of input data as new Xmin2 and outputs a judgment result to the selection section 101.

More specifically, in case 1, if Cz1=0, Xmin1≥D1 holds. If Cz2=0, Xmin2≥D1 holds. If Cw1=0, Xmin1≥D2 holds. If Cw2=0, Xmin2≥D2 holds. If C12=0, D1≥D2 holds. As for D1, D2, Xmin1, and Xmin2, the relation Xmin2>Xmin1≥D1≥D2 holds. Thus, the judgment section 109 judges D2 and D1 as new Xmin1 and new Xmin2.

Similarly, if a pattern of comparison results (Cz1, Cz2, Cw1, Cw2, and C12) is (1,1,1,1,1) (condition No. 1 shown in FIG. 6A), the judgment section 109 sets Xmin1 as new Xmin1 and Xmin2 as new Xmin2 and outputs a judgment result to the selection section 101.

More specifically, in case 1, if Cz1=1, Xmin1<D1 holds. If Cz2=1, Xmin2<D1 holds. If Cw1=1, Xmin1<D2 holds. If Cw2=1, Xmin2<D2 holds. If C12=1, D1<D2 holds. As for D1, D2, Xmin1, and Xmin2, the relation D2>D1>Xmin2>Xmin1 holds. Thus, the judgment section 109 judges Xmin1 and Xmin2 as new Xmin1 and new Xmin2.

Note that if Xmin1 and Xmin2 stored in the storage section 103 are not to be updated, the judgment section 109 may negate an update instruction (enable signal) to the storage section 103. If Ymin1 and Ymin2 stored in the storage section 104 are not to be updated, the judgment section 109 may negate an update instruction (enable signal) to the storage section 104. In this case, the storage section 103 or the storage section 104 may use a flip-flop with enable, a flip-flop with clock enable, a RAM with write enable, or the like.

The judgment section 109 similarly judges a new first minimum value (Xmin1 or Ymin1) and a new second minimum value (Xmin2 or Ymin2) for other condition numbers of case 1 and case 2 to case 4.

Note that, in case 2 (FIG. 6B), Ymin1 and Ymin2 stored in the storage section 104 are objects to be updated and that Xmin1 and Xmin2 stored in the storage section 103 are not updated.

In case 3 (FIG. 6C), pieces of data as objects to be updated in the storage section 103 are determined by the values of the comparison results Cz1 and Cz2 (that is, results of comparison between D1 and the first group) (condition Nos. Z1 to Z3), and pieces of data as objects to be updated in the storage section 104 are determined by the values of the comparison results Cw1 and Cw2 (that is, results of comparison between D2 and the second group) (condition Nos. W1 to W3).

For example, if a pattern of comparison results (Cz1, Cz2, Cw1, Cw2, and C12) is (0,0,0,0,0) (condition Nos. Z3 and W3 shown in FIG. 6C), the judgment section 109 sets the piece D1 of input data as new Xmin1 and Xmin1 stored in the storage section 103 as new Xmin2 and outputs a judgment result to the selection section 101. The judgment section 109 sets the piece D2 of input data as new Ymin1 and Ymin1 stored in the storage section 104 as new Ymin2 and outputs a judgment result to the selection section 102.

In case 4 (FIG. 6D), pieces of data as objects to be updated in the storage section 104 are determined by the values of the comparison results Cz1 and Cz2 (that is, results of comparison between D1 and the second group) (condition Nos. Z1 to Z3), and pieces of data as objects to be updated in the storage section 103 are determined by the values of the comparison results Cw1 and Cw2 (that is, results of comparison between D2 and the first group) (condition Nos. W1 to W3).

As described above, in the present embodiment, the minimum value selection circuit 100 includes input terminals which accept a plurality of data inputs (two data inputs in FIG. 2) and the round-robin comparison section 105 that makes a magnitude comparison among pieces of input data in a round-robin manner. The minimum value selection circuit 100 is provided with selection comparison sections (the first selection comparison section 107 and the second selection comparison section 108 in FIG. 2), the number of which is equal to the number of pieces of data to be input.

In the minimum value selection circuit 100, the first selection comparison section 107 and the second selection comparison section 108 each select either one of sets, each having a first minimum value and a second minimum value, stored in the storage section 103 and the storage section 104 on the basis of the operational mode (that is, a way of data grouping) and compare each of the selected first minimum value and the selected second minimum value with a piece of input data.

For this reason, the minimum value selection circuit 100 can obtain a first minimum value and a second minimum value among pieces of data sequentially input for each of a plurality of groups (the first group and the second group). Even if a group, to which each of a plurality of pieces of data to be input to the minimum value selection circuit 100 belongs, changes from moment to moment, the minimum value selection circuit 100 can obtain a first minimum value and a second minimum value for each of the plurality of groups.

The minimum value selection circuit 100 selects a first minimum value and a second minimum value serving as objects to be compared with a piece of input data and does not select a piece of data serving as an object to be compared among pieces of input data. This avoids lengthening a critical path among input data paths and allows implementation of high-speed operation.

The minimum value selection circuit 100 can judge a first minimum value and a second minimum value by comparison results from the first selection comparison section 107 or the second selection comparison section 108 for case 3 (FIG. 6C) and case 4 (FIG. 6D). The minimum value selection circuit 100 further includes the round-robin comparison section 105 and can also judge a first minimum value and a second minimum value on the basis of a pattern of comparison results from the first selection comparison section 107, the second selection comparison section 108, and the round-robin comparison section 105 for case 1 (FIG. 6A) and case 2 (FIG. 6B).

In U.S. Pat. No. 8,234,320, it is difficult to perform minimum value selection processing before all pieces of data (for example, 16 pieces of data in FIG. 1) are input. In contrast, in the present embodiment, the minimum value selection circuit 100 can perform minimum value selection processing at a time when some of all pieces of data are sequentially input and can execute processing each time pieces of data are input.

In the present embodiment, in the minimum value selection circuit 100, the round-robin comparison section 105 and the first and second selection comparison sections 107 and 108 are arranged in parallel. That is, the round-robin comparison section 105, the first selection comparison section 107, and the second selection comparison section 108 can perform processing in parallel.

For this reason, the minimum value selection circuit 100 can perform the process of selecting (judging) a first minimum value and a second minimum value at high speed. For example, if the minimum value selection circuit 100 is implemented as a circuit, such as an LSI, the critical path can be shortened, and operation clock frequency can be increased. The minimum value selection circuit 100 can perform the process of selecting a first minimum value and a second minimum value at high speed.

For example, in U.S. Pat. No. 8,234,320, a certain selection section performs selection processing on the basis of a comparison result from a different comparator (a comparator in an upstream selection section) (see FIG. 1), and high-speed operation is difficult due to delays in a plurality of comparators. In contrast, in the present embodiment, the comparators (151, 173, 174, 183, and 184) included in the minimum value selection circuit 100 are arranged in parallel, and comparison processing is performed using pieces (D1 and D2 in FIG. 2) of input data and values (Xmin1 and Xmin2) stored in the storage section 103 or values (Ymin1 and Ymin2) stored in the storage section 104. That is, the comparators included in the minimum value selection circuit 100 do not perform processing using a comparison result from a different comparator. The minimum value selection circuit 100 has a reduced delay caused by operations of the plurality of comparators and is capable of high-speed operation.

In the present embodiment, the number of comparators needed to select a first minimum value and a second minimum value in the minimum value selection circuit 100 can be reduced. More specifically, the minimum value selection circuit 100 does not compare the pieces D1 and D2 of input data, Xmin1 and Xmin2 stored in the storage section 103, and Ymin1 and Ymin2 stored in the storage section 104 in a round-robin manner. Instead, the minimum value selection circuit 100 compares D1 and D2 in a round-robin manner and selects values serving as objects to be compared from among values stored in the storage section 103 or the storage section 104 in the first selection comparison section 107 and the second selection comparison section 108, thereby reducing the number of times of comparison processing.

For example, the method of performing round-robin comparison of D1, D2, Xmin1, Xmin2, Ymin1, and Ymin2 except round-robin comparison of Xmin1, Xmin2, Ymin1, and Ymin2 is conceivable as a comparison method apparent to those skilled in the art. This case needs nine comparators. In contrast, if processing is performed for each two pieces of input data, the minimum value selection circuit 100 according to the present embodiment can be constructed using five comparators (151, 173, 174, 183, and 184).

As described above, the present embodiment allows a reduction in processing delay, circuit scale, and power consumption.

(Second Embodiment)

The first embodiment has described a case where two pieces of data are input and processed each time. In contrast, the present embodiment will describe a case where four pieces of data are input and processed each time.

FIG. 7A and FIG. 7B are a block diagram showing the configuration of a minimum value selection circuit according to the present embodiment. Components in FIG. 7A and FIG. 7B which perform the same processes as those in the first embodiment (FIG. 2) are denoted by the same reference characters, and a description thereof will be omitted.

Figure 8:
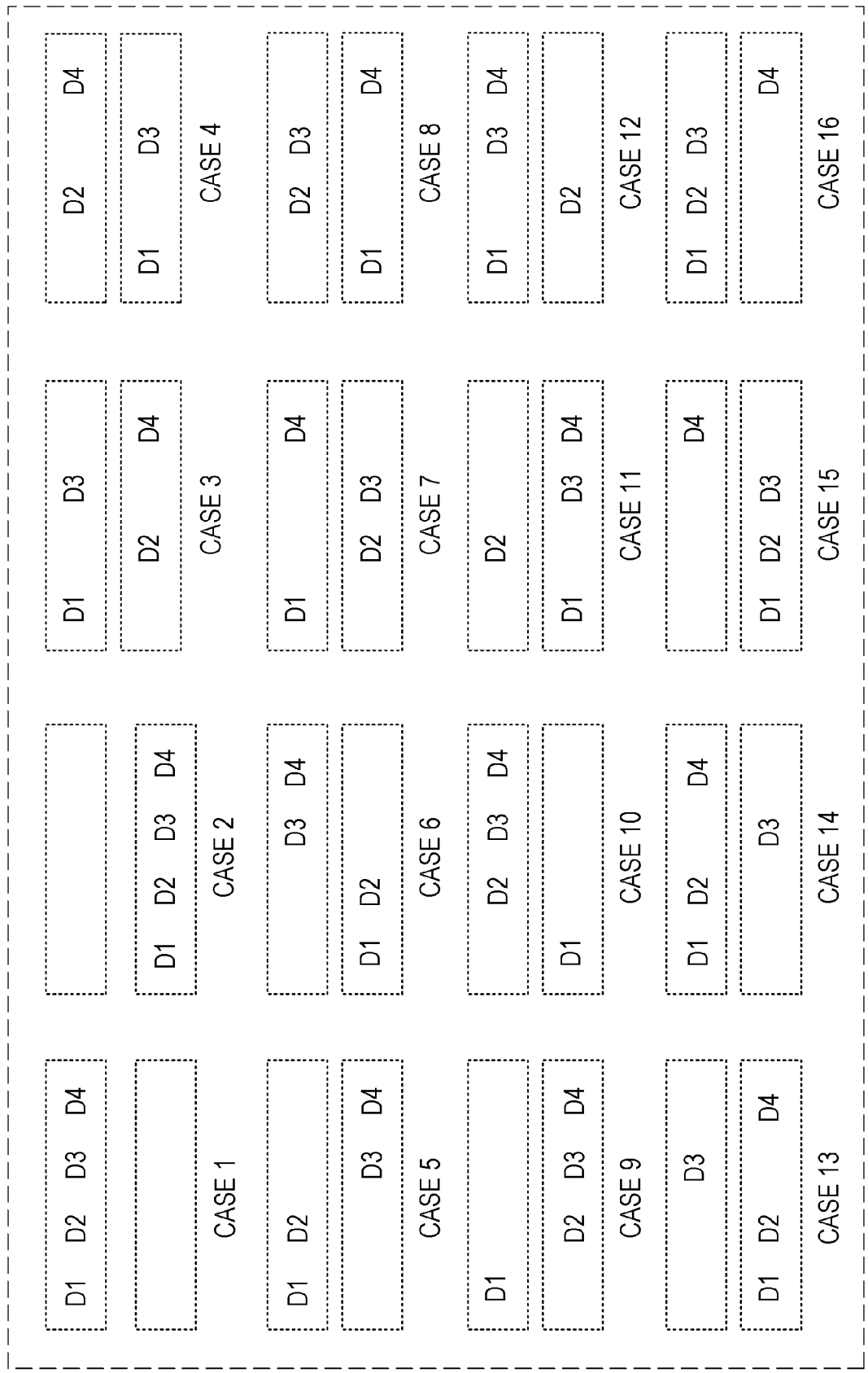
FIG. 8 shows one example of operational modes according to the second embodiment.

In the description below, a minimum value selection circuit 200 according to the present embodiment has 16 operational modes (case 1 to case 16) shown in FIG. 8. Note that case 1 to case 16 shown in FIG. 8 present ways of data grouping in one step (clock cycle). The ways of grouping in case 1 to case 4 shown in FIG. 8 are the same as ways of grouping in two steps (t=1 and 2) in case 1 to case 4 illustrated in the first embodiment (FIG. 3).

Note that, if the minimum value selection circuit 200 is used as a part of an LDPC decoder (to be described later in a fifth embodiment), the minimum value selection circuit 200 need not support all the operational modes shown in FIG. 8 in some cases, depending on the configurations of a parity check matrix and the decoder.

The minimum value selection circuit 200 shown in FIG. 7A and FIG. 7B includes selection sections 101 and 102, storage sections 103 and 104, a round-robin comparison section 201, an operational mode control section 106, a first selection comparison section 202, a second selection comparison section 203, a third selection comparison section 204, a fourth selection comparison section 205, and a judgment section 206.

The round-robin comparison section 201 makes in parallel (simultaneously makes) magnitude comparisons for all combinations of a predetermined number of pieces of data (D1 to D4 in FIG. 7A and FIG. 7B) input in parallel (in each step). Since the round-robin comparison section 201 performs processing on each input four pieces of data, the round-robin comparison section 201 has six (=(4×3)/(2×1)) comparators in FIG. 7A.

For example, the round-robin comparison section 201 outputs a comparison result C12=1 if D1<D2 and outputs the comparison result C12=0 if D1≥D2. Similarly, the round-robin comparison section 201 outputs a comparison result C13=1 if D1<D3 and outputs the comparison result C13=0 if D1≥D3. The round-robin comparison section 201 outputs a comparison result C23=1 if D2<D3 and outputs the comparison result C23=0 if D2≥D3. The round-robin comparison section 201 outputs a comparison result C14=1 if D1<D4 and outputs the comparison result C14=0 if D1≥D4. The round-robin comparison section 201 outputs a comparison result C24=1 if D2<D4 and outputs the comparison result C24=0 if D2≥D4. The round-robin comparison section 201 outputs a comparison result C34=1 if D3<D4 and outputs the comparison result C34=0 if D3≥D4.

That is, the comparison results C12, C13, C14, C23, C24, and C34 show the magnitude relations among the pieces D1 to D4 of data.

The operational mode control section 106 tells the first selection comparison section 202, the second selection comparison section 203, the third selection comparison section 204, the fourth selection comparison section 205, and the judgment section 206 which one of the operational modes (case 1 to case 16) shown in FIG. 8 an operational mode in the current step is.

The minimum value selection circuit 200 is provided with the selection comparison sections 202, 203, 204, and 205, the number of which is equal to the number of pieces of data input to the minimum value selection circuit 200. The selection comparison sections 202, 203, 204, and 205 correspond to pieces of data to be input. More specifically, the first selection comparison section 202 corresponds to the piece D1 of data, the second selection comparison section 203 corresponds to the piece D2 of data, the third selection comparison section 204 corresponds to the piece D3 of data, and the fourth selection comparison section 205 corresponds to the piece D4 of data.

The first selection comparison section 202, the second selection comparison section 203, the third selection comparison section 204, and the fourth selection comparison section 205 each select a first minimum value and a second minimum value of a group, to which a piece of data corresponding to the selection comparison section itself belongs, from the storage section 103 or the storage section 104 and compare the selected first minimum value and the selected second minimum value with the piece (one of D1 to D4) of input data corresponding to the selection comparison section.

The first selection comparison section 202, the second selection comparison section 203, the third selection comparison section 204, and the fourth selection comparison section 205 each include two selection sections and two comparators. Note that the operations of the selection sections and the comparators are the same as those of the selection sections and the comparators of the first selection comparison section 107 and the second selection comparison section 108 in the first embodiment.

FIGS. 9A to 12B show examples of the operations of the first selection comparison section 202 to the fourth selection comparison section 205.

The first selection comparison section 202 selects Xmin1 and Xmin2 in case 1, case 3, case 5, case 7, case 9, case 12, case 14, or case 16 (FIG. 9A) and selects Ymin1 and Ymin2 in case 2, case 4, case 6, case 8, case 10, case 11, case 13, or case 15 (FIG. 9B). The first selection comparison section 202 compares each of selected values Zmin1 and Zmin2 with D1 and outputs comparison results Cz1 and Cz2 to the judgment section 206.

Figure 10A:
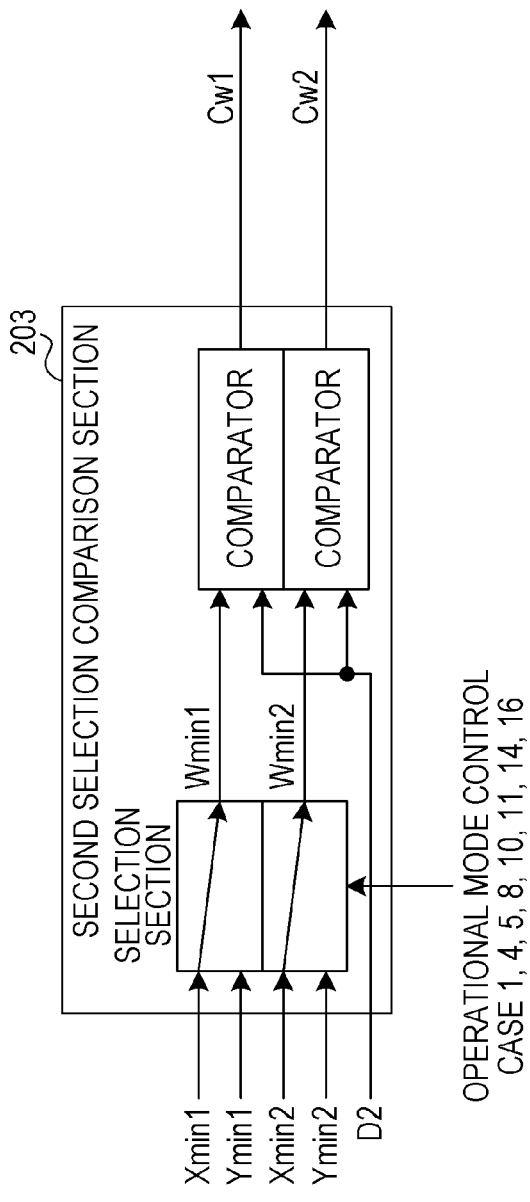
FIG. 10A shows the operation of a second selection comparison section in case 1, case 4, case 5, case 8, case 10, case 11, case 14, or case 16 according to the second embodiment.
Figure 10B:
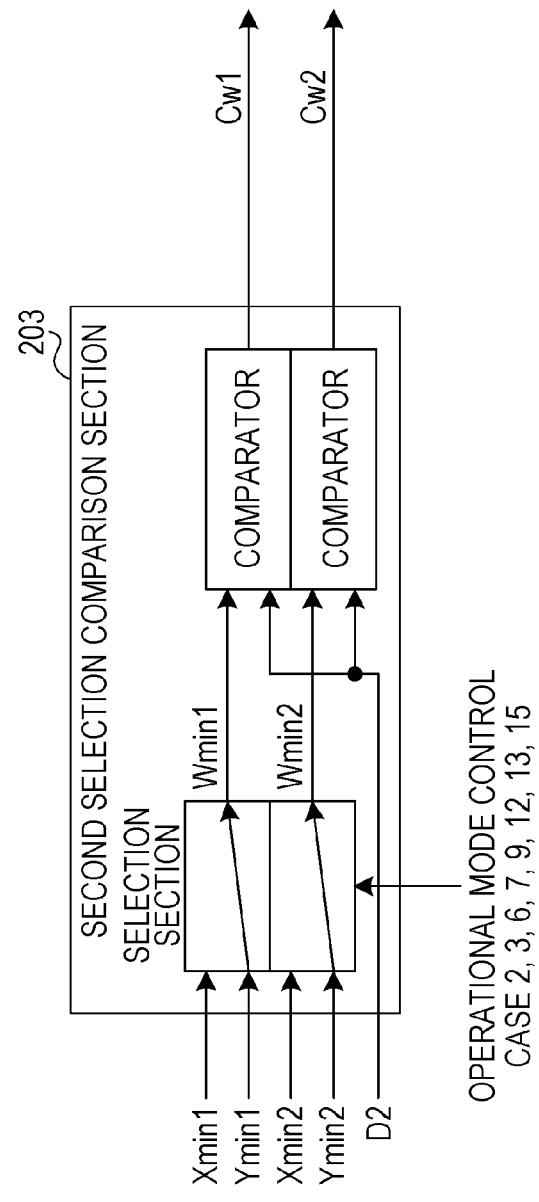
FIG. 10B shows the operation of the second selection comparison section in case 2, case 3, case 6, case 7, case 9, case 12, case 13, or case 15 according to the second embodiment.

The second selection comparison section 203 selects Xmin1 and Xmin2 in case 1, case 4, case 5, case 8, case 10, case 11, case 14, or case 16 (FIG. 10A) and selects Ymin1 and Ymin2 in case 2, case 3, case 6, case 7, case 9, case 12, case 13, or case 15 (FIG. 10B). The second selection comparison section 203 compares each of selected values Wmin1 and Wmin2 with D2 and outputs comparison results Cw1 and Cw2 to the judgment section 206.

Figure 11A:
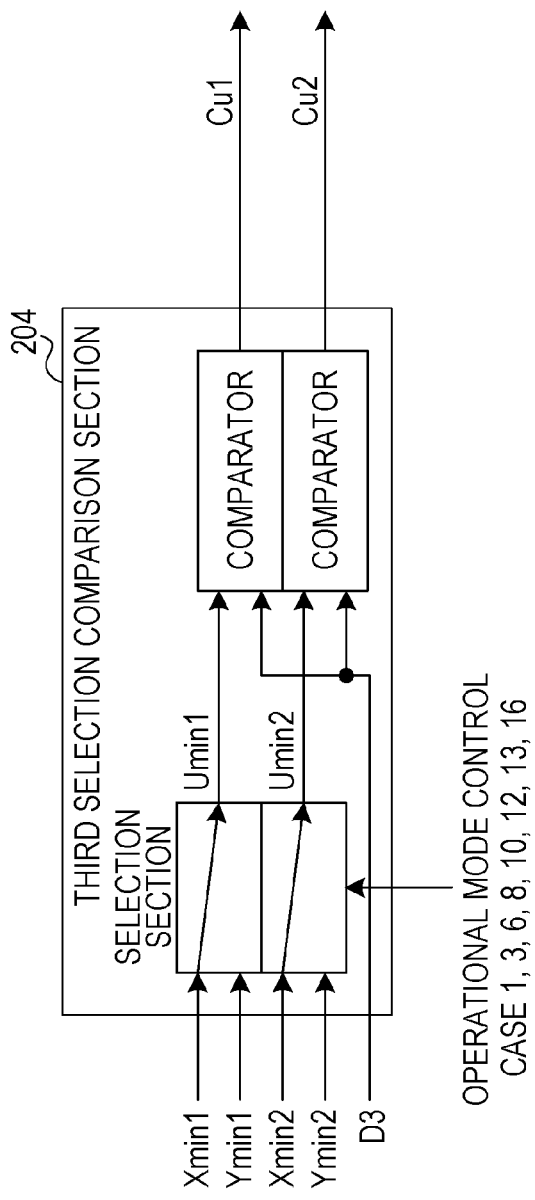
FIG. 11A shows the operation of a third selection comparison section in case 1, case 3, case 6, case 8, case 10, case 12, case 13, or case 16 according to the second embodiment.
Figure 11B:
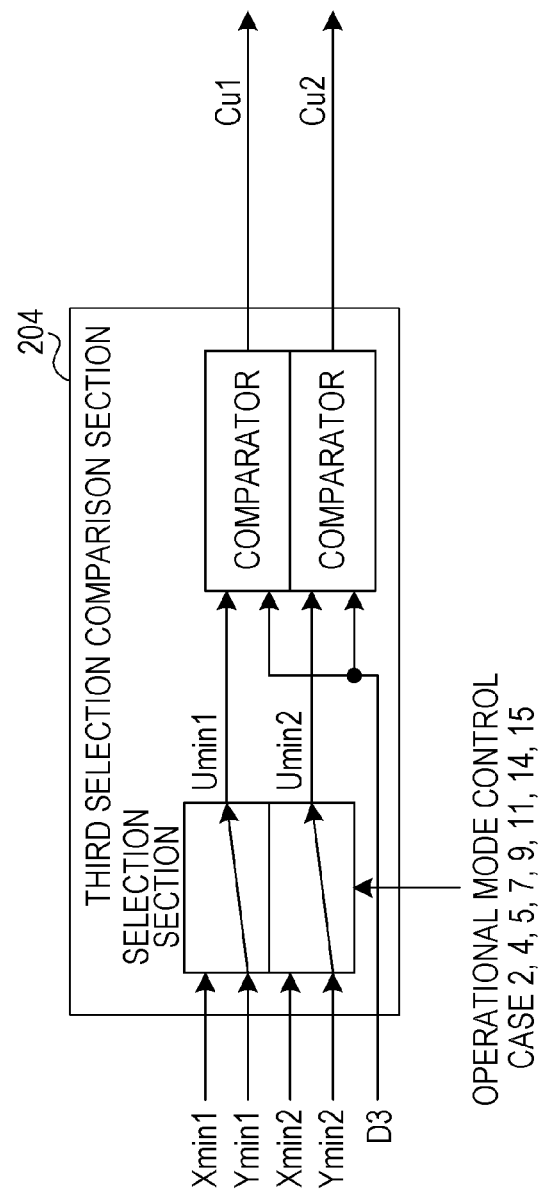
FIG. 11B shows the operation of the third selection comparison section in case 2, case 4, case 5, case 7, case 9, case 11, case 14, or case 15 according to the second embodiment.

The third selection comparison section 204 selects Xmin1 and Xmin2 in case 1, case 3, case 6, case 8, case 10, case 12, case 13, or case 16 (FIG. 11A) and selects Ymin1 and Ymin2 in case 2, case 4, case 5, case 7, case 9, case 11, case 14, or case 15 (FIG. 11B). The third selection comparison section 204 compares each of selected values Umin1 and Umin2 with D3 and outputs comparison results Cu1 and Cu2 to the judgment section 206.

Figure 12A:
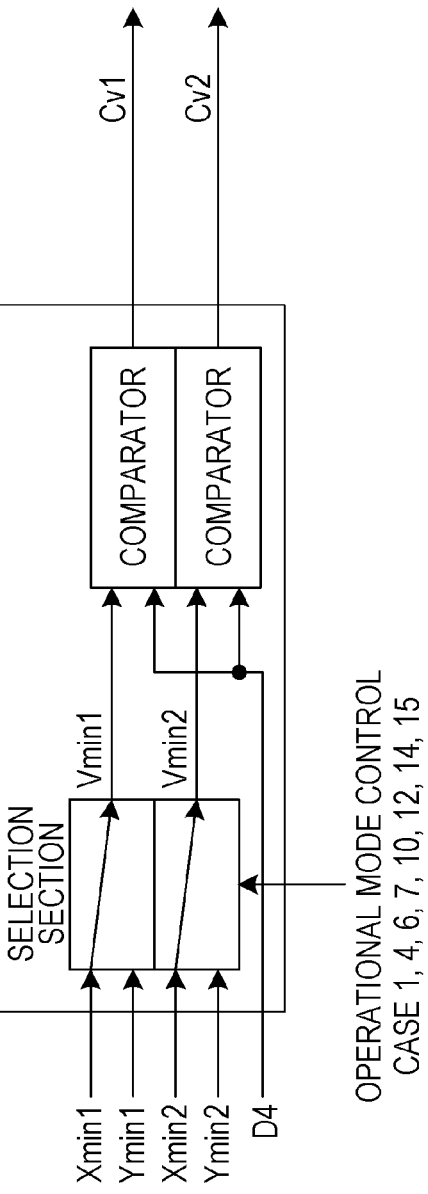
FIG. 12A shows the operation of a fourth selection comparison section in case 1, case 4, case 6, case 7, case 10, case 12, case 14, or case 15 according to the second embodiment.
Figure 12B:
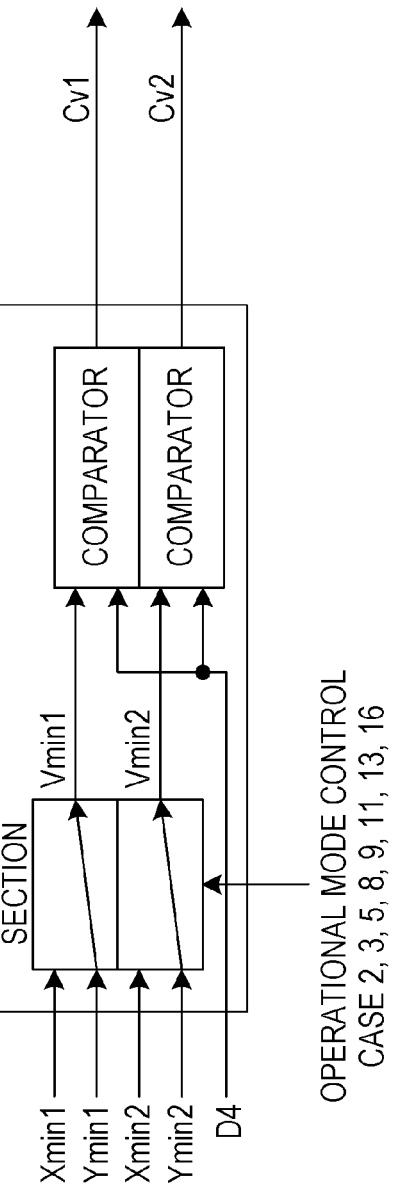
FIG. 12B shows the operation of the fourth selection comparison section in case 2, case 3, case 5, case 8, case 9, case 11, case 13, or case 16 according to the second embodiment.

The fourth selection comparison section 205 selects Xmin1 and Xmin2 in case 1, case 4, case 6, case 7, case 10, case 12, case 14, or case 15 (FIG. 12A) and selects Ymin1 and Ymin2 in case 2, case 3, case 5, case 8, case 9, case 11, case 13, or case 16 (FIG. 12B). The fourth selection comparison section 205 compares each of selected values Vmin1 and Vmin2 with D4 and outputs comparison results Cv1 and Cv2 to the judgment section 206.

That is, the comparison results Cz1, Cz2, Cw1, Cw2, Cu1, Cu2, Cv1, and Cv2 show the magnitude relations between the pieces D1 to D4 of data and first minimum values and second minimum values.

Referring back to FIG. 7B, the judgment section 206 judges values, with which a first minimum value (Xmin1 or Ymin1) and a second minimum value (Xmin2 or Ymin2) stored in the storage section 103 or the storage section 104 are to be updated, on the basis of a pattern of the operational mode input from the operational mode control section 106, the comparison results input from the round-robin comparison section 201, and the comparison results input from the first selection comparison section 202 to the fourth selection comparison section 205.

That is, the judgment section 206 judges a new first minimum value and a new second minimum value to be stored in the storage section 103 or the storage section 104 among the pieces D1 to D4 of data and the first minimum value and the second minimum value stored in the storage section 103 or the storage section 104.

FIGS. 13A to 17B show examples of a truth table (pattern) representing the operation of the judgment section 206.

FIG. 13A shows a truth table in case 1, FIG. 13B shows a truth table in case 2, FIG. 14A shows a truth table in case 3, FIG. 14B shows a truth table in case 4, FIG. 15A shows a truth table in case 5, FIG. 15B shows a truth table in case 6, FIG. 16A shows a truth table in case 9, FIG. 16B shows a truth table in case 10, FIG. 17A shows a truth table in case 11, and FIG. 17B shows a truth table in case 12.

In FIGS. 13A and 13B, any one of conditions is selected. A blank or the symbol * denotes don't care. In FIGS. 14A to 15B, one of conditions with condition numbers starting with the letter A and one of conditions with condition numbers starting with the letter B are selected. A blank box or a box with a diagonal line across the box (in columns for C12, C14, C23, and C34 in FIGS. 14A and 14B) means don't care. If a combination of inputs applies to a plurality of conditions, one with a smallest condition number is selected. For example, if inputs (Cz1, Cz2, Cw1, Cw2, Cu1, Cu2, Cv1, Cv2, C13, and C24) are all 1 in case 3 (FIG. 14A), the combination of inputs applies to conditions with condition Nos. A3-1 and A3-2 and B3-1 and B3-2. The conditions with condition Nos. A3-1 and B3-1 are selected, and Xmin1, Xmin2, Ymin1, and Ymin2 are selected as outputs.

Note that FIGS. 13A to 17B illustrate operational modes used in the IEEE 802.11 ad standard by way of example and that unused operational modes are omitted.

The judgment section 206 judges a new first minimum value (Xmin1 or Ymin1) and a new second minimum value (Xmin2 or Ymin2) on the basis of the comparison results in case 1 to case 16.

As described above, in the present embodiment, the minimum value selection circuit 200 includes input terminals which accept in parallel a plurality of data inputs (four data inputs in FIG. 7A) and the round-robin comparison section 201 that makes a magnitude comparison among pieces of input data in a round-robin manner. The minimum value selection circuit 200 is also provided with four selection comparison sections, the number of which is equal to the number of pieces of data to be input in parallel.

In the minimum value selection circuit 200, the first selection comparison section 202 to the fourth selection comparison section 205 each select either one of sets, each having a first minimum value and a second minimum value, stored in the storage section 103 or the storage section 104 on the basis of the operational mode and compare the selected first minimum value and the selected second minimum value with a corresponding one of pieces of input data.

For this reason, the minimum value selection circuit 200 can obtain a first minimum value and a second minimum value among pieces of data sequentially input for each of a plurality of groups (the first group and the second group). Even if a group, to which each of a plurality of pieces of data to be input to the minimum value selection circuit 200 belongs, changes from moment to moment, the minimum value selection circuit 200 can obtain a first minimum value and a second minimum value for each of the plurality of groups.

The minimum value selection circuit 200 selects a first minimum value and a second minimum value serving as objects to be compared with a piece of input data and does not select a piece of data serving as an object to be compared among pieces of input data. This avoids lengthening a critical path among input data paths and allows implementation of high-speed operation.

In the present embodiment, the minimum value selection circuit 200 can perform minimum value selection processing at a time when some of all pieces of data are input and can sequentially execute processing each time pieces of data are input, as in the first embodiment.

In the present embodiment, in the minimum value selection circuit 200, the round-robin comparison section 201 and the first to fourth selection comparison sections 202 to 205 are arranged in parallel.

For this reason, the minimum value selection circuit 200 can perform the process of selecting (judging) a first minimum value and a second minimum value at high speed. For example, if the minimum value selection circuit 200 is implemented as a circuit, such as an LSI, the critical path can be shortened, and operation clock frequency can be increased. The minimum value selection circuit 200 can perform the process of selecting a first minimum value and a second minimum value at high speed.

The present embodiment is larger in the number of pieces of data to be input (higher in the degree of parallelism) than the first embodiment. The comparators included in the minimum value selection circuit 200, however, do not perform processing based on a comparison result from a different comparator, as in the first embodiment. For this reason, the minimum value selection circuit 200 has no operation resulting from delays in the comparators. That is, in the minimum value selection circuit 200, the number of tiers of comparators is one, and the critical path is short. The minimum value selection circuit 200 can implement high-speed operation.

In the present embodiment, the number of comparators needed to select a first minimum value and a second minimum value in the minimum value selection circuit 200 can be reduced. More specifically, the minimum value selection circuit 200 does not compare the pieces D1 to D4 of input data, Xmin1 and Xmin2 stored in the storage section 103, and Ymin1 and Ymin2 stored in the storage section 104 in a round-robin manner. Instead, the minimum value selection circuit 200 compares D1 to D4 in a round-robin manner and selects values serving as objects to be compared in the first selection comparison section 202 to the fourth selection comparison section 205.

For example, the method of performing round-robin comparison of D1, D2, D3, D4, Xmin1, Xmin2, Ymin1, and Ymin2 except round-robin comparison of Xmin1, Xmin2, Ymin1, and Ymin2 is conceivable as a comparison method apparent to those skilled in the art. A minimum value selection circuit in this case is configured to use 22 comparators. In contrast, the minimum value selection circuit 200 shown in FIG. 7A can be constructed using 14 comparators.

As described above, the present embodiment allows a reduction in processing delay, circuit scale, and power consumption in a minimum value selection circuit.

(Third Embodiment)

The present embodiment will describe a case where minimum value selection circuits as described in the first embodiment are cascaded.

FIG. 18 is a block diagram showing the configuration of a minimum value selection circuit according to the present embodiment.

A minimum value selection circuit 300 shown in FIG. 18 includes a preprocessing section 301 and a minimum value selection section 302.

Figure 19:
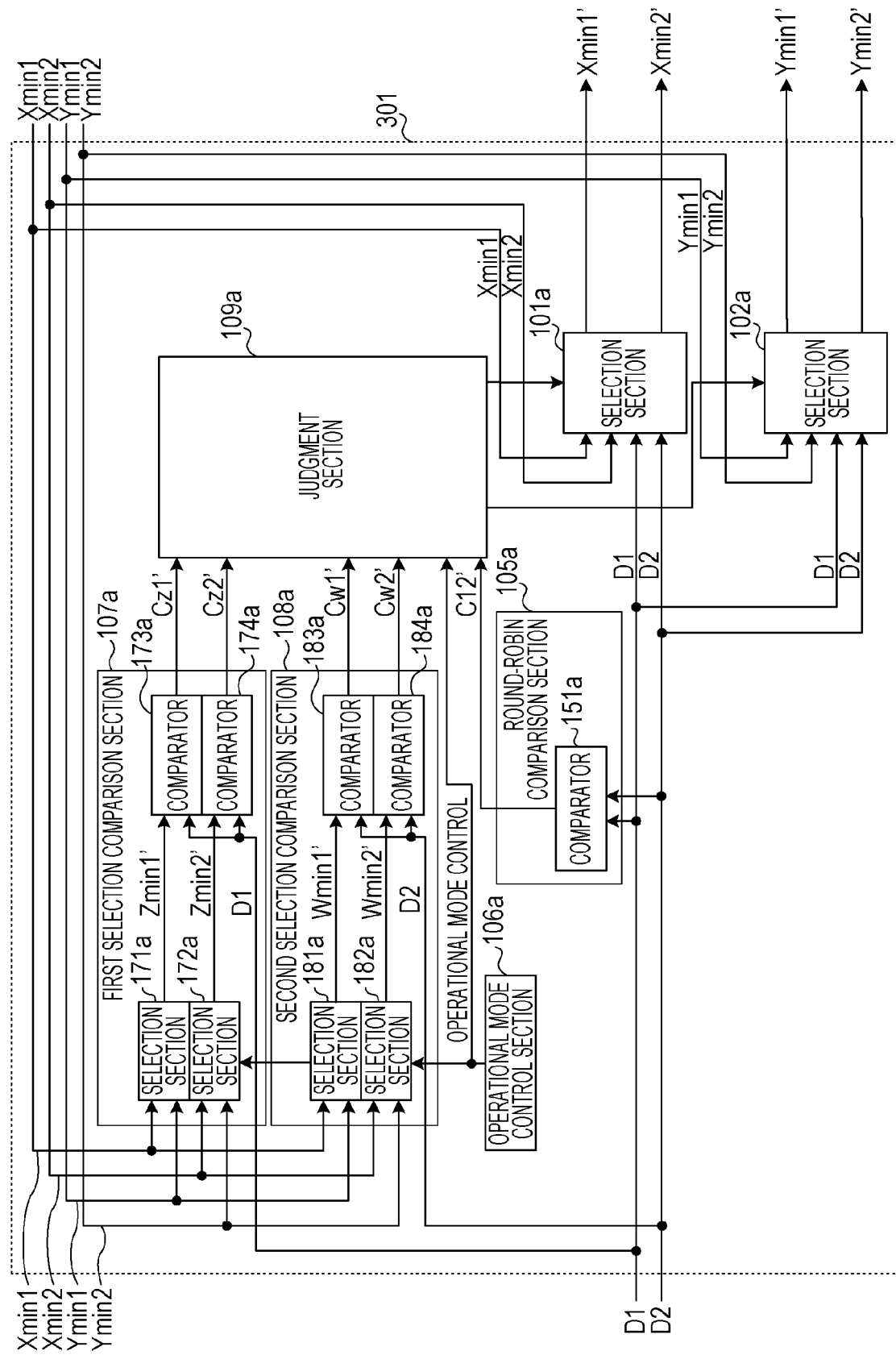
FIG. 19 shows constituent blocks of a preprocessing section according to the third embodiment.
Figure 20:
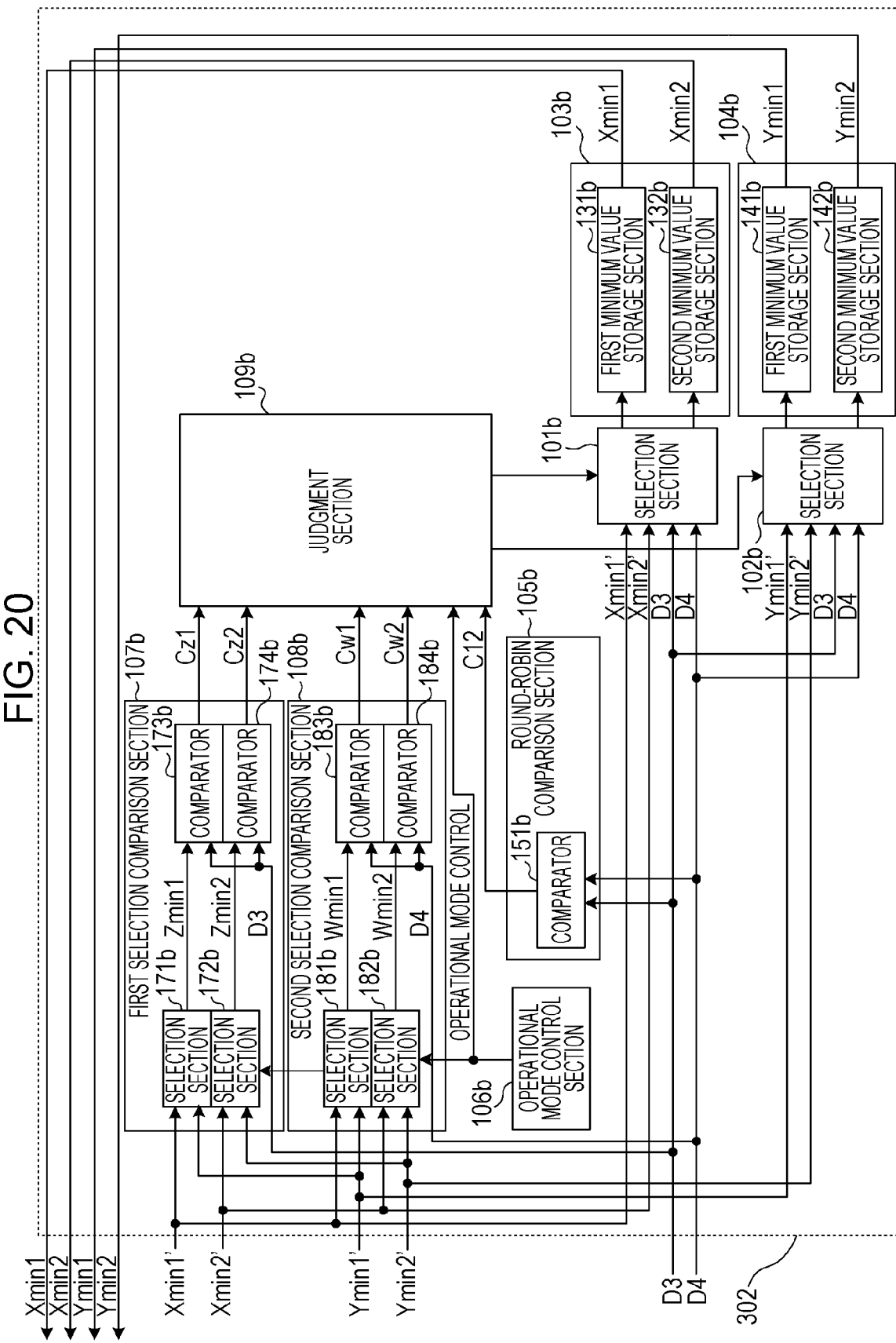
FIG. 20 shows constituent blocks of a minimum value selection section according to the third embodiment.

FIG. 19 is a block diagram showing the internal configuration of the preprocessing section 301 shown in FIG. 18, and FIG. 20 is a block diagram showing the internal configuration of the minimum value selection section 302 shown in FIG. 18.

Note that components in FIGS. 19 and 20 which perform the same processes as those in the first embodiment (FIG. 2) are denoted by the same reference characters, and a description thereof will be omitted. More specifically, the preprocessing section 301 shown in FIG. 19 and the minimum value selection section 302 shown in FIG. 20 basically have the same configuration as that of the minimum value selection circuit 100 according to the first embodiment.

Note that the suffix a is added to a reference numeral for a component of the preprocessing section 301, and the suffix b is added to a reference numeral for a component of the minimum value selection section 302, in order to distinguish between the component of the preprocessing section 301 and the component of the minimum value selection section 302. The prime mark' is added (for example, Xmin1') to a parameter (for example, Xmin1) output from a component of the preprocessing section 301 to distinguish from a parameter output from a component of the minimum value selection section 302.

The preprocessing section 301 and the minimum value selection section 302 are connected so as to exchange the parameters Xmin1, Xmin2, Ymin1, and Ymin2, and the parameters Xmin1', Xmin2', Ymin1', and Ymin2' with each other. The minimum value selection section 302 has basically the same configuration as that of the minimum value selection circuit 100 according to the first embodiment. In contrast to the preprocessing section 301, in which any of Xmin1, Xmin2, Ymin1, and Ymin2 is input to each of the selection sections 101a, 102a, 171a, 172a, 181a, and 182a, any of Xmin1', Xmin2', Ymin1', and Ymin2' is input to each of selection sections 101b, 102b, 171b, 172b, 181b, and 182b in the minimum value selection section 302.

The preprocessing section 301 does not include components corresponding to the storage section 103 and the storage section 104. The preprocessing section 301 uses Xmin1, Xmin2, Ymin1, and Ymin2 held in storage sections 103b and 104b of the minimum value selection section 302 as inputs to selection sections 101a, 102a, 171a, 172a, 181a, and 182a.

Pieces D1 and D2 of input data are input to the preprocessing section 301 while pieces D3 and D4 of input data are input to the minimum value selection section 302. That is, the four pieces D1 to D4 of data are input in parallel to the minimum value selection circuit 300, as in the second embodiment.

For example, in an operational mode called case 5 shown in FIG. 8 where four pieces of data are input per clock cycle, D1 and D2 (a first group) are input to the preprocessing section 301 while a group of D3 and D4 (a second group) are input to the minimum value selection section 302. That is, as shown in FIG. 21, it can be said that, in the operational mode called case 5, a group corresponding to case 1, from which two pieces of data are input per clock cycle, is input to the preprocessing section 301 while a group corresponding to case 2, from which two pieces of data are input per clock cycle, is input to the minimum value selection section 302.

Thus, in the operational mode called case 5, an operational mode control section 106a of the preprocessing section 301 may tell that an operational mode is case 1, and an operational mode control section 106b of the minimum value selection section 302 may tell that an operational mode is case 2. That is, the preprocessing section 301 and the minimum value selection section 302 operate in the same manner as in the first embodiment.

The preprocessing section 301 outputs Xmin1', Ymin1', Xmin2', and Ymin2' to the minimum value selection section 302 each time pieces of input data are input, and a first minimum value (Xmin1' or Ymin1') and a second minimum value (Xmin2' or Ymin2') are updated.

First minimum values (Xmin1' and Ymin1') and second minimum values (Xmin2' and Ymin2') input from the preprocessing section 301 are input to a first selection comparison section 107b and a second selection comparison section 108b, respectively, of the minimum value selection section 302.

The minimum value selection section 302 outputs Xmin1, Ymin1, Xmin2, and Ymin2 to the preprocessing section 301 each time pieces of input data are input, and a first minimum value (Xmin1 or Ymin1) and a second minimum value (Xmin2 or Ymin2) are updated.

First minimum values (Xmin1 and Ymin1) and second minimum values (Xmin2 and Ymin2) input from the minimum value selection section 302 are input to the selection section 101a, the selection section 102a, a first selection comparison section 107a, and a second selection comparison section 108a of the preprocessing section 301.

That is, in the minimum value selection circuit 300, first minimum values and second minimum values (Xmin1, Xmin2, Ymin1, and Ymin2) selected in the minimum value selection section 302 are compared with the pieces D1 and D2 of input data to the preprocessing section 301, and first minimum values and second minimum values (Xmin1', Xmin2', Ymin1', and Ymin2') selected in the preprocessing section 301 are compared with the pieces D3 and D4 of input data to the minimum value selection section 302. As a result of processing in one step, a first minimum value and a second minimum value are obtained for pieces of data (including the pieces D1 to D4 of data) input to the minimum value selection circuit 300, as in the second embodiment.

In the present embodiment, the minimum value selection circuit 300 can have a shorter critical path and an increased operation clock frequency while supporting a plurality of operational modes, like the configuration of the first embodiment (see FIG. 2). The minimum value selection circuit 300 can perform the process of selecting a first minimum value and a second minimum value at high speed.

In the present embodiment, the minimum value selection circuit 300 has the same configuration as that in the first embodiment (see FIG. 2), and the number of comparators included in the minimum value selection circuit 300 can be reduced, as in the first embodiment.

Thus, the present embodiment allows a reduction in processing delay, circuit scale, and power consumption in a minimum value selection circuit even in a case where four pieces of data are input, like the second embodiment.

(Fourth Embodiment)

The present embodiment will describe an LDPC decoder including the same minimum value selection circuit as the minimum value selection circuit 100 (see FIG. 2) illustrated in the first embodiment.

Figure 22A:
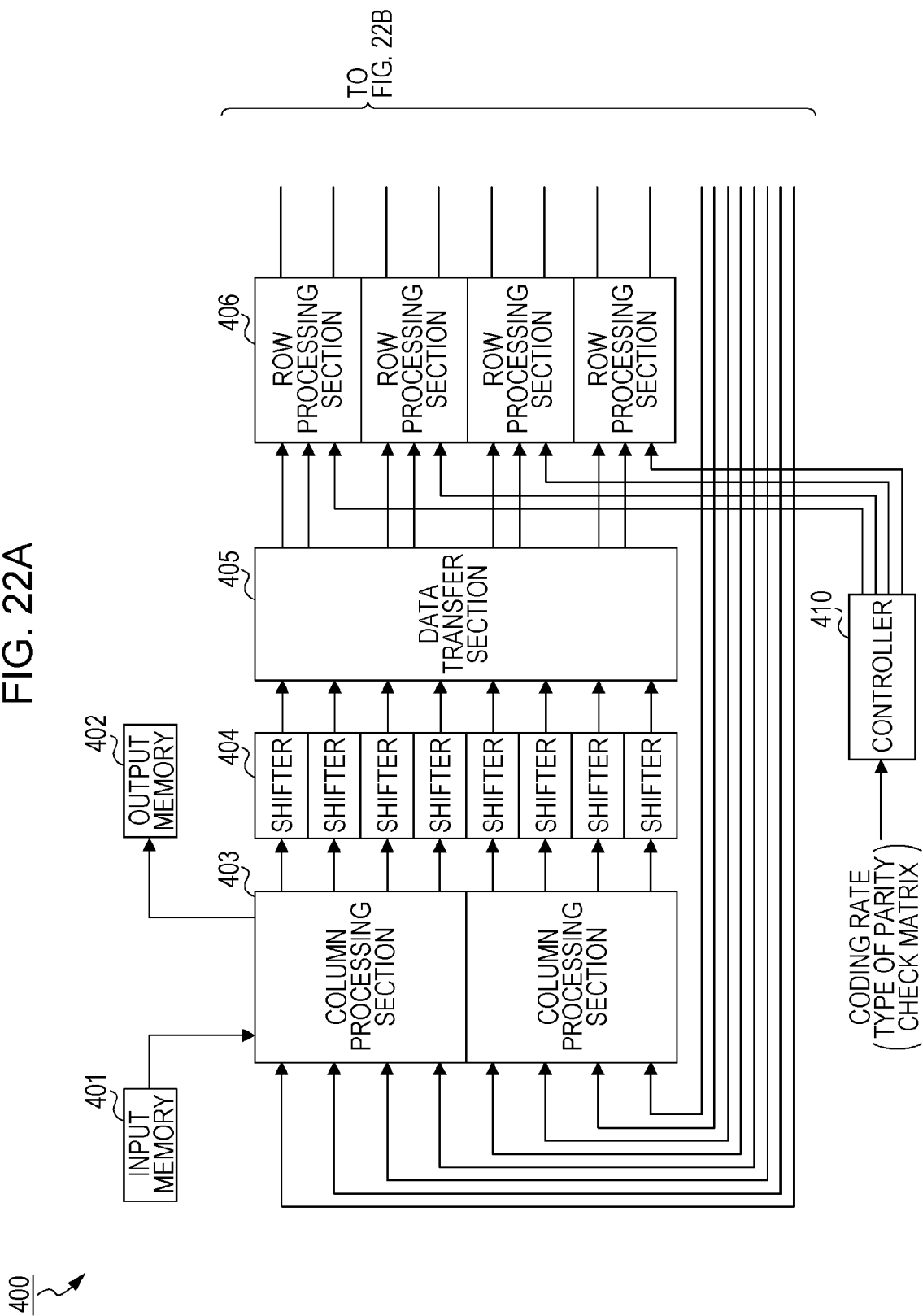
FIG. 22A shows a part of constituent blocks of an LDPC decoder according to a fourth embodiment.

FIG. 22A and FIG. 22B are a block diagram showing the configuration of an LDPC decoder according to the present embodiment.

An LDPC decoder 400 decodes a piece of data (digital signal) coded using an LDPC code. Note that an LDPC code is an example of a linear code.

The LDPC decoder 400 decodes a coded piece of data into an original piece of data on the basis of a parity check matrix (see, for example, FIG. 23 (to be described later)). For example, the LDPC decoder 400 processes in parallel computations for 42 columns of the parity check matrix per time point (clock cycle) by min-sum decoding.

Figure 23:
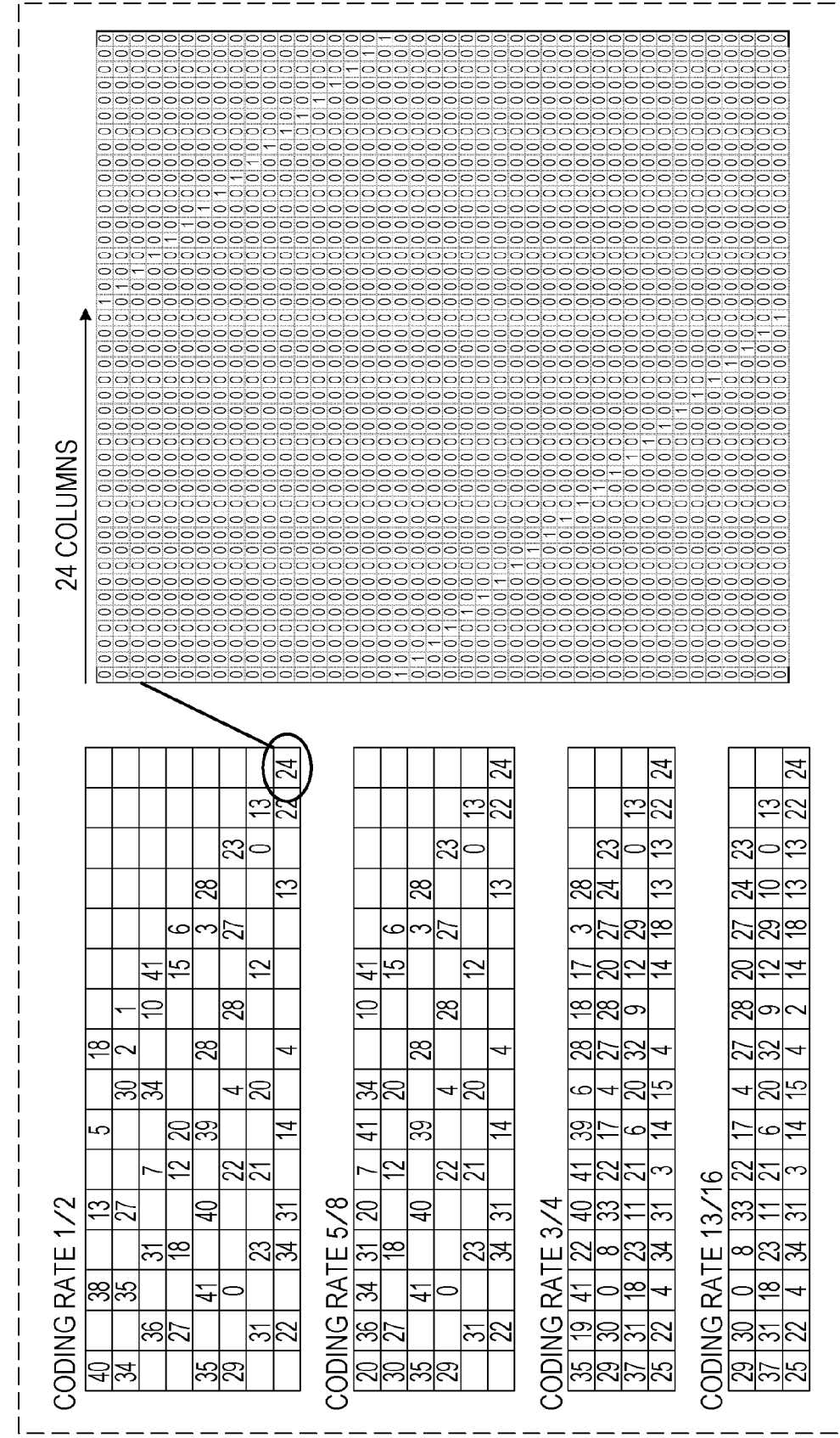
FIG. 23 shows one example of parity check matrices according to the fourth embodiment.

For example, four parity check matrices with different coding rates shown in FIG. 23 are defined in the IEEE 802.11ad standard.

A coding rate refers to the ratio of the number of bits of information bits to the number of bits in code word to be transmitted (code word). A lower coding rate leads to higher error correction capability. An appropriate coding rate is selected in accordance with propagation path quality in wireless communication. For example, if the LDPC decoder 400 conforms to the IEEE 802.11ad standard, the LDPC decoder 400 needs to support four coding rates and perform decoding while switching a parity check matrix to be used.

In the four parity check matrices shown in FIG. 23, a portion with a number represents a matrix obtained by cyclically shifting a unit matrix with 42 rows and 42 columns in a row direction by the number. For example, in a parity check matrix with a coding rate of ½ shown in FIG. 23, a number in a circled portion is 24, and the portion represents a matrix obtained by shifting the unit matrix in the row direction by 24 (that is, 24 columns).

In the four parity check matrices shown in FIG. 23, a blank portion represents a zero matrix with 42 rows and 42 columns.

In the description below, a matrix with 42 rows and 42 columns may also be referred to as a "sub-matrix".

By way of example, in the parity check matrix with the coding rate of ½ shown in FIG. 23, each row is composed of 16 sub-matrices, and each column is composed of eight sub-matrices. A collection of 16 sub-matrices in each row may also be referred to as a "row group". A collection of eight sub-matrices in each column may also be referred to as a "column group".

That is, the parity check matrix with the coding rate of ½ shown in FIG. 23 is a matrix with 336 rows and 672 columns.

The LDPC decoder 400 shown in FIG. 22A and FIG. 22B includes an input memory 401, an output memory 402, two column processing sections 403, eight shifters 404, a data transfer section 405, four row processing sections 406, eight postprocessing sections 407, a data transfer section 408, eight shifters 409, and a controller 410.

The input memory 401 holds pieces of data input to the LDPC decoder 400 and supplies necessary pieces of data to the column processing sections 403 in accordance with an operation of the LDPC decoder 400.

The output memory 402 holds pieces of data as an LDPC decoding result output from the column processing sections 403.

Note that the input memory 401 may be omitted as long as a piece of data is input to the LDPC decoder 400 and that the output memory 402 may be omitted as long as a piece of data is output from the LDPC decoder 400.

The shifter 404 performs shifting on a piece of data output from the column processing section 403 and outputs in order pieces of data corresponding to elements of a parity check matrix.

The shifter 409 performs shifting on a piece of data (that is, a piece of data after row processing) output from the data transfer section 408. Note that the shifter 409 shifts a piece of data in a direction opposite to a direction for the shifter 404 by the same shift amount as a shift amount for the shifter 404.

The column processing section 403 performs column processing using pieces of data output from the input memory 401 or pieces of data output from the shifters 409 by min-sum decoding. For example, the column processing section 403 performs the computation indicated by Equation (1).

$$\beta_{mn} = \sum_{m' \in A(n) \backslash m} \alpha_{m'n} + \lambda_n \quad (1)$$

In Equation (1), $\beta_{mn}$ represents a piece of data called a column message, and m and n are indices indicating a row number and a column number, respectively, in a parity check matrix. For example, in the case of the parity check matrix with the coding rate of ½, 0≤m<672 and 0≤n<336 hold. Calculation of $\beta_{mn}$ may be performed for each of combinations of values of m and n which meet the requirement that an element in an m-th row and an n-th column of a parity check matrix is 1.

In Equation (1), A(n) represents a set of row numbers with elements of 1 in an n-th column of the parity check matrix, and m' represents a row number other than the row number m among the row numbers included in A(n).

$\alpha_{m'n}$ represents a piece of data called a row message. For example, 0 is set as an initial value for iterative decoding in the row message $\alpha_{m'n}$, and a piece of data output from the shifter 409 is set during iterative decoding. $\lambda_n$ represents a piece of data input to the LDPC decoder 400, and the piece of data is stored in the input memory 401. If the LDPC decoder 400 is provided in a communicator, the piece $\lambda_n$ of data corresponds to a received piece of data and may be referred to as a "communication channel value".

The LDPC decoder 400 shown in FIG. 22A includes two column processing sections 403 (hereinafter denoted by reference numerals 403-1 and 403-2).

Each column processing section 403 is capable of performing column processing for one column group in one clock cycle. One column group is composed of 42 columns, and up to four elements are 1 in each column. One column processing section 403 performs in parallel the process indicated by Equation (1) 168 (=42×4) times.

Figure 24:
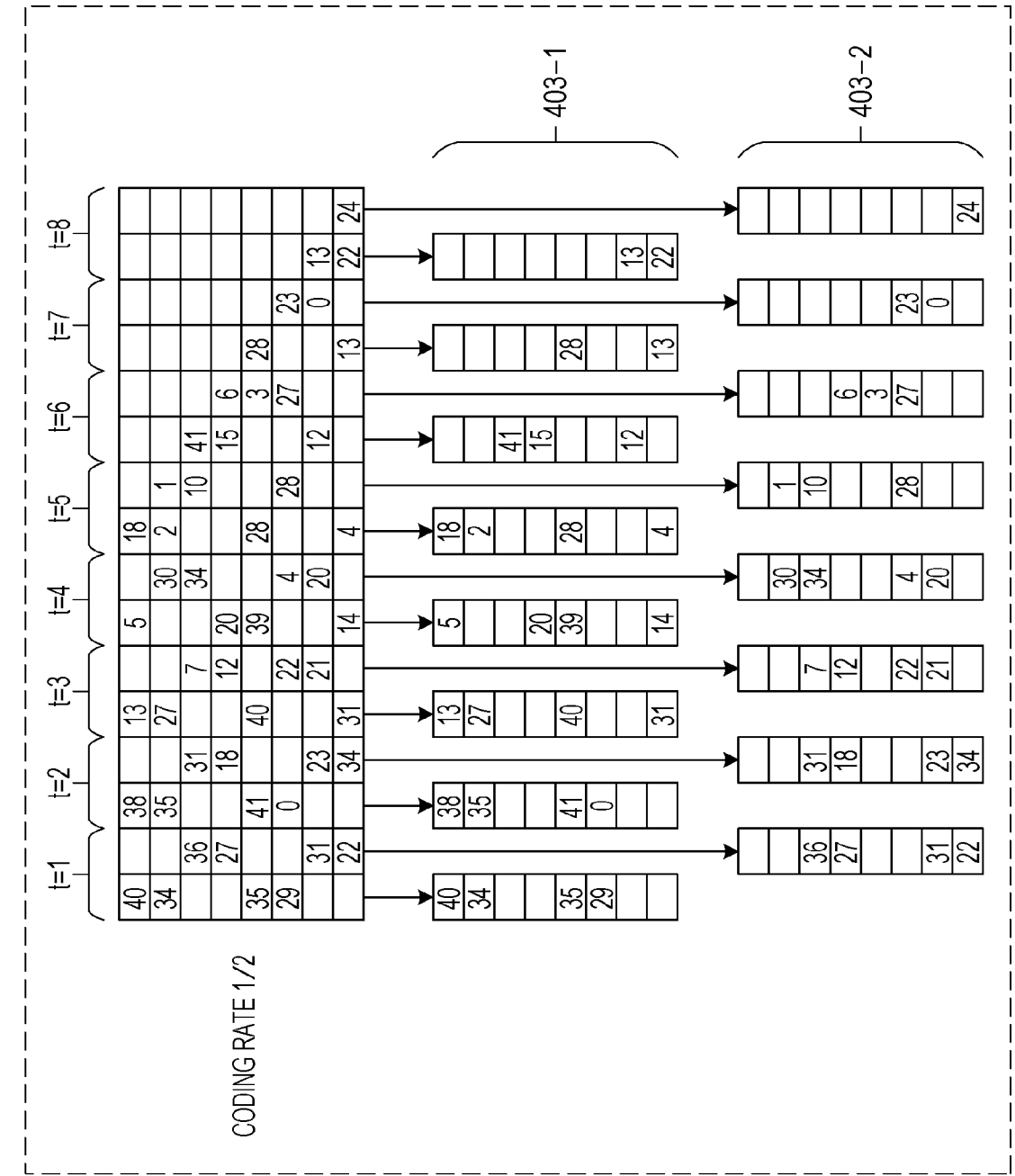
FIG. 24 shows an example of assignment of column groups to column processing sections according to the fourth embodiment.

For example, as shown in FIG. 24, the column processing section 403-1 performs column processing on an odd-numbered column group while the column processing section 403-2 performs column processing on an even-numbered column group. For this reason, the two column processing sections 403 perform column processing on two column groups per clock cycle. Column processing on the whole parity check matrix is completed in eight clock cycles.

In FIG. 24, each column group has up to four nonzero sub-matrices. Hence, the number of pieces of data input to one column processing section 403 is up to the number (42×4=168) of row messages corresponding to four sub-matrices. The number of pieces of data output from one column processing section 403 is equal to the number.

The row processing section 406 performs row processing using a piece of data output from the data transfer section 405 by min-sum decoding. For example, the row processing section 406 performs the computation indicated by Equation (2). For example, the row processing section 406 uses a second right-hand side in Equation (2) for simple calculation.

$$\alpha_{mn} = \min_{n' \in B(m) \backslash n} |\beta_{mn'}| \cdot \prod_{n' \in B(m) \backslash n} \text{sign}(\beta_{mn'}) \quad (2)$$
$$= \begin{cases} \beta_m^{min} \cdot S_m \cdot \text{sign}(\beta_{mn}) & (\text{if } |\beta_{mn}| \neq \beta_m^{min}) \\ \beta_m^{min2} \cdot S_m \cdot \text{sign}(\beta_{mn}) & (\text{if } |\beta_{mn}| \neq \beta_m^{min}) \end{cases}$$

More specifically, the row processing section 406 calculates $\beta_m^{min}$, $\beta_m^{min2}$, and $S_m$ in Equation (2).

The postprocessing section 407 performs selection processing indicated by Equation (2) (the process of comparing $|\beta_{mn}|$ with $\beta_m^{min}$ and selecting either one of two values in the second right-hand side in Equation (2)), and the column processing section 403 multiplies $\beta_m^{min}$ or $\beta_m^{min2}$ in Equation (2) by sign $(\beta_{mn})$.

Note that the row processing section 406 may calculate a value of n (also referred to as an index), at which $|\beta_{mn}|=\beta_m^{min}$ holds, and pass the value to the postprocessing section 407, thereby omitting the comparison of $|\beta_{mn}|$ with $\beta_m^{min}$ in the postprocessing section 407.

Note that sign $(\beta_{mn})$ represents the sign of $\beta_{mn}$. B(m) represents a set of column numbers with elements of 1 in an m-th row of a parity check matrix. n' represents a column number other than the column number n among the column numbers included in B(m).

$\beta_m^{min}$ represents a first minimum value and is indicated by Equation (3). $\beta_m^{min2}$ represents a second minimum value and is indicated by Equation (4). The function min_2 nd( ) in Equation (4) is a function of obtaining a second minimum value.

$$\beta_m^{min} = \min_{n' \in B(m)} |\beta_{mn'}| \quad (3)$$

$$\beta_m^{min2} = \min\_2nd_{n' \in B(m)} |\beta_{mn'}| \quad (4)$$

That is, $\beta_m^{min}$ in Equation (3) represents a smallest value among absolute values of $\beta_{mn'}$ in an m-th row, and $\beta_m^{min2}$ in Equation (4) represents a second smallest value among the absolute values of $\beta_{mn'}$ in the m-th row.

$S_m$ in Equation (2) is calculated in accordance with Equation (5). sign($\beta_{mn'}$) is calculated in accordance with Equation (6).

$$S_m = \prod_{n' \in B(m)} \text{sign}(\beta_{mn'}) \quad (5)$$

$$\text{sign}(\beta_{mn'}) = \begin{cases} +1 & (\text{if } \beta_{mn'} \geq 0) \\ -1 & (\text{if } \beta_{mn'} < 0) \end{cases} \quad (6)$$

The LDPC decoder 400 shown in FIG. 22A includes the four row processing sections 406 (hereinafter denoted by reference numerals 406-1 to 406-4).

One row processing section 406 is capable of processing pieces of data corresponding to two sub-matrices (one sub-matrix corresponds to 42 column messages) in one clock cycle.

Figure 25:
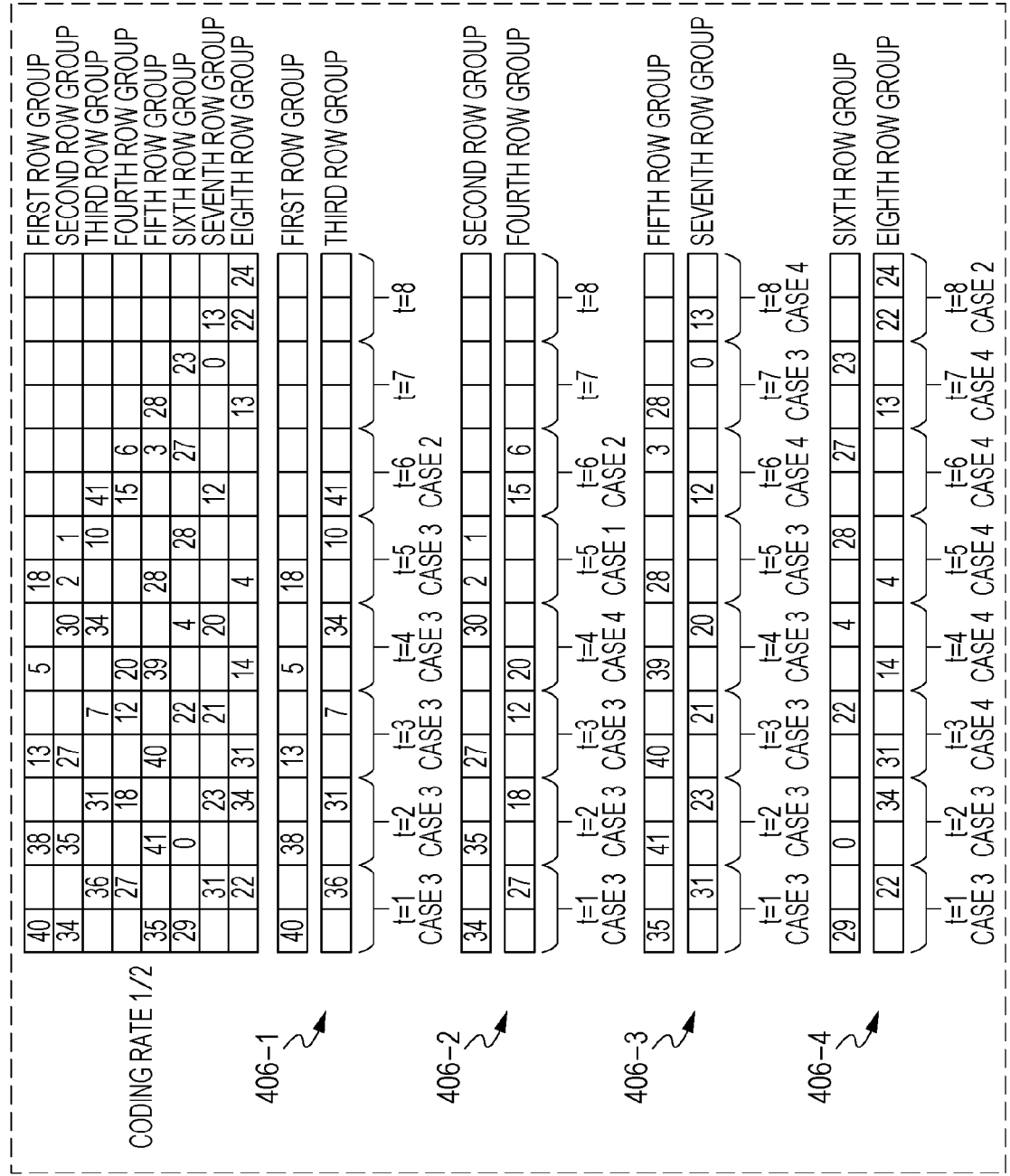
FIG. 25 shows an example of assignment of row groups to row processing sections according to the fourth embodiment.

For example, in the case of the coding rate of ½ as shown in FIG. 25, there are eight row groups. Two row groups are associated with each of the four row processing sections 406-1 to 406-4. Two row groups associated with each row processing section 406 are assigned such that the number of nonzero sub-matrices is one in a single column group.

Figure 26:
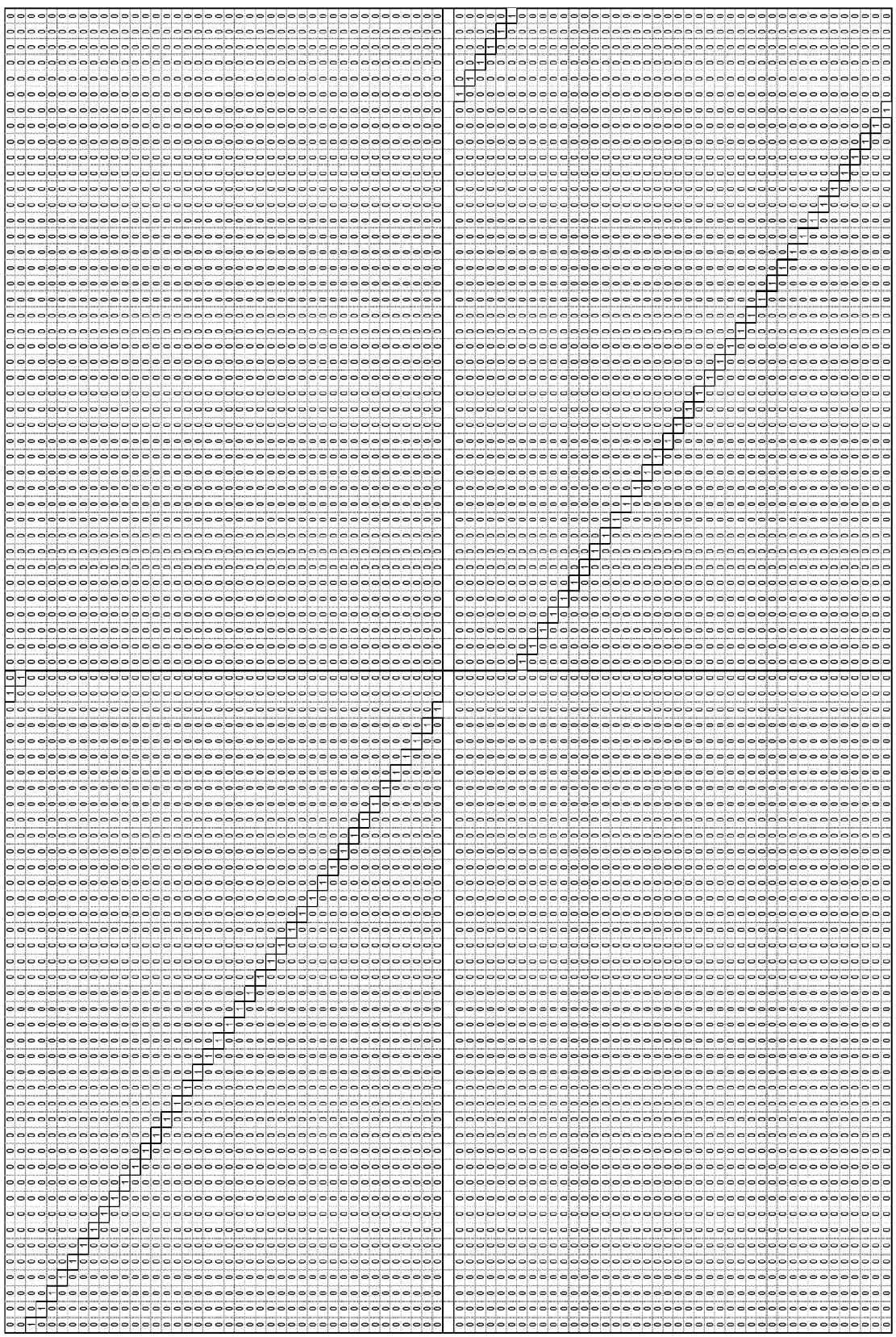
FIG. 26 shows a sub-matrix to be processed at t=1 by a row processing section 406-1 according to the fourth embodiment.

Each row processing section 406 processes two column groups in one clock cycle. For example, the row processing section 406-1 performs row processing on a sub-matrix denoted by the number 40 of a first row group and a sub-matrix denoted by the number 36 of a third row group at t=1. FIG. 26 shows sub-matrices (including the nonzero matrices denoted by the number 40 and the number 36 and zero matrices) on which the row processing section 406-1 is to perform row processing at t=1.

Figure 27:
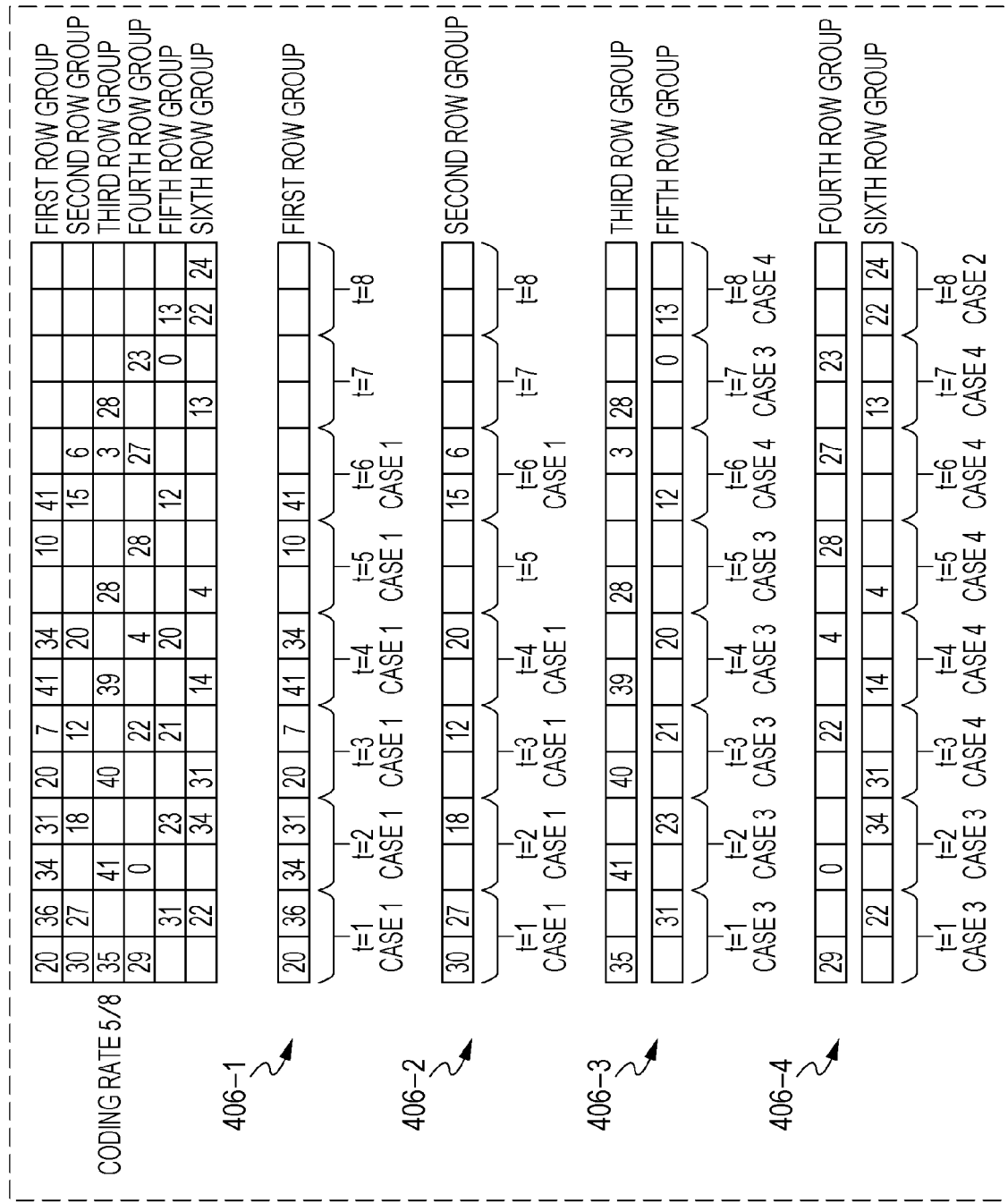
FIG. 27 shows an example of assignment of row groups to the row processing sections according to the fourth embodiment.

As shown in FIG. 27, in the case of a coding rate of ⅝, there are six row groups. One row group is associated with each of the two row processing sections 406-1 and 406-2, and two row groups are associated with each of the two row processing sections 406-3 and 406-4. The two row groups associated with each of the two row processing sections 406-3 and 406-4 is assigned such that the number of nonzero sub-matrices is one in a single column group.

Figure 28:
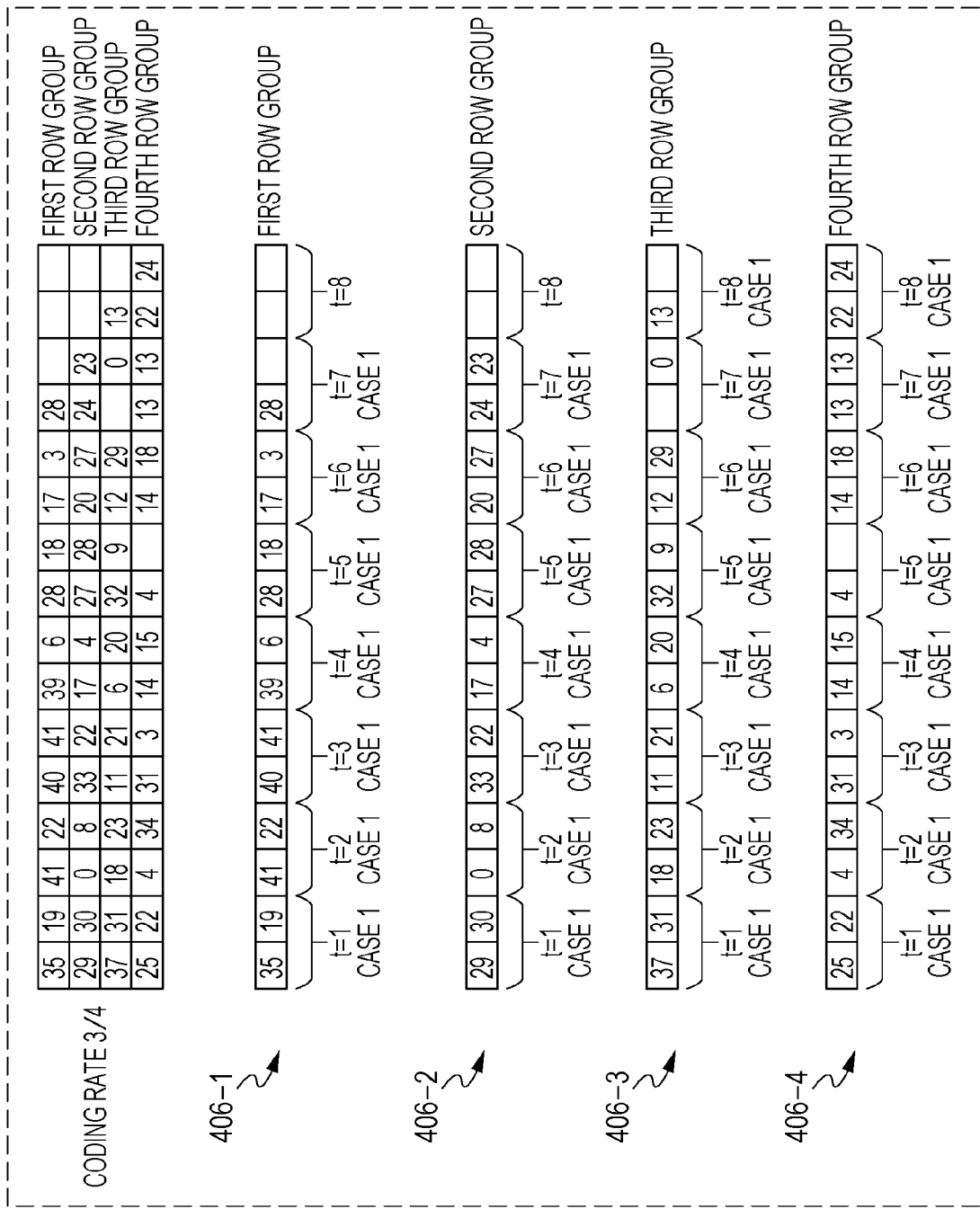
FIG. 28 shows an example of assignment of row groups to the row processing sections according to the fourth embodiment.

Similarly, as shown in FIG. 28, in the case of a coding rate of ¾, there are four row groups. One row group is associated with each of the four row processing sections 406-1 to 406-4.

The above-described association (assignment) of the row processing section 406 with (to) a row group (row groups) is performed by the data transfer section 405.

Figure 29:
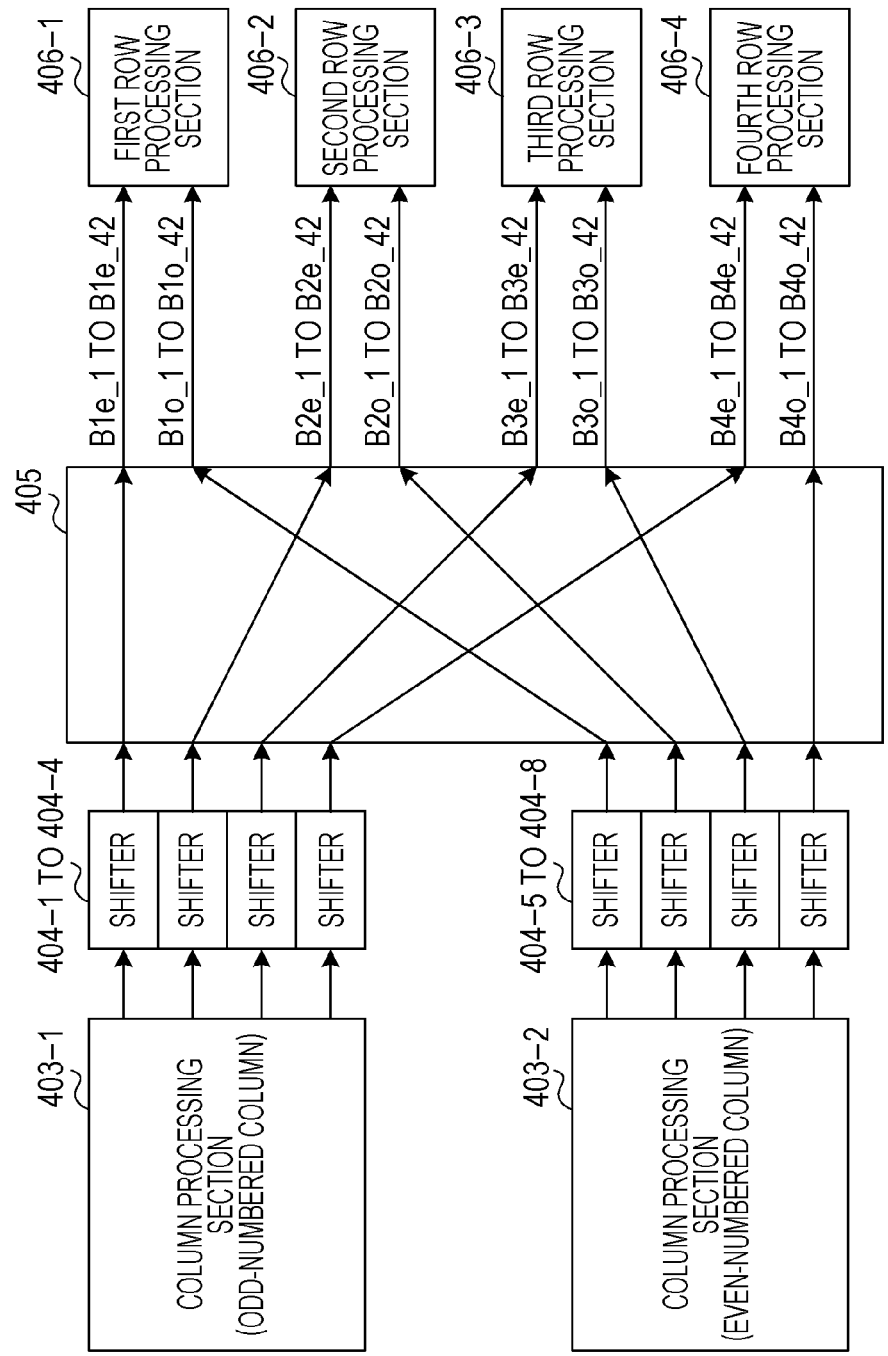
FIG. 29 shows an example of the operation of a data transfer section according to the fourth embodiment.

FIG. 29 shows an example of the operation of the data transfer section 405.

Column messages (B1e_1 to B1e_42, B2e_1 to B2e_42, B3e_1 to B3e_42, and B4e_1 to B4e_42 corresponding to $\beta_{mn}$ in Equation (1)) which are output from the column processing section 403-1 and correspond to up to four (nonzero) sub-matrices of an odd-numbered column group are distributed among the four row processing sections 406-1 to 406-4 via shifters 404-1 to 404-4.

Similarly, column messages (B1o_1 to B1o_42, B2o_1 to B2o_42, B3o_1 to B3o_42, and B4o_1 to B4o_42 corresponding to $\beta_{mn}$ in Equation (1)) which are output from the column processing section 403-2 and correspond to four sub-matrices of an even-numbered column group are distributed among the four row processing sections 406-1 to 406-4 via shifters 404-5 to 404-8.

As a result, pieces of data corresponding to one sub-matrix of an odd-numbered column group and one sub-matrix of an even-numbered column group are input to each row processing section 406.

For example, if the parity check matrix with the coding rate of ½ shown in FIG. 25 is used, column messages B1e_1 to B1e_42 corresponding to a sub-matrix (denoted by the number 40, the number 38, the number 13, the number 5, or the number 18 in FIG. 25) corresponding to each column of the first row group are input in order to the row processing section 406-1 in each step (t=1 to 8). Similarly, column messages B1o_1 to B1o_42 corresponding to a sub-matrix (denoted by the number 36, the number 31, the number 7, the number 34, the number 10, or the number 41 in FIG. 25) corresponding to each column of the third row group are input to the row processing section 406-1 in each step (t=1 to 8).

The same applies to the other row processing sections 406-2 to 406-4.

Figure 30:
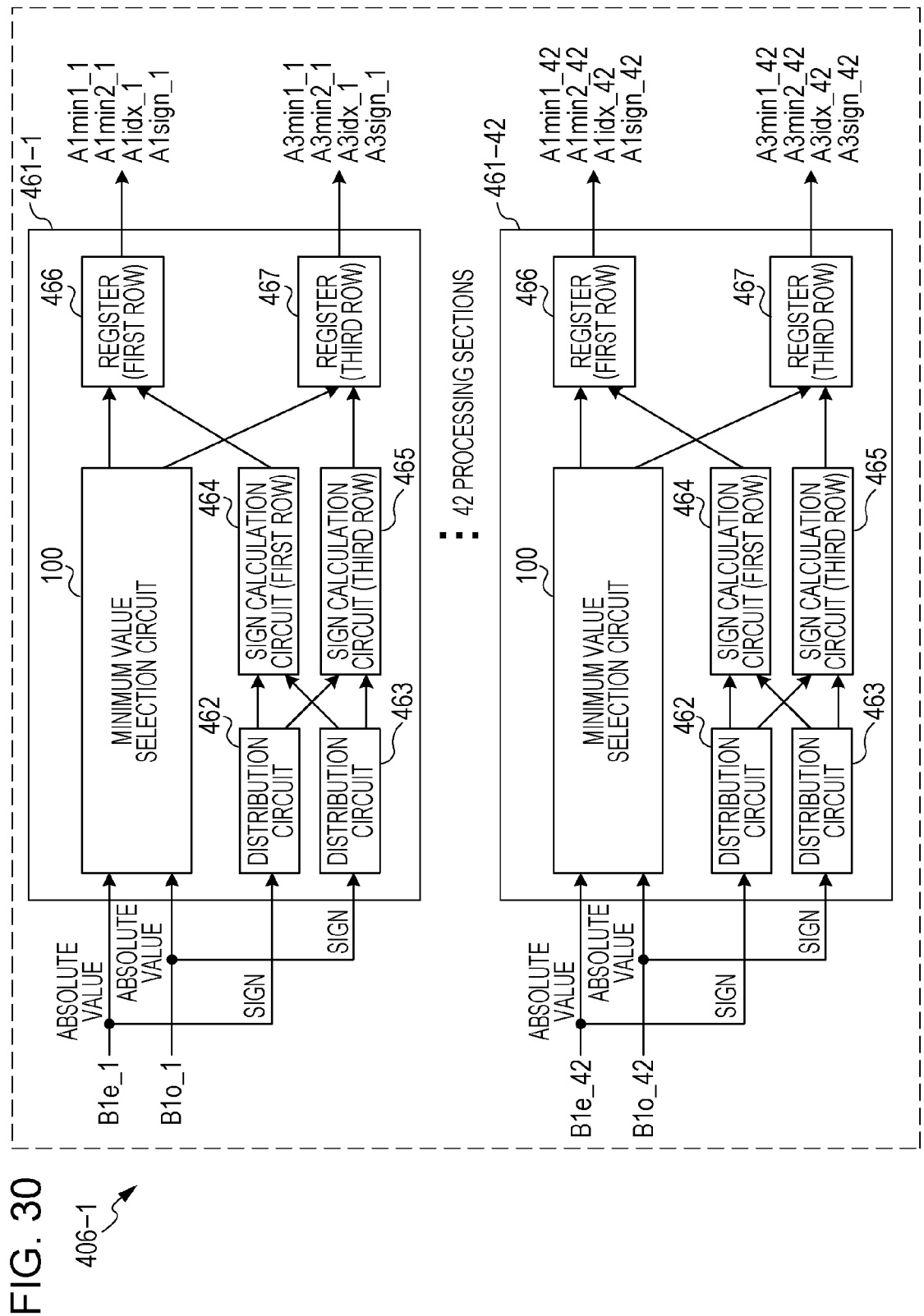
FIG. 30 shows constituent blocks of the row processing section 406-1 according to the fourth embodiment.

FIG. 30 is a block diagram showing the configuration of the row processing section 406-1.

The row processing section 406-1 shown in FIG. 30 has a configuration in which 42 processing sections 461-1 to 461-42, the number of which is appropriate to the size of a sub-matrix, are arranged in parallel. Each processing section 461 includes a minimum value selection circuit 100, distribution circuits 462 and 463, sign calculation circuits 464 and 465, and registers 466 and 467.

The minimum value selection circuit 100 performs the same processing as in the first embodiment, thereby obtaining a first minimum value $\beta_m^{min}$ and a second minimum value $\beta_m^{min2}$ in Equations (3) and (4).

As shown in FIGS. 25, 27, and 28, the row processing section 406 processes two column groups per clock cycle. More specifically, if the parity check matrix shown in FIG. 25 is used, the column message B1e_1 (corresponding to D1 in the first embodiment) of the first row group (corresponding to, for example, the first group in the first embodiment) and the column message B1o_1 (corresponding to D2 in the first embodiment) of the third row group (corresponding to, for example, the second group in the first embodiment) are processed in the minimum value selection circuit 100 of the processing section 461-1 per clock cycle.

The minimum value selection circuit 100 of the processing section 461-1 needs eight clock cycles to calculate a first minimum value A1min1_1 (corresponding to $\beta_m^{min}$ or Xmin1 in FIG. 2) of the first row group and a second minimum value A1min2_1 (corresponding to $\beta_m^{min2}$ or Xmin2 in FIG. 2). Similarly, the minimum value selection circuit 100 of the processing section 461-1 needs eight clock cycles to calculate a first minimum value A3min1_1 (corresponding to $\beta_m^{min}$ or Ymin1 in FIG. 2) and a second minimum value A3min2_1 (corresponding to $\beta_m^{min2}$ or Ymin2 in FIG. 2).

The operation of the minimum value selection circuit 100 is the same as that in the first embodiment. An operational mode control section 106 of the minimum value selection circuit 100 tells components that an operational mode is one of case 1 to case 4 in accordance with the type of the parity check matrix (that is, a coding rate) and the time t, as shown in FIGS. 25, 27, and 28.

The distribution circuits 462 and 463 each output the sign (a piece of sign bit information) of a piece of input data to a corresponding one of the sign calculation circuits 464 and 465 in accordance with one of operational modes called case 1 to case 4 under a controller (not shown).

For example, the distribution circuit 462 outputs an input piece of sign bit information to the sign calculation circuit 464 corresponding to the first row group in case 1 or case 3 (see FIGS. 25, 27, and 28). The distribution circuit 462 outputs an input piece of sign bit information to the sign calculation circuit 465 corresponding to the third row group in case 2 (see FIG. 25). In contrast, the distribution circuit 463 outputs an input piece of sign bit information to the sign calculation circuit 465 corresponding to the third row group in case 3 (see FIG. 25).

The sign calculation circuits 464 and 465 perform calculation of Equation (5).

Each of the registers 466 and 467 holds pieces of output data related to the first row group or the third row group output from the minimum value selection circuit 100 and the sign calculation circuit 464 or 465 and outputs the pieces of output data to the postprocessing section 407.

For example, pieces of output data for the first row group from the processing section 461-1 include the first minimum value A1min1_1 ($\beta_m^{min}$ in Equation (3)), the second minimum value A1min2_1 ($\beta_m^{min2}$ in Equation (4)), an index A1idx_1 (a value of n at which $|\beta_{mn}|=\beta_m^{min}$ holds in Equation (2)), and a sign A1sign_1 ($S_m$ in Equation (5)) of the column message B1e_1 included in the first row group. The same applies to other pieces of output data.

Note that although the configuration of the row processing section 406-1 (corresponding to the first row group and the third row group) has been described with reference to FIG. 30, the other row processing sections 406-2 to 406-4 (not shown) have the same configuration and perform row processing on the other row groups.

Referring back to FIG. 22B, the data transfer section 408 distributes pieces of data ($\beta_m^{min}$ (or $\beta_m^{min2}$), $S_m$, and sign ($\beta_{mn}$) in Equation (2)) output from postprocessing sections 407-1 to 407-8 among the odd-numbered column groups and the even-numbered column groups in accordance with the above-described association (assignment) of the row processing sections 406 with (to) the row groups and outputs the pieces of data to shifters 409-1 to 409-4 (corresponding to the odd-numbered column groups) and shifters 409-5 to 409-8 (corresponding to the even-numbered column groups).

Figure 31:
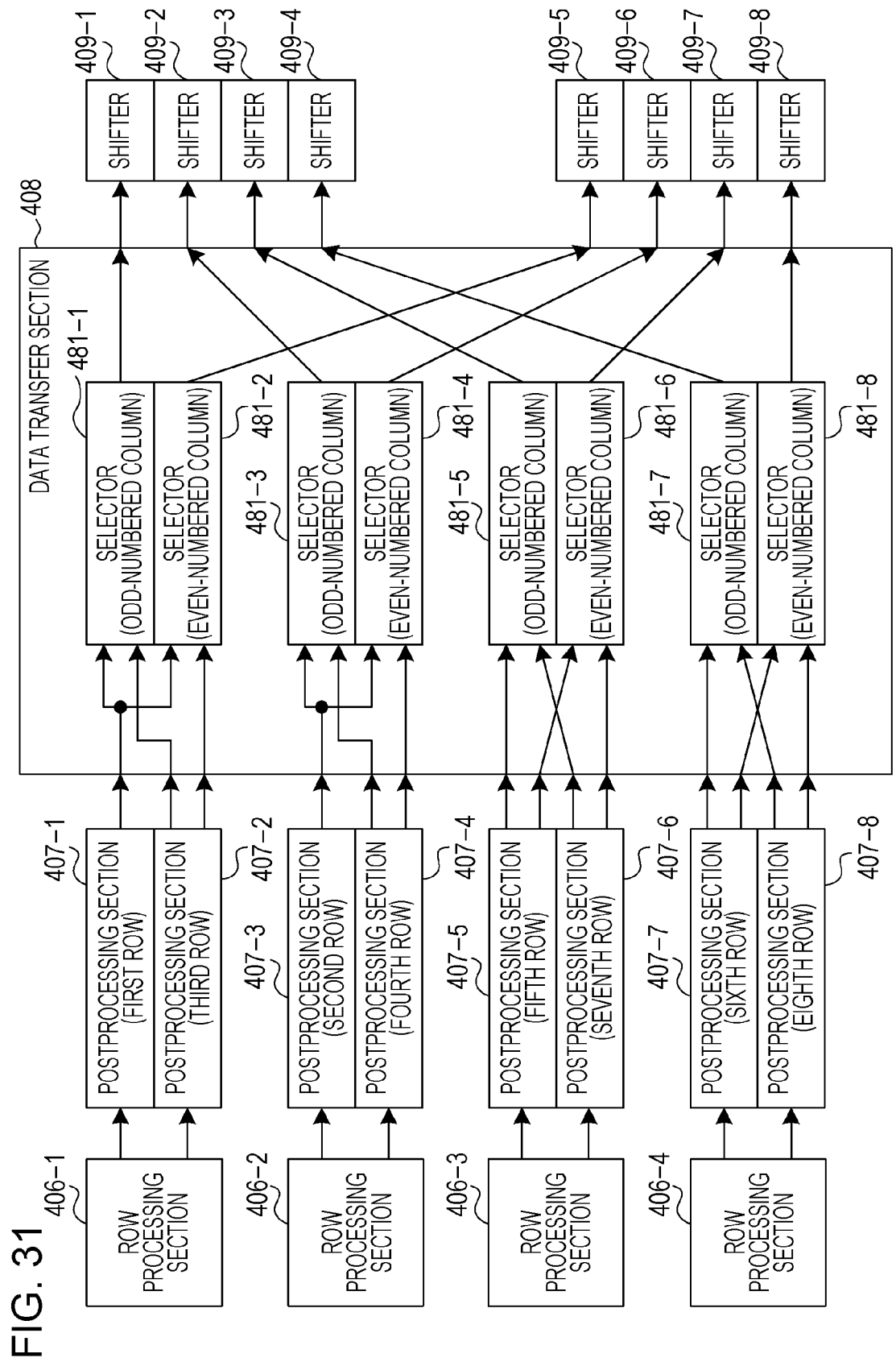
FIG. 31 shows an example of the operation of a data transfer section according to the fourth embodiment.

FIG. 31 shows an example of the operation of the data transfer section 408.

Selectors 481-1, 481-3, 481-5, and 481-7 shown in FIG. 31 select pieces of data for the odd-numbered column groups from among pieces of data for the row groups output from the postprocessing sections 407-1 to 407-8 and output the pieces of data to the shifters 409-1 to 409-4.

Similarly, selectors 481-2, 481-4, 481-6, and 481-8 shown in FIG. 31 select pieces of data for the even-numbered column groups from among the pieces of data for the row groups output from the postprocessing sections 407-1 to 407-8 and output the pieces of data to the shifters 409-5 to 409-8.

As can be seen from the foregoing, in the present embodiment, the LDPC decoder 400 includes the plurality of column processing sections 403 and the plurality of row processing sections 406. Each row processing section 406 includes the minimum value selection circuit 100 having the configuration according to the first embodiment. For this reason, in the LDPC decoder 400, the number of comparators in the row processing section 406 can be reduced, as in the first embodiment. The LDPC decoder 400 supports a plurality of parity check matrices and can cause the row processing section 406 to perform processing at high speed.

The controller 410 in FIG. 22A controls an operational mode (case) to be set in each of the row processing sections 406-1 to 406-4 in accordance with a selected parity check matrix (for example, one selected from among the four parity check matrices shown in FIG. 23). For example, if the parity check matrix with the coding rate of ½ shown in FIG. 25 is selected, the controller 410 tells the row processing section 406-1 to perform processing in the order of case 3 (t=1), case 3 (t=2), . . . , case 2 (t=6). The controller 410 similarly tells an operational mode (one of case 1 to case 4) to each row processing section 406 in the case of a parity check matrix with a different coding rate (for example, the coding rate of ⅝ in FIG. 27 or the coding rate of ¾ in FIG. 28).

The minimum value selection circuit 100 of each row processing section 406 places each of a predetermined number of pieces of data input in parallel in one of a plurality of groups in accordance with an operational mode (for example, one of case 1 to case 4 in FIG. 25) told by the controller 410. That is, each of the predetermined number of pieces of data input in parallel to the minimum value selection circuit 100 falls under any one of the plurality of groups in accordance with the type of the parity check matrix. Storage sections 103 and 104 of the minimum value selection circuit 100 store a first minimum value and a second minimum value for each of the plurality of groups, for the predetermined pieces of data. A first minimum value and a second minimum value corresponding to a group, to which each input piece of data belongs, are input from the storage section 103 or the storage section 104 to each of a first selection comparison section 107 and a second selection comparison section 108 (a plurality of second comparators).

For this reason, the minimum value selection circuit 100 of each row processing section 406 can perform minimum value selection processing in accordance with any one of a plurality of parity check matrices. That is, it is unnecessary to change the configuration of the minimum value selection circuit 100 in accordance with the type of a parity check matrix or provide the minimum value selection circuit 100 with a plurality of configurations. Thus, the present embodiment allows a reduction in the circuit scale of and power consumption by the row processing section 406 including the minimum value selection circuit 100.

(Fifth Embodiment)

The fourth embodiment has described an LDPC decoder (to which two pieces of data are input in parallel) including the minimum value selection circuit 100 illustrated in the first embodiment. In contrast, the present embodiment will describe an LDPC decoder (to which four pieces of data are input in parallel) including the same minimum value selection circuit as the minimum value selection circuits 200 and 300 (see FIGS. 7 and 18) illustrated in the second and third embodiments.

FIG. 32A and FIG. 32B are a block diagram showing the configuration of an LDPC decoder according to the present embodiment.

An LDPC decoder 500 shown in FIG. 32A and FIG. 32B has basically the same configuration as that of the LDPC decoder 400 according to the fourth embodiment.

The LDPC decoder 500 is different from the LDPC decoder 400 in that the LDPC decoder 500 includes four column processing sections 503 and includes 16 shifters 504, 16 shifters 509, and 16 postprocessing sections 507 corresponding to the number (four) of pieces of data to be processed in parallel in each row processing section 506. The number of row processing sections 506 of the LDPC decoder 500 is the same as in the fourth embodiment (the LDPC decoder 400) and is four.

As in the fourth embodiment, the number of nonzero sub-matrices in each column group is up to four. Thus, the number of pieces of data input to one column processing section 503 is the number (42×4=168) of row messages corresponding to up to four sub-matrices. The number of pieces of data output from one column processing section 503 is equal to the number.

Figure 33:
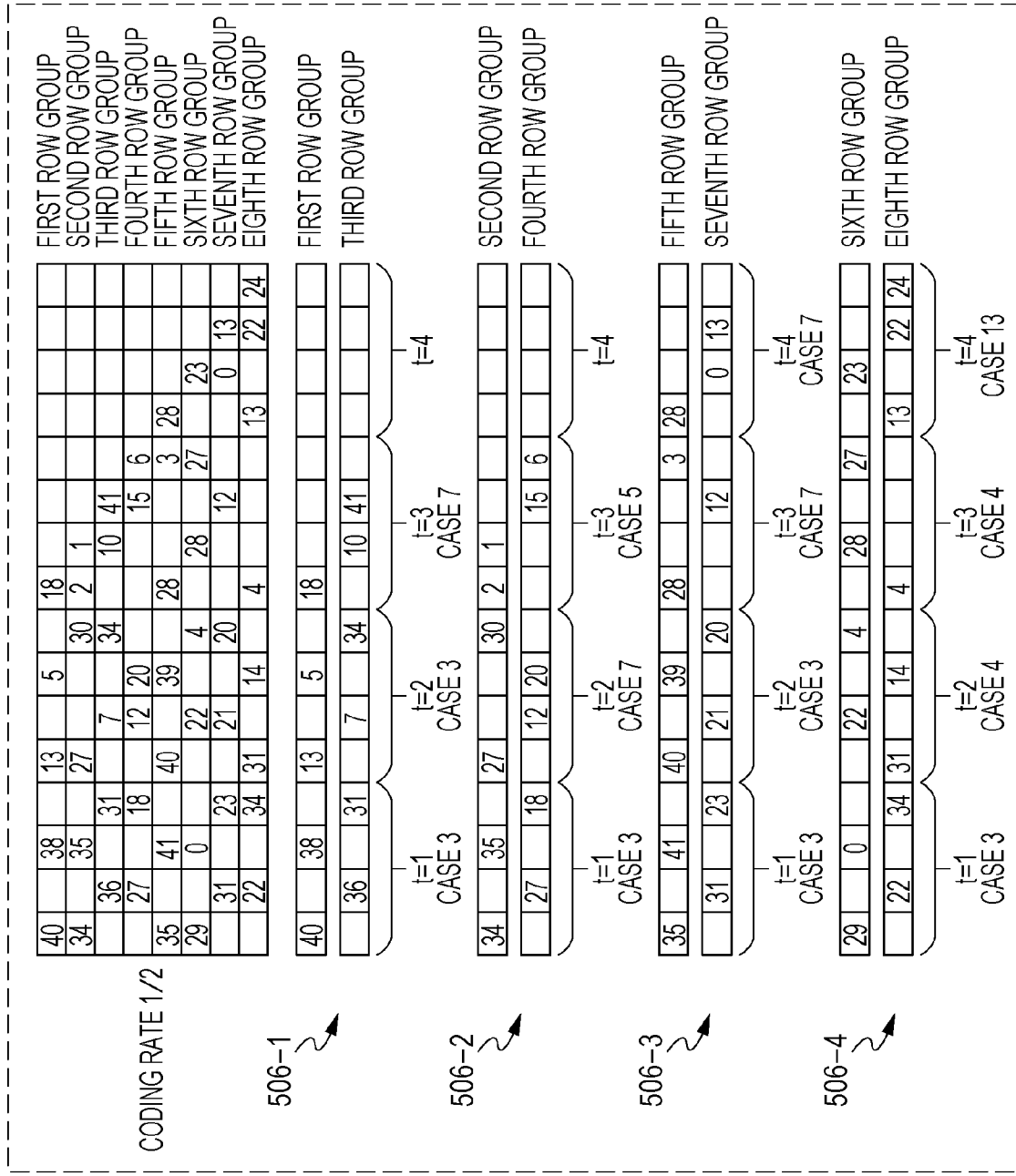
FIG. 33 shows an example of assignment of row groups to row processing sections according to the fifth embodiment.

As shown in FIG. 33, in the case of a coding rate of ½, there are eight row groups. Two row groups are associated with each of four row processing sections 506-1 to 506-4. The two row groups associated with each row processing section 506 are assigned such that the number of nonzero sub-matrices is one in a single column group.

Figure 34:
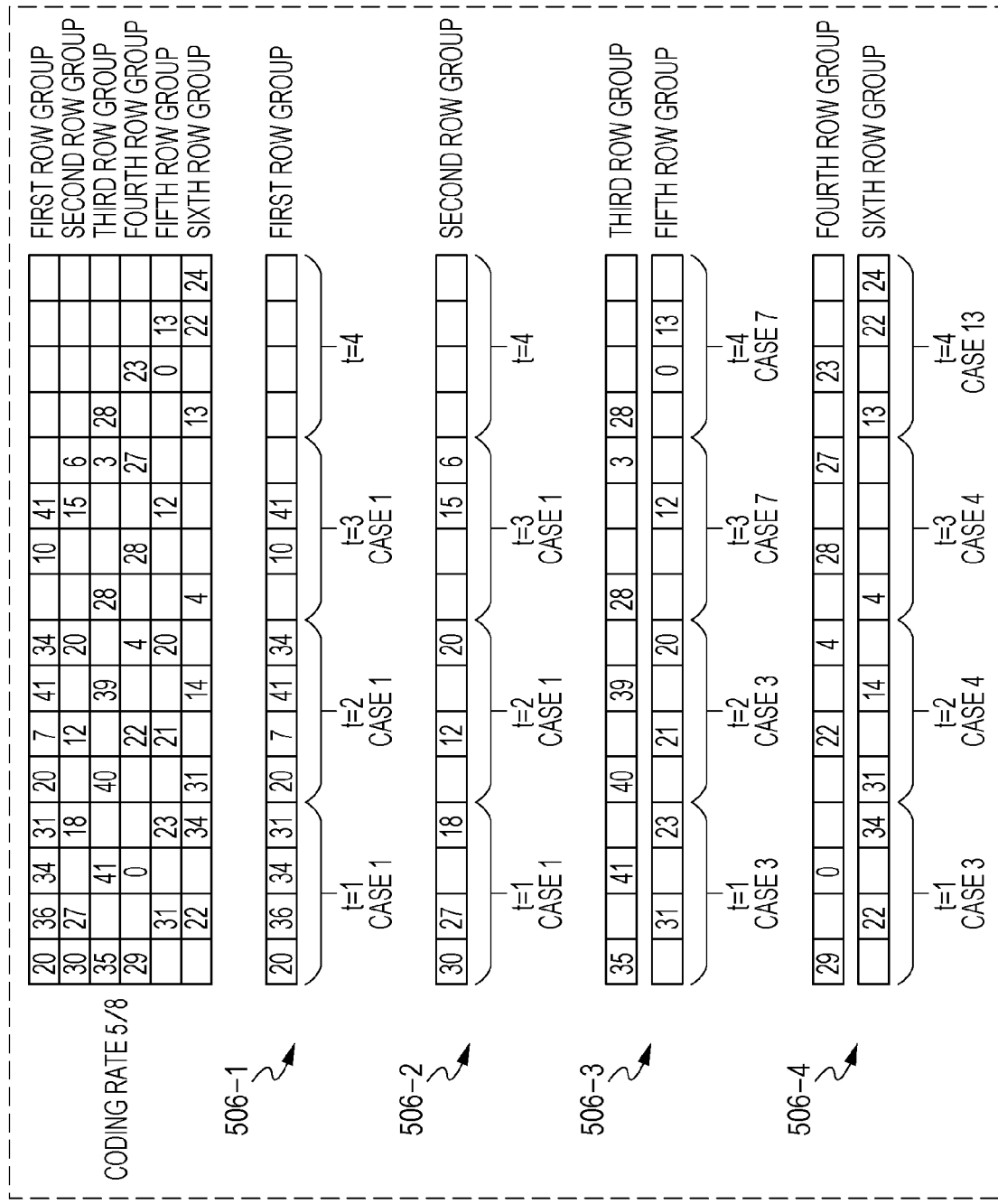
FIG. 34 shows an example of assignment of row groups to the row processing sections according to the fifth embodiment.

As shown in FIG. 34, in the case of a coding rate of ⅝, there are six row groups. One row group is associated with each of the two row processing sections 506-1 and 506-2, and two row groups are associated with each of the two row processing sections 506-3 and 506-4. The two row groups associated with each of the two row processing sections 506-3 and 506-4 are assigned such that the number of nonzero sub-matrices is one in a single column group.

Figure 35:
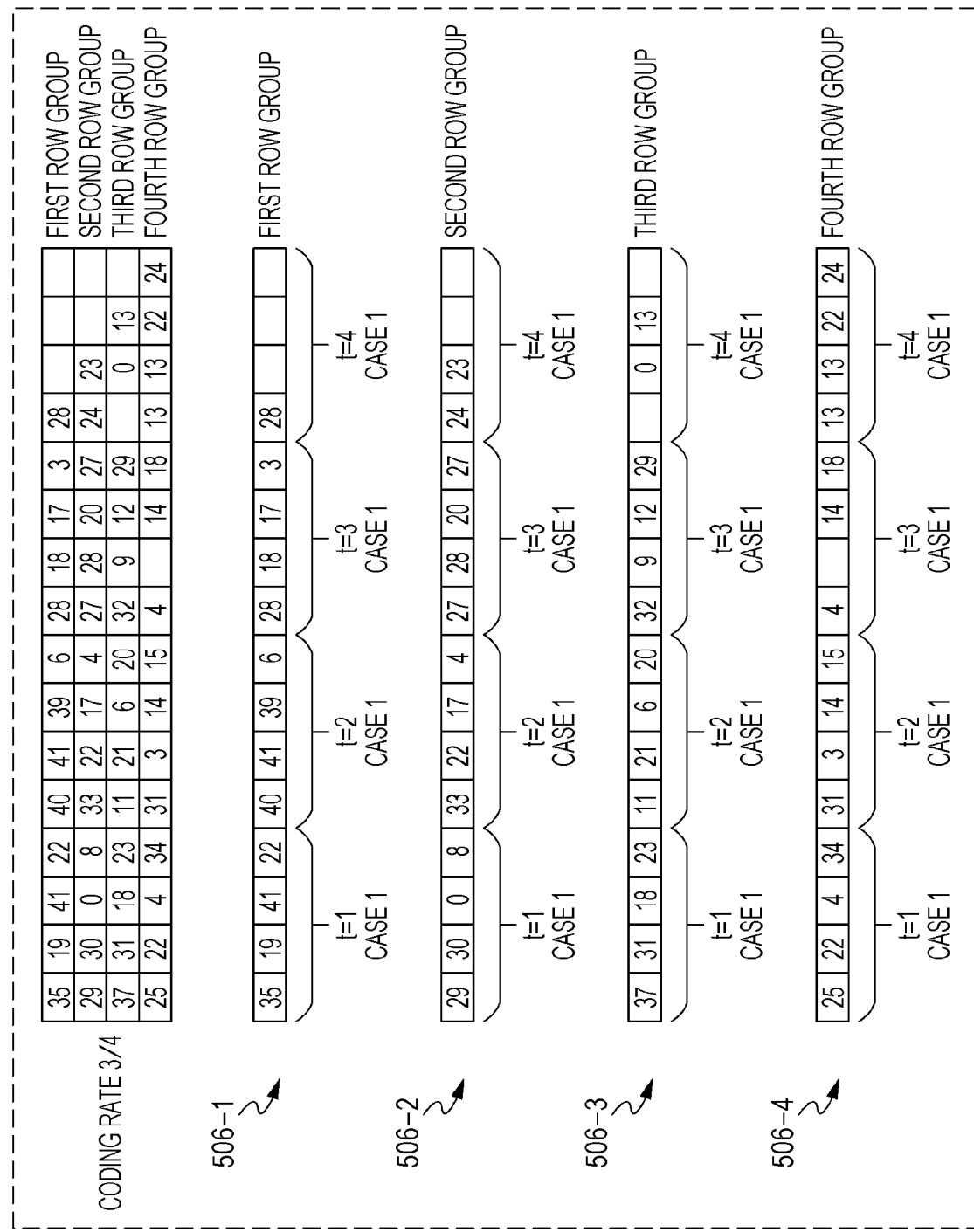
FIG. 35 shows an example of assignment of row groups to the row processing sections according to the fifth embodiment.

Similarly, as shown in FIG. 35, in the case of a coding rate of ¾, there are four row groups. One row group is associated with each of the four row processing sections 506-1 to 506-4.

The operation of the row processing section 506 in the LDPC decoder 500 according to the present embodiment will be described.

Each row processing section 506 processes up to four column groups in one clock cycle. As described above, each row processing section 506 corresponds to up to two row groups. Thus, a minimum value selection circuit (the minimum value selection circuit 200 or 300) included in each row processing section 506 divides pieces of data input in parallel into up to two row groups in accordance with an operational mode shown in FIG. 8 to obtain a first minimum value and a second minimum value of each group.

Figure 36A:
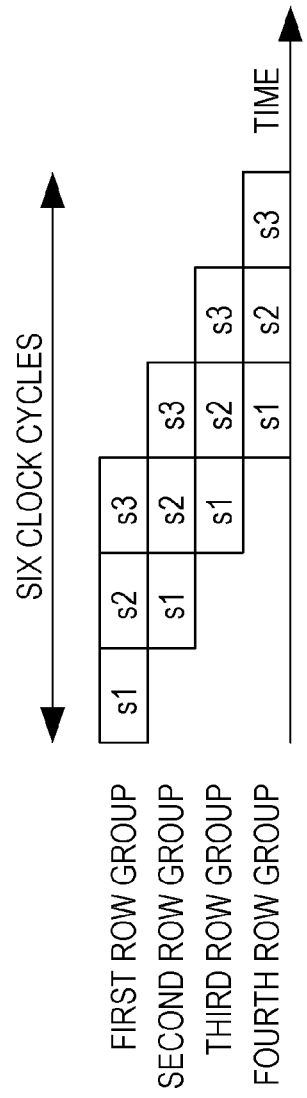
FIG. 36A is a timing diagram showing operation timing for row processing if the conventional art is used.
Figure 36B:
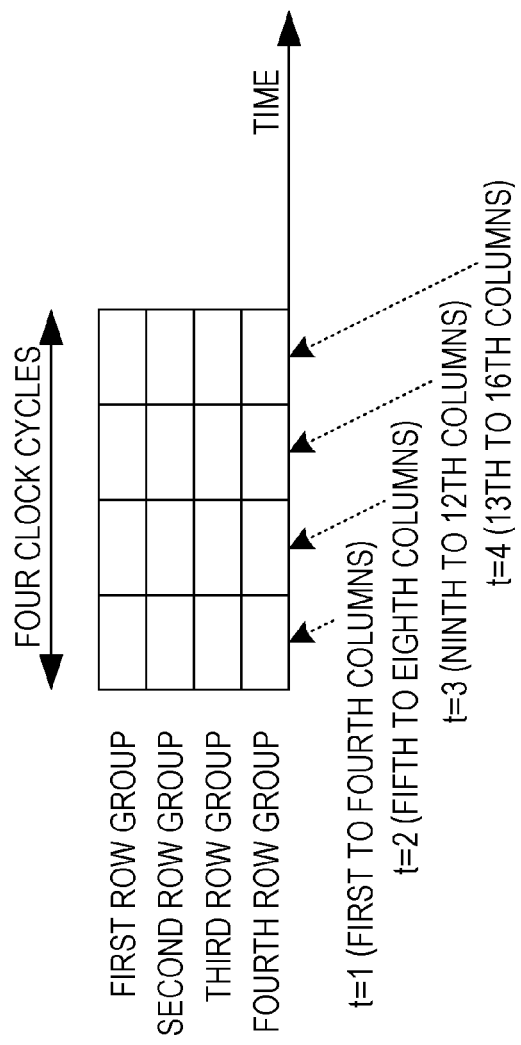
FIG. 36B is a timing diagram showing operation timing for the row processing section according to the present embodiment.

FIG. 36A is a timing diagram showing operation timing for row processing using the conventional art, and FIG. 36B is a timing diagram showing operation timing for the row processing section 506 according to the present embodiment.

Row processing on four row groups will be described.

In the conventional art (see, for example, FIG. 1) shown in FIG. 36A, up to 16 pieces of data included in one row group are input in one clock cycle. Since row processing according to the conventional art involves a pipeline delay of two clock cycles, as described above, processing on one row group needs three clock cycles. Thus, row processing according to the conventional art needs six clock cycles to process up to 64 pieces of data included in four row groups, as shown in FIG. 36A.

In contrast, the plurality of row processing sections 506 of the LDPC decoder 500 according to the present embodiment each perform row processing on up to two row groups, and four row processings are processed in parallel, as shown in FIG. 36B.

One row processing section 506 can input in parallel four pieces of data in one clock cycle. Thus, to process up to 16 pieces of data included in one row group, the row processing section 506 needs four clock cycles.

That is, in the present embodiment, it is possible to perform processing on some of all columns per clock cycle and perform in parallel processing on a plurality of row groups. This allows a reduction in operation clocks (that is, a delay) needed for overall processing.

That is, the present embodiment can reduce a pipeline delay by reducing the number of tiers of cascaded comparators in a minimum value selection circuit included in the row processing section 506 and obviating the need for pipeline registers or reducing pipeline registers, as described in the first to third embodiments. For this reason, it is possible to perform LDPC decoding processing (minimum value selection processing) at higher speed with a shorter delay in the present embodiment than in the conventional art.

Delay shortening can be achieved by using two or more components with the configuration (see FIG. 1) according to the conventional art. For example, a processing delay can be reduced to four clock cycles by using two minimum value selection circuits with the configuration shown in FIG. 1. To improve processing capability in the above-described manner, a configuration according to the conventional art supplies in parallel 32 pieces of data to a row processing section (minimum value selection circuit) per clock cycle.

That is, to obtain processing capability equivalent to the processing capability of the LDPC decoder 500 according to the present embodiment in the conventional art, not the degree of parallelism of row processing sections but the degree of parallelism of circuits, such as column processing sections and shifters, included in an LDPC decoder needs to be doubled. This causes an increase in circuit scale.

As described above, if processing speed and delay constraints in the present embodiment are made identical to those in the conventional art, the present embodiment can have a smaller circuit scale than that of the conventional art. In other words, if circuit scale constraints in the present embodiment are made identical to those in the conventional art, the present embodiment can implement a smaller delay and higher operation than the conventional art.

In the conventional art, 16 pieces of data need to be input to an LDPC decoder (minimum value selection circuit) at a time. In contrast, in the present embodiment, 16 pieces of data can be input to the LDPC decoder 500 (the minimum value selection circuit 200 or 300) as separate sets, each having four pieces of data. For this reason, in the LDPC decoder 500, the configuration of the column processing section 503 can be made simpler and more efficient than the configuration of the conventional art that needs to process 16 pieces of data at a time.

More specifically, column processing is a computation that performs addition and subtraction on a combination of pieces of data in a column of a parity check matrix. In the present embodiment, the LDPC decoder 500 is configured such that the LDPC decoder 500 includes four column processing sections 503 (see FIG. 32A) which each process one column group (that is, four column groups in total) per clock cycle. For this reason, the column processing section 503 does not need a register for temporary storage or the like and can have a simple configuration for addition and subtraction.

An LDPC decoder which performs column processing on one or more columns in one clock cycle as described above may also be referred to as a "column-parallel LDPC decoder" or a "column-based, partially parallel LDPC decoder".

An LDPC decoder according to one aspect of the present disclosure is a circuit suitable for a column-parallel LDPC decoder.

As described above, in the LDPC decoder 500 according to the present embodiment, the four column processing sections 503 perform column processing on four column groups (up to four nonzero sub-matrices per one column group) per clock cycle, and each row processing section 506 can receive four pieces of data per clock cycle. That is, the LDPC decoder 500 can supply pieces of data from the column processing sections 503 to the row processing sections 506 without oversupply or undersupply.

An LDPC decoder to which 16 pieces of data in a row group need to be supplied at a time, like a minimum value selection circuit in a row processing section according to the conventional art, may also be referred to as a "row-parallel LDPC decoder" or a "row-based, partially parallel LDPC decoder".

In a row-parallel LDPC decoder, a twist needs to be added to column processing that is to be performed using units of column groups such that pieces of data are output using units of row groups. To this end, it is known to provide a column processing section with a register, a memory, or an accumulator which temporarily stores pieces of data. In this case, the column processing section is more complicated in configuration and larger in circuit scale than a column processing section in a column-parallel LDPC decoder.

From the foregoing, in the LDPC decoder 500 according to the present embodiment, the number of comparators in the row processing section 506 can be reduced, as in the second or third embodiment. The LDPC decoder 500 supports a plurality of parity check matrices and can cause the row processing section 506 to perform processing at high speed. In the LDPC decoder 500, a column processing section can have a simpler configuration than in the conventional art, which allows prevention of an increase in circuit scale.

The embodiments according to one aspect of the present disclosure have been described above.

Note that although the number of pieces of data input in parallel to a minimum value selection circuit is two (the first embodiment) or four (the second embodiment) in the above-described embodiments, the present disclosure is not limited to these numbers. A number other than two or four may be adopted.

A case where a plurality of pieces of data input to a minimum value selection circuit each belong to either one of two groups has been described as one example in each of the embodiments. The number of groups, to which a plurality of pieces of data belong, however, is not limited to two. The number of groups may be a number other than two.

The embodiments have been illustrated in the context of a case where the present disclosure is implemented by hardware. The present disclosure, however, may also be implemented by software in conjunction with hardware.

Functional blocks used to describe each of the embodiments are typically implemented as an LSI which is an integrated circuit. The functional blocks may be implemented as separate chips or some or all of the functional blocks may be implemented as one chip. Although functional blocks are implemented as an LSI here, the functional blocks may also be referred to as an IC, a system LSI, a super LSI, or an ultra LSI, depending on the integration degree.

A circuit integration method is not limited to use of an LSI, and a dedicated circuit or a general-purpose processor may be adopted for implementation. A field programmable gate array (FPGA) which can be programmed after manufacture of an LSI or a reconfigurable processor which allows connections and settings of circuit cells inside an LSI to be reconfigured after manufacture of the LSI may be employed.

Additionally, if a circuit integration technique to replace an LSI emerges as a result of the progress of the semiconductor technology or by virtue of another derivative technique, functional blocks may, of course, be integrated using the technique. Application of biotechnology or the like is feasible.

SUMMARY OF EMBODIMENTS

A decoder according to a first aspect of the present disclosure is a decoder which decodes a coded data series using a parity check matrix for an LDPC code, the decoder including a column processing circuitry which, in operation, performs column processing on an input data series including a plurality of pieces of data using units of columns among columns of the parity check matrix and a row processing circuitry which in operation, performs row processing on a column message data series obtained by the column processing using units of rows among rows of the parity check matrix, in which the row processing circuitry includes a minimum value selection circuitry which, in operation, selects, using units of rows among the rows, a first minimum value with a smallest absolute value and a second minimum value with a second smallest absolute value from the column message data series obtained by the column processing and outputs the first minimum value and the second minimum value selected to the column processing circuitry, the minimum value selection circuitry includes a storage which, in operation, stores the first selected minimum value and the second selected minimum value each time a first number of pieces of data, the first number being not less than two, among the column message data series are sequentially input, first comparison circuitry which, in operation, makes a magnitude comparison among the first number of pieces of data, second number of second comparison circuitry which, in operation, make a magnitude comparison of the first stored minimum value with each of the first number of pieces of data and make a magnitude comparison of the second stored minimum value with each of the first number of pieces of data, the second number being twice the first number, and judgment circuitry which, in operation, judges a new first minimum value and a new second minimum value to be stored in the storage among the first number of pieces of data and the first minimum value and the second minimum value stored in the storage on a basis of a combination of a comparison result from the first comparison circuitry and comparison results from the second number of second comparison circuitry and outputs a result of the judgment to the storage, and the column processing circuitry performs the column processing again on a row message data series obtained by the row processing on a basis of the parity check matrix and outputs a decoded data series.

In a decoder according to a second aspect of the present disclosure, in the decoder according to the first aspect, each of the first number of pieces of data belongs to any one of a plurality of groups in accordance with the type of the parity check matrix, the storage stores the first minimum value and the second minimum value for each of the plurality of groups, for the first number of pieces of data, and the first minimum value and the second minimum value for the group, to which each of the first number of pieces of data input belongs, are input from the storage to each of the second number of second comparison circuitry.

In a decoder according to a third aspect of the present disclosure, in the decoder according to the second aspect, the type of the parity check matrix is changed according to a coding rate selected from a plurality of coding rates.

A minimum value selection circuit according to a fourth aspect of the present disclosure includes a storage which stores a first minimum value with a smallest absolute value and a second minimum value with a second smallest absolute value each time a first number of pieces of data, the first number being not less than two, are sequentially input, a first comparison circuitry which, in operation, makes a magnitude comparison among the first number of pieces of data, a second number of second comparison circuitry which, in operation, make a magnitude comparison of the stored first minimum value with each of the first number of pieces of data and make a magnitude comparison of the stored second minimum value with each of the first number of pieces of data, the second number being twice the first number, and judgment circuitry which, in operation, judges a new first minimum value and a new second minimum value to be stored in the storage among the first number of pieces of data and the first minimum value and the second minimum value stored in the storage on a basis of a combination of a comparison result from the first comparison circuitry and comparison results from the second number of second comparison circuitry and outputs a result of the judgment to the storage.

In a minimum value selection circuit according to a fifth aspect of the present disclosure, in the minimum value selection circuit according to the third aspect, each of the first number of pieces of data belongs to any one of a plurality of groups, the storage stores the first minimum value and the second minimum value for each of the plurality of groups, for the first number of pieces of data, and the first minimum value and the second minimum value for the group, to which each of the first number of pieces of data input belongs, are input from the storage to each of the second number of second comparison circuitry.

A minimum value selection method according to a sixth aspect of the present disclosure includes storing a first minimum value with a smallest absolute value and a second minimum value with a second smallest absolute value each time a first number of pieces of data, the first number being not less than two, are sequentially input, making a first magnitude comparison among the first number of pieces of data, making a second magnitude comparison of the stored first minimum value with each of the first number of pieces of data, making a third magnitude comparison of the stored second minimum value with each of the first number of pieces of data, judging a first new minimum value to be newly stored and a second new minimum value to be newly stored among the first number of pieces of stored data and the first stored minimum value and the second stored minimum value on a basis of a combination of a result of the first magnitude comparison, results of the second magnitude comparisons, and results of the third magnitude comparisons, and storing a result of the judging.

One aspect of the present disclosure can be applied to a decoder or the like using an LDPC code.

What is claimed is:

1. A decoder which decodes a coded data series using a parity check matrix for a low density parity check (LDPC) code, the decoder comprising:
   column processing circuitry which, in operation, performs column processing on an input data series including a plurality of pieces of data using units of columns among columns of the parity check matrix; and
   row processing circuitry which, in operation, performs row processing on a column message data series obtained by the column processing using units of rows among rows of the parity check matrix, wherein
   the row processing circuitry includes minimum value selection circuitry which, in operation, selects, using units of rows among the rows, a first minimum value with a smallest absolute value and a second minimum value with a second smallest absolute value from the column message data series obtained by the column processing and outputs the first minimum value and the second minimum value selected to the column processing circuitry,
   the minimum value selection circuitry includes
      a storage which, in operation, stores the first selected minimum value and the second selected minimum value each time a first number of pieces of data, the first number being not less than two, among the column message data series are sequentially input,
      first comparison circuitry which, in operation, makes a magnitude comparison among the first number of pieces of data,
      a second number of second comparison circuitry which, in operation, make a magnitude comparison of the first stored minimum value with each of the first number of pieces of data and make a magnitude comparison of the second stored minimum value with each of the first number of pieces of data, the second number being twice the first number, and
      judgment circuitry which, in operation, judges a new first minimum value and a new second minimum value to be stored in the storage among the first number of pieces of data and the first minimum value and the second minimum value stored in the storage on a basis of a combination of a comparison result from the first comparison circuitry and comparison results from the second number of second comparison circuitry and outputs a result of the judgment to the storage, and
   the column processing circuitry performs the column processing again on a row message data series obtained by the row processing on a basis of the parity check matrix and outputs a decoded data series.

2. The decoder according to claim 1, wherein
   each of the first number of pieces of data belongs to any one of a plurality of groups in accordance with a type of the parity check matrix,
   the storage stores the first minimum value and the second minimum value for each of the plurality of groups, for the first number of pieces of data, and
   the first minimum value and the second minimum value for a group, to which each of the first number of pieces of data input belongs, are input from the storage to each of the second number of second comparison circuitry.

3. The decoder according to claim 2, wherein
   the type of the parity check matrix is changed according to a coding rate selected from a plurality of coding rates.

4. A minimum value selection circuit comprising:
   a storage which stores a first minimum value with a smallest absolute value and a second minimum value with a second smallest absolute value each time a first number of pieces of data, the first number being not less than two, are sequentially input;
   first comparison circuitry which, in operation, makes a magnitude comparison among the first number of pieces of data;
   a second number of second comparison circuitry which, in operation, make a magnitude comparison of the stored first minimum value with each of the first number of pieces of data and make a magnitude comparison of the stored second minimum value with each of the first number of pieces of data, the second number being twice the first number; and
   judgment circuitry which, in operation, judges a new first minimum value and a new second minimum value to be stored in the storage among the first number of pieces of data and the first minimum value and the second minimum value stored in the storage on a basis of a combination of a comparison result from the first comparison circuitry and comparison results from the second number of second comparison circuitry and outputs a result of the judgment to the storage.

5. The minimum value selection circuit according to claim 4, wherein
   each of the first number of pieces of data belongs to any one of a plurality of groups,
   the storage stores the first minimum value and the second minimum value for each of the plurality of groups, for the first number of pieces of data, and
   the first minimum value and the second minimum value for a group, to which each of the first number of pieces of data input belongs, are input from the storage to each of the second number of second comparison circuitry.

6. A minimum value selection method for a minimum value selection circuit, the method comprising:
   storing, by a storage, a first minimum value with a smallest absolute value and a second minimum value with a second smallest absolute value each time a first number of pieces of data, the first number being not less than two, are sequentially input;

making, by first comparison circuitry, a first magnitude comparison among the first number of pieces of data;

making, by a second number of second comparison circuitry, a second magnitude comparison of the stored first minimum value with each of the first number of pieces of data;

making, by the second number of second comparison circuitry, a third magnitude comparison of the stored second minimum value with each of the first number of pieces of data;

judging, by judgment circuitry, a first new minimum value to be newly stored and a second new minimum value to be newly stored among the first number of pieces of stored data and the first stored minimum value and the second stored minimum value on a basis of a combination of a result of the first magnitude comparison, results of the second magnitude comparisons, and results of the third magnitude comparisons; and storing, by the storage, a result of the judging.

* * * * *